United States Patent [19]
Aoai et al.

[11] Patent Number: 6,042,991
[45] Date of Patent: Mar. 28, 2000

[54] POSITIVE WORKING PHOTOSENSITIVE COMPOSITION

[75] Inventors: Toshiaki Aoai; Shiro Tan; Kenichiro Sato, all of Shizuoka, Japan

[73] Assignee: Fuji Photo Film Co., Ltd., Kanagawa, Japan

[21] Appl. No.: 09/025,451

[22] Filed: Feb. 18, 1998

[30] Foreign Application Priority Data

Feb. 18, 1997 [JP] Japan ..................................... 9-033958
Feb. 28, 1997 [JP] Japan ..................................... 9-046000

[51] Int. Cl.[7] ................................. G03C 1/72; G03C 1/73
[52] U.S. Cl. ..................................... 430/285.1; 430/270.1; 430/283.1; 430/284.1; 430/287.1
[58] Field of Search ............................. 430/285.1, 270.1, 430/284.1, 283.1, 287.1

[56] References Cited

U.S. PATENT DOCUMENTS 5,738,975   4/1998   Nakano et al. ...................... 430/270.1
5,879,857   3/1999   Chandross et al. .................. 430/270.1

*Primary Examiner*—Hoa Van Le
*Assistant Examiner*—Sin J. Lee
*Attorney, Agent, or Firm*—Sughrue, Mion, Zinn, Macpeak & Seas, PLLC

[57] ABSTRACT

A positive working photosensitive composition suitable for exposure using a light source of wavelengths of 250 nm or shorter, particularly 220 nm or shorter; comprising (A) a compound capable of generating an acid upon irradiation with actinic rays or radiation and (B) a resin which comprises constitutional repeating units having alicyclic groups of particular structures, including adamantyl groups, and has groups capable of decomposing due to the action of acids to increase the solubility in an alkali developer.

8 Claims, No Drawings ively used positive working photoresist composition comprises an alkali-soluble resin and a naphthoquinonediazide compound as a photosensitive substance. As examples of such a composition, the combinations of novolak-type phenol resins with naphthoquinonediazido-substituted compounds are described in U.S. Pat. Nos. 3,666,473, 4,115,128 and 4,173,470. Further, as the most typical compositions, the combinations of novolak resins prepared from cresols and formaldehyde with trihydroxybenzophenone-1,2-naphthoquinonediazide sulfonic acid esters are described in L. F. Thompson, *Introduction to Microlithography*, No. 2, 19, pages 112–121, ACS publisher.

POSITIVE WORKING PHOTOSENSITIVE COMPOSITION

FIELD OF THE INVENTION

The present invention relates to a positive working photosensitive composition which is used in the manufacturing process of a semiconductor device such as IC, in the production of a circuit substrate for liquid crystal, a thermal head or the like, and in other photofabrication processes. More particularly, the invention concerns a positive working photosensitive composition suitable for photofabrication processes using far ultraviolet rays of 250 nm or shorter as a light source for exposure.

BACKGROUND OF THE INVENTION

A generally used positive working photoresist composition comprises an alkali-soluble resin and a naphthoquinonediazide compound as a photosensitive substance. As examples of such a composition, the combinations of novolak-type phenol resins with naphthoquinonediazido-substituted compounds are described in U.S. Pat. Nos. 3,666,473, 4,115,128 and 4,173,470. Further, as the most typical compositions, the combinations of novolak resins prepared from cresols and formaldehyde with trihydroxybenzophenone-1,2-naphthoquinonediazide sulfonic acid esters are described in L. F. Thompson, *Introduction to Microlithography*, No. 2, 19, pages 112–121, ACS publisher.

In such a positive photoresist, which is basically constituted of a novolak resin and a quinonediazide compound, the novolak resin acts so as to provide high resistance to plasma etching and the naphthoquinonediazide compound functions as a dissolution inhibitor. Further, the naphthoquinonediazide has a characteristic of generating a carboxylic acid upon irradiation with light to lose the ability to inhibit dissolution, thereby heightening the solubility of the novolak resin in alkali.

From the aforementioned points of view, a large number of positive photoresist compositions comprising novolak resins and photosensitive compounds of naphthoquinonediazide type have hitherto been developed and put to practical use. In the working for reproducing lines having a width of the order of 0.8–2 $\mu$m, those compositions have accomplished satisfactory results.

On the other hand, the integration degree of an integrated circuit has become higher and higher in recent years, so that the working for super fine patterns having a line width of half micron or below has come to be required in the production of semiconductor substrates for VLSI and the like.

As a means for elevating the fineness of patterns, it is known to shorten the wavelengths of an exposure light source used for the formation of resist patterns. Such a means can be explained by the Rayleigh equation relating to the resolution (line width) R of an optical system:

$$R = k \cdot \lambda / NA$$

wherein $\lambda$ is the wavelength of an exposure light source, NA is the aperture number of a lens and k is a process constant. From this equation, it can be understand that the attainment of high resolution, namely the diminution in the value of R, becomes possible by shortening the wavelength ($\lambda$) of an exposure light source.

For instance, up to now i-line (365 nm) of a high-pressure mercury lamp has been used as a light source in the production of DRAM having an integration degree of 64 Mbit or below. In the mass production process of 256 Mbit DRAM, the use of KrF excimer laser (248 nm) instead of i-line as an exposure light source has been studied.

Further, light sources emitting light of shorter [wa]velengths are under examination with the intention of producing DRAM with an integration degree of 1 Gbit or above, and the utilization of ArF excimer laser (193 nm), $F_2$ excimer laser (157 nm), X-ray, electron beams or the like is considered effective (a book written by Koh Ueno et al., entitled "Photoresist Materials Responsive to Radiations of Short Wavelengths—Microlithography for Production of VLSI", published by Bunshin Shuppan, in 1988).

In a case where a conventional resist comprising a novolak resin and a naphthoquinonediazide compound is used for forming patterns by the lithography using far ultraviolet light or an excimer laser beam, it is difficult for the light to reach the lower part of the resist because a novolak resin and naphthoquinonediazide have strong absorption in the far ultraviolet region, so that such a resist has low sensitivity and can merely provide a pattern profile having a tapered shape.

As one means for solving the aforementioned problems, the chemical amplification type resist compositions disclosed, e.g., in U.S. Pat. No. 4,491,628 and European Patent 0,249,139 can be employed. The positive resist compositions of chemical amplification type are pattern forming materials of the type which generate acids in the exposed area by irradiation with an actinic radiation, such as far ultraviolet light, to cause the reaction utilizing these acids as catalyst, thereby making a difference of solubility in a developer between the areas -irradiated and unirradiated with the actinic radiation. By virtue of this solubility difference, a pattern can be formed on a substrate coated with a material of the foregoing type.

As examples of such a chemical amplification type resist composition, mention may be made of the combination of a compound capable of generating an acid by photolysis (hereinafter referred to as a photo-acid generator) with acetal or an O, N-acetal compound (JP-A-48-89003, wherein the term "JP-A" means an unexamined published Japanese patent application"), the combination of a photo-acid generator with an orthoester or amidoacetal compound (JP-A-51-120714), the combination of a photo-acid generator with a polymer having acetal or ketal groups in its main chain (JP-A-53-133429), the combination of a photo-acid generator with an enol ether compound (JP-A-55-12995), the combination of a photo-acid generator with an N-acyliminocarbonic acid compound (JP-A-55-126236), the combination of a photo-acid generator with a polymer having orthoester groups in its main chain (JP-A-56-17345), the combination of a photo-acid generator with a tertiary alkyl ester compound (JP-A-60-3625), the combination of a photo-acid generator with a silyl ester compound (JP-A-60-10247) and the combinations with a photo-acid generator with silyl ether compounds (JP-A-60-37549 and JP-A-60-121446). Those combinations have a quantum yield greater than 1 in principle, so that they exhibit high sensitivity.

As examples of a similar system to the above, which decomposes upon heating in the presence of an acid to acquire solubility in an alkali, mention may be made of the systems wherein tertiary or secondary carbon-containing (e.g., t-butyl, 2-cyclohexenyl) esters or carbonate compounds are combined with compounds capable of generating acids upon exposure to light, as described, e.g., in JP-A-59-45439, JP-A-60-3625, JP-A-62-229242, JP-A-63-27829, JP-A-63-36240, JP-A-63-250642, JP-A-5-181279, *Polym.*

Eng. Sce., vol. 23, p. 1012 (1983); ACS. Sym., vol. 242, p. 11 (1984); Semiconductor World, the November number, p. 91 (1987); Macromolecules, vol. 21, p. 1475 (1988); and SPIE, vol. 920, p. 42 (1988); the systems wherein the acetal compounds described, e.g., in JP-A-4-219757, JP-A-5-249682 and JP-A-6-65332 are combined with the photo-acid generators as recited above, and the systems wherein the t-butyl ether compounds described, e.g., in JP-A-4-211258 and JP-A-6-65333 are combined with the photo-acid generators as recited above.

Those systems each use as a main component a resin whose basic skeleton is a poly(hydroxystyrene) having a small absorption in the wave length region around 248 nm. When KrF excimer laser is employed as an exposure light source, therefore, they can have high sensitivity and high resolution and form good patterns, namely they can be good systems, compared with a conventional naphthoquinonediazide/novolak resin system.

In cases where light sources emitting light of further short wavelengths, such as ArF excimer laser (193 nm) are used for exposure, even the chemical amplification systems recited above are unsuitable because the compounds having aromatic groups show essentially great absorption in the wave length region around 193 nm. Also, the utilization of poly(meth)acrylate, which shows small absorption in the wave length region around 193 nm, is described in J. Vac. Sci. Technol., B9, 3357 (1991). However, this polymer has a problem of having low resistance to dry etching which is generally carried out in a process of producing semiconductors, compared with conventional phenol resins having aromatic groups.

On the other hand, the fact that alicyclic group-containing polymers have dry etching resistance comparable to those of polymers having an aromatic group and show small absorption in the wave length region around 193 nm was reported in Proc. of SPIE, 1672, 66 (1992), and since then the utilization of those polymers has been examined extensively. Examples of such an alicyclic group-containing polymer include the polymers described in JP-A-4-39665, JP-A-5-80515, JP-A-5-265212, JP-A-5-297591, JP-A-5-346668, JP-A-6-289615, JP-A-6-324494, JP-A-7-49568, JP-A-7-185046, JP-A-7-191463, JP-A-7-199467, JP-A-7-234511, JP-A-7-252324 and JP-A-8-259626.

Further, it is shown in Proc. of SPIE, 1672, 66 (1992) that adamantyl groups have the best dry etching resistance of the alicyclic groups recited in those references, and the polymers having adamantyl groups are described in JP-A-4-39665, JP-A-7-199467, JP-A-7-234511, and JP-A-8-259626.

However, since these polymers are (meth)acrylate polymers, they do not have highly satisfactory dry etching resistance necessarily. Further, in copolymerizing a hydrophobic monomer having an adamantyl group with an acid-decomposable monomer required for image formation and a hydrophilic (polar) monomer required for adhesion to a substrate, those monomers were hard to introduce uniformly into the polymer chain. Accordingly, it occurred sometimes that the ununiform copolymerization resulted in a lowering of the solubility of the copolymer in a solvent or the reproducibility of the synthesis was poor.

SUMMARY OF THE INVENTION

An object of the present invention is to provide a positive working photosensitive composition suitable for exposure using a light source of a wavelength of 250 nm or shorter, particularly 220 nm or shorter. More specifically, the present invention aims at providing a positive working photosensitive composition which can afford satisfactory sensitivity and high resolution when a light source of a wavelength of 250 rim or shorter, particularly 220 nm or shorter, is used for exposure, and further exhibits sufficient dry etching resistance and satisfactory solubility in a solvent.

As a result of our intensive studies which have been made taking the aforementioned properties into consideration, it has been found that the above-described object of the present invention can be attained by using a resin which comprises constitutional repeating units having particular alicyclic groups and has acid-decomposable groups, thereby achieving the present invention.

More specifically, the present invention has any of the following constitutions (1) to (15).

The constitution (1) is a positive working photosensitive composition comprising:

(A) a compound which can generate an acid upon irradiation with actinic rays or radiation, and (B) a resin which comprises as constitutional repeating units at least one adamantyl group-containing unit selected from the units represented by the following formula (Ia), (IIa) or (IIIa), and further has at least groups capable of decomposing due to the action of an acid to increase the solubility of the resin in an alkali developer:

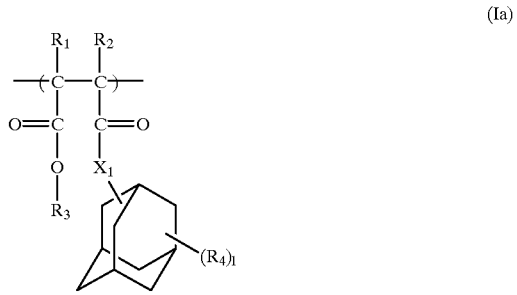

(Ia)

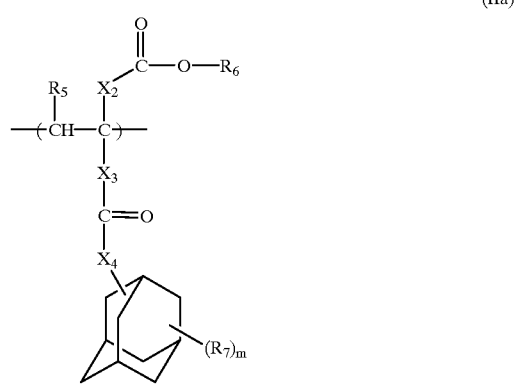

(IIa)

-continued (IIIa)

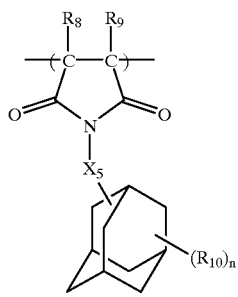

wherein $R_1$, $R_2$, $R_5$, $R_8$ and $R_9$, which may be the same or different, each represents a hydrogen atom, a halogen atom, a cyano group, an alkyl group or a haloalkyl group; $R_4$, $R_7$ and $R_{10}$, which may be the same or different, each represents a halogen atom, a cyano group, an alkyl group which may have substituent(s), an alkenyl group which may have substituent(s), an alkinyl group which may have substituent(s), or —CO—O—$R_{11}$; $R_3$, $R_6$ and $R_{11}$, which may be the same or different, each represents a hydrogen atom, an alkyl group which may have substituent(s), a monocyclic or polycyclic cycloalkyl group which may have substituent(s), an alkenyl group which may have substituent(s), or a group which can decompose due to the action of an acid to increase the solubility of the resin in an alkali developer; $X_1$, $X_2$, $X_3$, $X_4$ and $X_5$, which may be the same or different, each represents a single bond, a divalent alkylene group, a cycloalkylene group, —O—, —S—, or —N($R_{12}$)—$R_{13}$—; $R_{12}$ represents a hydrogen atom, an alkyl group, a monocyclic or polycyclic cycloalkyl group, or an alkenyl group; $R_{13}$ represents a single bond, or a divalent alkylene, cycloalkylene or alkenylene group which may have an ether group, an ester group, an amido group, an urethane group or an ureido group; l, m and n, which may be the same or different, each represents 0 or an integer from 1 to 3; and when l is 2 or 3, the $R_4$ groups may be the same or different, when m is 2 or 3, the $R_7$ groups may be the same or different, and when n is 2 or 3, the $R_{10}$ groups may be the same or different.

The constitution (2) is a positive working photosensitive composition according to the constitution (1), wherein the resin as Component (B) further comprises at least one unit selected from constitutional repeating units represented by the following formula (IVa), (Va) or (VIa):

(IVa)

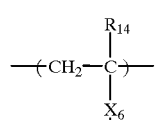

(Va)

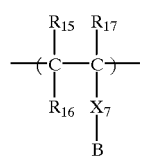

-continued (VIa)

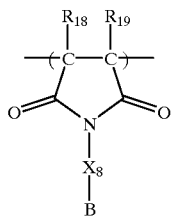

wherein $R_{14}$, $R_{15}$, $R_{17}$, $R_{18}$ and $R_{19}$, which may be the same or different, each represents a hydrogen atom, a halogen atom, a cyano group, an alkyl group or a haloalkyl group; $R_{16}$ represents a cyano group, —CO—O$R_{20}$ or —CO—N($R_{21}$)($R_{22}$); $X_6$, $X_7$ and $X_8$, which may be the same or different, each represents a single bond, —O—, —SO$_2$—, —O—CO—$R_{23}$—, —CO—O—$R_{24}$—, —CO—N($R_{25}$)—$R_{26}$—, a divalent alkylene which may have substituent(s), a divalent alkenylene which may have substituent(s), or a divalent cycloalkylene group which may have substituent(s); $R_{20}$ represents a hydrogen atom, or an alkyl, cycloalkyl or alkenyl group which may have substituent(s), or a group which can decompose due to the action of an acid to increase the solubility of the resin in an alkali developer; $R_{21}$, $R_{22}$ and $R_{25}$, which may be the same or different, each represents a hydrogen atom, an alkyl group which may have substituent(s), a cycloalkyl group which may have substituent(s), or an alkenyl group which may have substituent(s), or $R_{21}$ and $R_{22}$ may combine with each other to form a ring; $R_{23}$, $R_{24}$ and $R_{26}$, which may be the same or different, each represents a single bond, or a divalent alkylene, alkenylene or cycloalkylene group which may contain an ether group, an ester group, an amido group, an urethane group or an ureido group; and B represents a group which can decompose due to the action of an acid to increase the solubility of the resin in an alkali developer.

The constitution (3) is a positive working photosensitive composition according to the constitution (1) or (2), wherein the resin as Component (B) further has carboxyl groups.

The constitution (4) is a positive working photosensitive composition according to the constitution (3), wherein the resin as Component (B) contains at least one constitutional repeating unit selected from carboxyl group-containing units of the following formula (VII), (VIII) or (IX):

(VII)

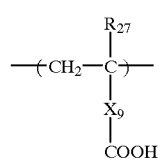

(VIII)

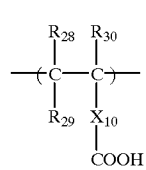

-continued

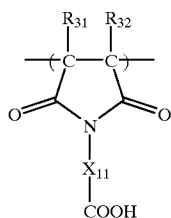

(IX)

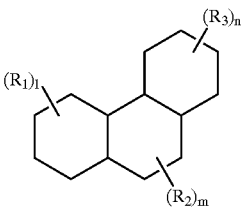

(Ib)

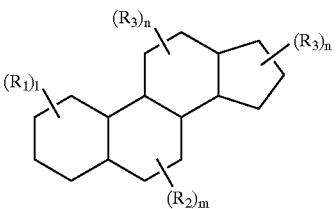

(IIb)

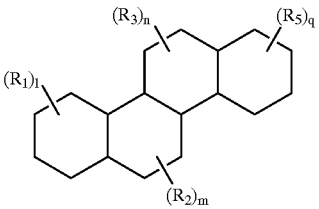

(IIIb)

wherein $R_{27}$, $R_{28}$, $R_{30}$, $R_{31}$ and $R_{32}$, which may be the same or different, each represents a hydrogen atom, a halogen atom, a cyano group, an alkyl group or a haloalkyl group; $R_{29}$ represents a cyano group, —CO—$OR_{33}$ or —CO—N($R_{34}$)($R_{35}$); $X_9$, $X_{10}$ and $X_{11}$, which may be the same or different, each represents a single bond, —O—, —$SO_2$—, —O—CO—$R_{36}$—, —CO—O—$R_{37}$—, —CO—N($R_{38}$)—$R_{39}$—, or a divalent alkylene which may have substituent(s), a divalent alkenylene which may have substituent(s), or a divalent cycloalkylene group which may have substituent(s); $R_{33}$ represents a hydrogen atom, an alkyl group which may have substituent(s), a cycloalkyl which may have substituent(s), or an alkenyl group which may have substituent(s); $R_{34}$, $R_{35}$ and $R_{38}$, which may be the same or different, each represents a hydrogen atom, or an alkyl group which may have substituent(s), a cycloalkyl group which may have substituent(s), or an alkenyl group which may have substituent(s), or $R_{34}$ and $R_{35}$ may combine with each other to form a ring; $R_{36}$, $R_{37}$ and $R_{39}$, which may be the same or different, each represents a single bond, or a divalent alkylene, alkenylene or cycloalkylene group, which may contain an ether group, an ester group, an amido group, an urethane group or an ureido group.

The constitution (5) is a positive working photosensitive composition according to the constitutions (1) to (4), further comprising a low molecular acid-decomposable dissolution inhibiting compound which has a molecular weight of not higher than 3,000, contains a group capable of decomposing due to the action of acids and increases the solubility in an alkali developer when an acid acts thereon.

The constitution (6) is a positive working photosensitive composition of any of the above constitutions (1) to (5), wherein the actinic rays or radiation is far ultraviolet light of wavelengths of 250 nm or shorter.

The constitution (7) is a positive working photosensitive composition according to the constitution (6), wherein the far ultraviolet light has wavelengths of 220 nm or shorter.

The constitution (8) is a positive working photosensitive composition comprising:

(A) a compound capable of generating an acid upon irradiation with an actinic ray or radiation, and (B) a resin which has at least one of monovalent polycyclic alicyclic groups represented by the following formula (Ib), (IIb) or (IIIb), and has a group capable of decomposing due to the action of acid to increase the solubility of the resin in an alkali developer:

wherein $R_1$ to $R_5$, which may be the same or different, each represents an alkyl, cycloalkyl, alkenyl or alkynyl group which may have substituent(s), a halogen atom, a cyano group, a group of formula —$R_6$—O—$R_7$, a group of formula —$R_8$—CO—O—$R_9$, a group of formula —$R_{10}$—CO—$NR_{11}R_{12}$, or a group of formula —$R_{13}$—O—CO—$R_{14}$; $R_7$ and $R_9$, which may be the same or different, each represents a hydrogen atom, an alkyl group which may have substituent(s), a cycloalkyl group which may have substituent(s), an alkenyl group which may have substituent(s), or a group which can decompose due to the action of an acid to increase the solubility of the resin in an alkali developer; $R_{11}$, $R_{12}$ and $R_{14}$, which may be the same or different, each represents a hydrogen atom, an alkyl group which may have substituent(s), a cycloalkyl group which may have substituent(s), an alkenyl group which may have substituent(s), or $R_{11}$ and $R_{12}$ may combine with each other to from a ring; $R_6$, $R_8$, $R_{10}$ and $R_{13}$, which may be the same or different, each represents a single bond, or an alkylene, alkenylene or cycloalkylene group which may have substituent(s); l, m, n, p and q, which may be the same or different, each represents 0 or an integer of 1 to 5; wherein when l, m, n, p or q is 2 or more, the plural groups represented by each of $R_1$, $R_2$, $R_3$, $R_4$ and $R_5$ may be the same or different, and the combination of two of the groups may represent a carbonyl (=O) or thiocarbonyl (=S) group on one carbon atom, or may complete a double bond between adjacent carbon atoms or a ring; and wherein the bonding hand may be situated at any site of each polycyclic hydrocarbon structure.

The constitution (9) is a positive working photosensitive composition according to the constitution (8), wherein the resin as Component (B) contains at least one of constitutional repeating units represented by the following formula (IVb), (Vb) or (VIb), and has groups capable of decomposing due to the action of an acid to increase the solubility of the resin in an alkali developer:

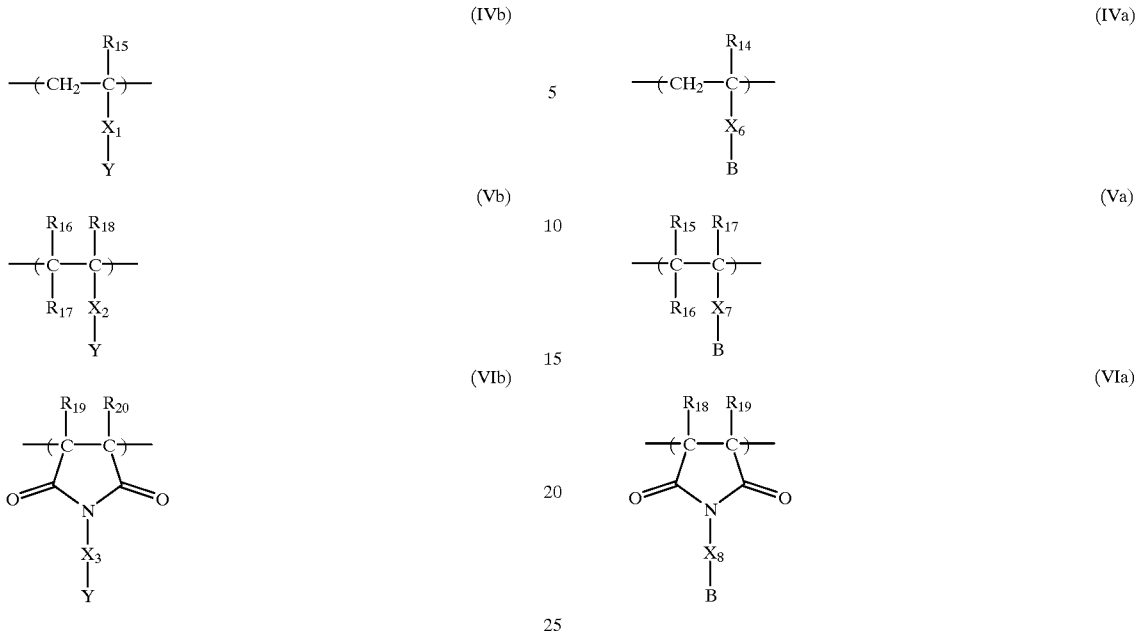

wherein $R_{15}$, $R_{16}$, $R_{18}$, $R_{19}$ and $R_{20}$, which may be the same or different, each represents a hydrogen atom, a halogen atom, a cyano group, an alkyl group or a haloalkyl group; $R_{17}$ represents a cyano group, —CO—$OR_{27}$ or —CO—N($R_{29}$)($R_{29}$); $X_1$, $X_2$ and $X_3$, which may be the same or different, each represents a single bond, a divalent alkylene which may have substituent(s), a divalent alkenylene group which may have substituent(s), a divalent cycloalkylene group which may have substituent(s), —O—, —$SO_2$—, —O—CO—$R_{30}$—, —CO—O—$R_{31}$—, or —CO—N($R_{32}$)—$R_{33}$—; $R_{27}$ represents a hydrogen atom, an alkyl group which may have substituent(s), a cycloalkyl which may have substituent(s), an alkenyl group which may have substituent(s), or a group which can decompose due to the action of an acid to increase the solubility of the resin in an alkali developer; $R_{28}$, $R_{29}$ and $R_{32}$, which may be the same or different, each represents a hydrogen atom, or an alkyl group which may have substituent(s), a cycloalkyl group which may have substituent(s) or an alkenyl group which may have substituent(s), or $R_{28}$ and $R_{29}$ may combine with each other to form a ring; $R_{30}$, $R_{31}$ and $R_{33}$, which may be the same or different, each represents a single bond, or a divalent, alkylene, alkenylene or cycloalkylene group which may form a divalent group in combination with an ether group, an ester group, an amido group, an urethane group or an ureido group; and Y represents a polycyclic aliphatic group represented by formula (Ib), (IIb) or (IIIb).

The constitution (10) is a positive working photosensitive composition according to the constitution (8) or (9), wherein the resin as Component (B) is a resin comprising at least one of constitutional repeating units of formulae (IVb), (Vb) or (VIb) and at least one of constitutional repeating units represented by the following formula (IVa), (Va) or (VIa), and being capable of decomposing due to the action of an acid to increase the solubility in an alkali developer:

wherein $R_{14}$, $R_{15}$, $R_{17}$, $R_{18}$ and $R_{19}$, which may be the same or different, each represents a hydrogen atom, a halogen atom, a cyano group, an alkyl group or a haloalkyl group; $R_{16}$ represents a cyano group, —CO—$OR_{20}$ or —CO—N($R_{21}$)($R_{22}$); $X_6$, $X_7$ and $X_8$, which may be the same or different, each represents a single bond, —O—, —$SO_2$—, —O—CO—$R_{23}$—, —CO—O—$R_{24}$—, —CO—N($R_{25}$)—$R_{26}$—, or a divalent alkylene group which may have substituent(s), a divalent alkenylene group which may have substituent(s), or a divalent cycloalkylene group which may have substituent(s); $R_{20}$ represents a hydrogen atom, or an alkyl, cycloalkyl or alkenyl group which may have substituent(s), or a group which can decompose due to the action of an acid to increase the solubility of the resin in an alkali developer; $R_{21}$, $R_{22}$ and $R_{25}$, which may be the same or different, each represents a hydrogen atom, or an alkyl group which may have substituent(s), a cycloalkyl group which may have substituent(s) or an alkenyl group which may have substituent(s), or $R_{21}$ and $R_{22}$ may combine with each other to form a ring; $R_{23}$, $R_{24}$ and $R_{26}$, which may be the same or different, each represents a single bond, or a divalent alkylene, alkenylene or cycloalkylene group which may contain an ether group, an ester group, an amido group, an urethane group or an ureido group; and B represents a group which can decompose due to the action of an acid to increase the solubility of the resin in an alkali developer.

The constitution (11) is a positive working photosensitive composition according to any of the constitutions (8) to (10), wherein the resin as Component (B) further has carboxyl groups.

The constitution (12) is a positive working photosensitive composition according to the constitution (11), wherein the resin as Component (B) having the carboxyl groups comprises at least one of the constitutional repeating units selected from carboxyl group-containing units of the following formula (VII), (VIII) or (IX):

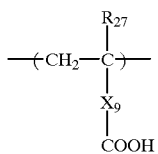

(VII)

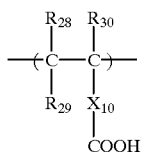

(VIII)

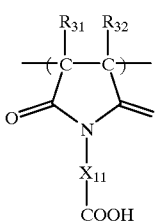

(IX)

wherein $R_{27}$, $R_{28}$, $R_{30}$, $R_{31}$ and $R_{32}$, which may be the same or different, each represents a hydrogen atom, a halogen atom, a cyano group, an alkyl group or a haloalkyl group; $R_{29}$ represents a cyano group, —CO—OR$_{33}$ or —CO—N(R$_{34}$)(R$_{35}$); $X_9$, $X_{10}$ and $X_{11}$, which may be the same or different, each represents a single bond, —O—, —SO$_2$—, —O—CO—R$_{36}$—, —CO—O—R$_{37}$—, —CO—N(R$_{38}$)—R$_{39}$—, or a divalent alkylene group which may have substituent(s), a divalent alkenylene group which may have substituent(s), or a divalent cycloalkylene group which may have substituent(s); $R_{33}$ represents a hydrogen atom, or an alkyl group which may have substituent(s), a cycloalkyl group which may have substituent(s) or an alkenyl group which may have substituent(s); $R_{34}$, $R_{35}$ and $R_{38}$, which may be the same or different, each represents a hydrogen atom, or an alkyl group which may have substituent(s), a cycloalkyl group which may have substituent(s) or an alkenyl group which may have substituent(s), or $R_{34}$ and $R_{35}$ may combine with each other to form a ring; $R_{36}$, $R_{37}$ and $R_{39}$, which may be the same or different, each represents a single bond, or a divalent alkylene, alkenylene or cycloalkylene group which may contain an ether group, an ester group, an amido group, an urethane group or an ureido group.

The constitution (13) is a positive working photosensitive composition of any of the constitutions (8) to (12), further comprising a low molecular acid-decomposable dissolution inhibiting compound which has a molecular weight of not higher than 3,000, contains a group capable of decomposing due to the action of acids and increases the solubility in an alkali developer when an acid acts thereon.

The constitution (14) is a positive working photosensitive composition of constitutions (8) to (13), wherein the actinic rays or radiation is far ultraviolet light of wavelengths of 250 nm or shorter.

The constitution (15) is a positive working photosensitive composition according to the constitution (14), wherein the far ultraviolet light has wavelengths of 220 nm or shorter.

DETAILED DESCRIPTION OF THE INVENTION

The compounds used in the present invention are illustrated below in detail.

In the first place, the resins usable as Component (B) in the present composition are described below.

[1] Constitutional repeating units of formula (Ia), (IIa) or (IIIa)

Examples of an alkyl group for $R_1$, $R_2$, $R_5$, $R_8$ or $R_9$ in the foregoing formulae include an $C_{1-4}$ alkyl group which may have substituent(s), such as methyl, ethyl, propyl, n-butyl and sec-butyl. Examples of the haloalkyl group include a $C_{1-4}$ alkyl group substituted by a fluorine atom, a chlorine atom or a bromine atom, such as fluoromethyl, chloromethyl, bromomethyl, fluoroethyl, chloroethyl and bromoethyl.

Examples of the alkyl group for $R_4$, $R_7$ or $R_{10}$ include an $C_{1-8}$ alkyl group which may have substituent(s), such as methyl, ethyl, propyl, n-butyl, sec-butyl, hexyl, 2-ethylhexyl and octyl. Examples of an alkenyl group include a $C_{2-6}$ alkenyl group which may have substituent(s), such as vinyl, propenyl, allyl, butenyl, pentenyl, hexenyl and cyclohexenyl. Examples of an alkynyl group include a $C_{2-4}$ alkynyl group, such as acetyl and propargyl.

Examples of an alkyl group and an alkenyl group for $R_3$, $R_6$, $R_{11}$ and $R_{12}$ each include the same groups as recited above with respect to $R_4$, $R_7$ and $R_{10}$ each. Examples of the monocyclic or polycyclic cycloalkyl group include a $C_{3-8}$ monocyclic group which may have substituent(s), such as cyclopropyl, cyclopentyl and cyclohexyl, and a polycyclic group which may have substituent(s), such as adamantyl, norbornyl, isobornyl, dicyclopentyl, σ-pinyl and tricyclodecanyl.

Examples of an alkylene group for $X_1$ to $X_5$ include an $C_{1-8}$ alkylene group which may have substituent(s), such as methylene, ethylene, propylene, butylene, hexylene and octylene. Examples of the cycloalkylene group include a $C_{5-8}$ cycloalkylene group which may have substituent(s), such as cyclopentylene and cyclohexylene.

Examples of an alkylene group and a cycloalkylene group for $R_{13}$ include the same groups as recited above with respect to $X_1$ to $X_5$. Examples of an alkenylene group for $R_{13}$ include a $C_{2-6}$ alkenylene group, such as ethenylene, propenylene and butenylene. The alkenylene group as $R_{13}$ can include divalent groups formed by combining the above-described divalent groups (alkylene, cycloalkylene and alkenylene groups) with at least one of an ether, ester, amido, urethane and ureido group.

$R_3$, $R_6$ and $R_{11}$ each represent a group which can decompose due to the action of an acid to increase the solubility of the resulting resin in an alkali developer (referred to as "an acid-decomposable group", too). For instance, such an acid-decomposable group is a group of the type which is hydrolyzed by acids to produce an acid, or a group of the type which releases a carbon cation due to the action of acids to form an acid. Preferably, the groups as mentioned above are represented by the following formula (X) or (XI):

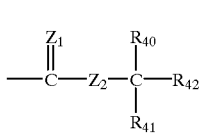

(X)

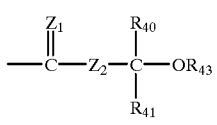

(XI)

wherein $R_{40}$, $R_{41}$ and $R_{42}$, which may be the same or different, each represents a hydrogen atom, an alkyl group which may have substituent(s), a cycloalkyl group which may have substituent(s), or an alkenyl group which may have substituent(s), provided that at least one of $R_{40}$ to $R_{42}$ is not a hydrogen atom; $R_{43}$ represents an alkyl group, a cycloalkyl group or an alkenyl group, which may have substituent(s); or two of $R_{40}$ to $R_{42}$ in formula (X) or two of the substituents $R_{40}$, $R_{41}$ and $R_{43}$ in formula (XI) may combine with each other to form a cyclic structure composed of 3 to 8 carbon atoms, which may further contain a hetero atom. Examples of such a cyclic structure include a cyclopropyl group, a cyclopentyl group, a cyclohexyl group, a cycloheptyl group, a 1-cyclohexenyl group, a 2-tetrahydrofuranyl group and a 2-tetrahydropyranyl group; and $Z_1$ and $Z_2$ each represent O or S. The alkyl, cycloalkyl and alkenyl groups for $R_{40}$ to $R_{43}$ are the same groups as recited above with respect to $R_3$, $R_6$, $R_{11}$ and $R_{12}$ each.

l, m and n each represent 0 or an integer of 1 to 3, preferably 0, 1 or 2.

Examples of the substituent which the foregoing groups each may have include a hydroxyl group, a halogen atom (fluorine, chlorine, bromine or iodine), a nitro group, a cyano group, an amido group, a sulfonamido group, an alkyl group as represented by $R_3$, $R_6$, $R_{11}$ or $R_{12}$, an $C_{1-8}$ alkoxy group such as methoxy, ethoxy, hydroxyethoxy, propoxy, hydroxypropoxy or butoxy, an alkoxycarbonyl group such as methoxycarbonyl or ethoxycarbonyl group, an acyl group such as formyl, acetyl or benzoyl, an acyloxy group such as acetoxy or butyryloxy, and a carboxyl group. Examples of constitutional repeating units represented by formula (Ia), (IIa) and (IIIa) respectively are illustrated below, but these examples should not be construed as limiting the scope of the invention.

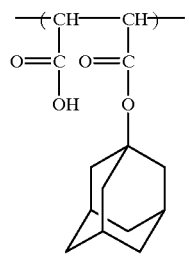
(a1)

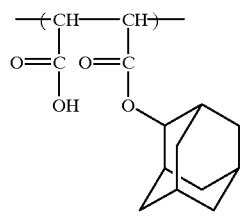
(a2)

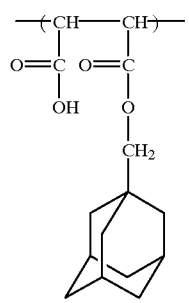
(a3)

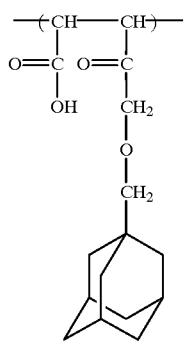
(a4)

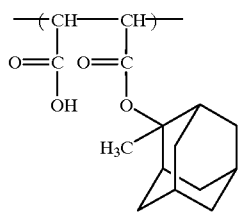
(a5)

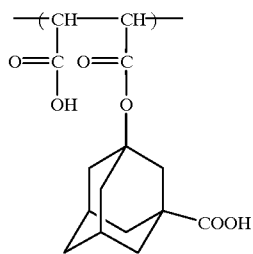
(a6)

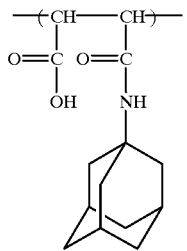
(a7)

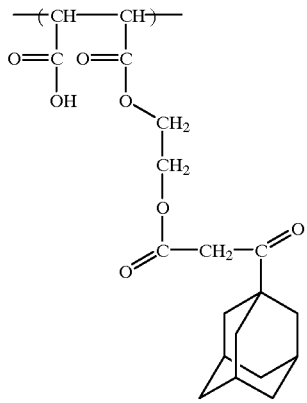
(a8)

(a9) 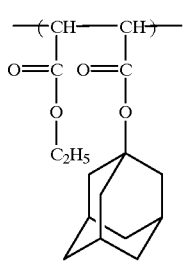
(a10) 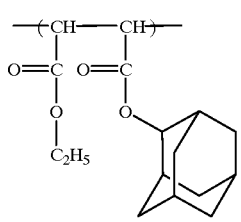
(a11) 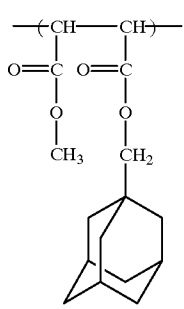
(a12) 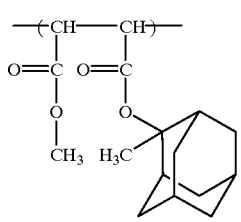
(a13) 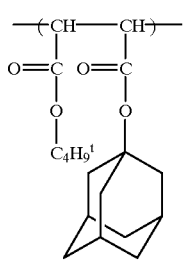
(a14) 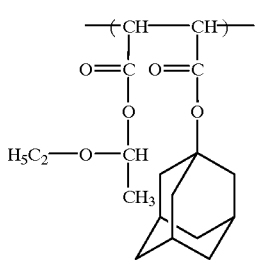
(a15) 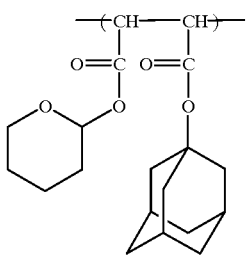
(a16) 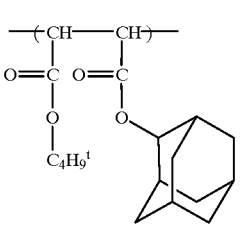
(a17) 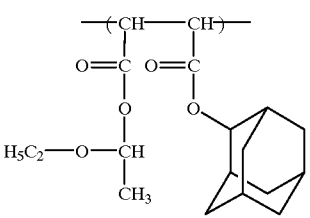
(a18) 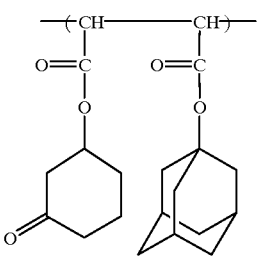
(a19) 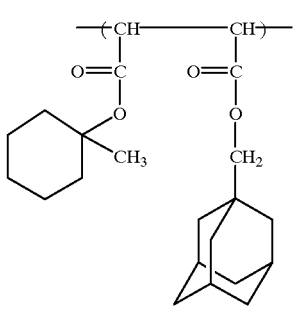
(a20) 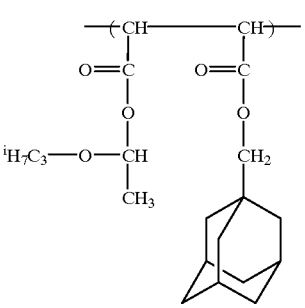

(a21) 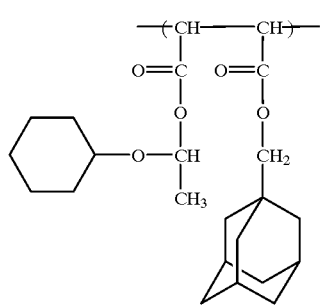
(a22) 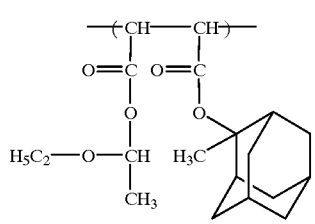
(a23) 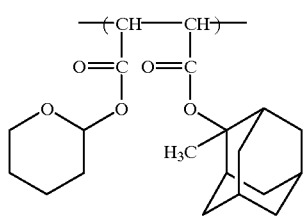
(a24) 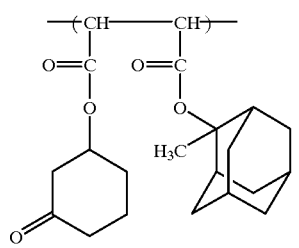
(a25) 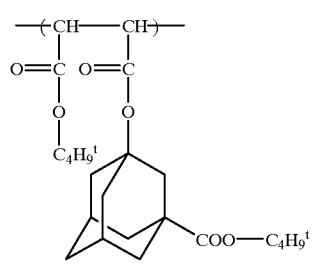
(a26) 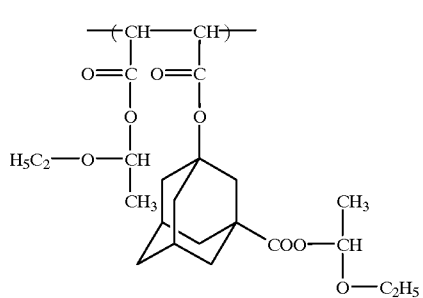
(a27) 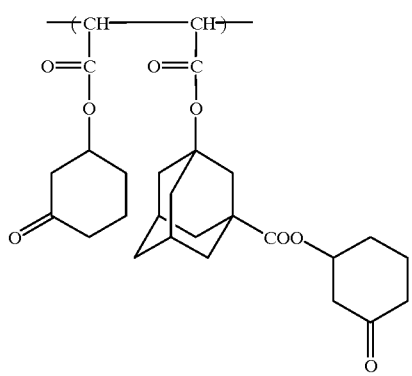
(a28) 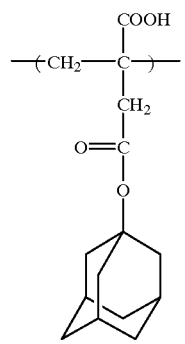
(a29) 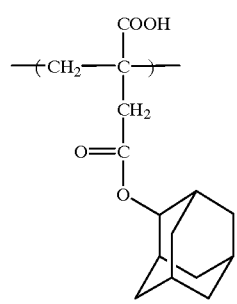
(a30) 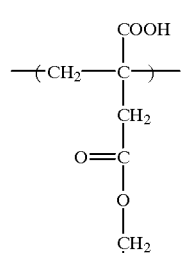
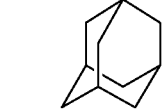

(a31) 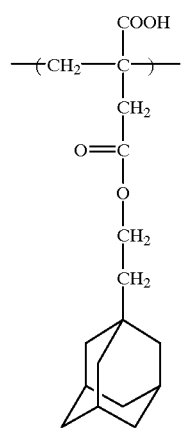
(a32) 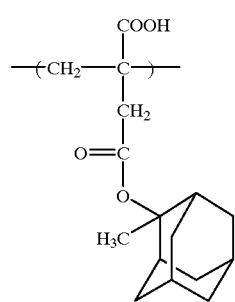
(a33) 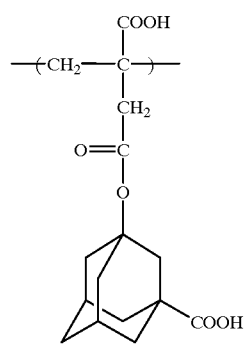
a34) 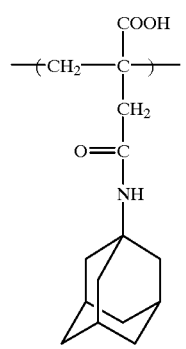
(a35) 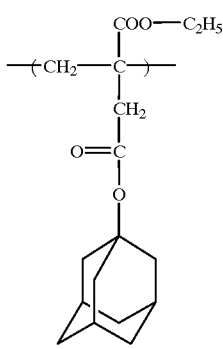
(a36) 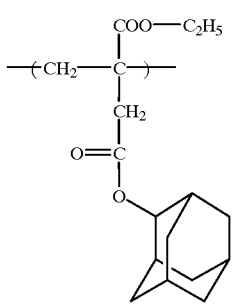
(a37) 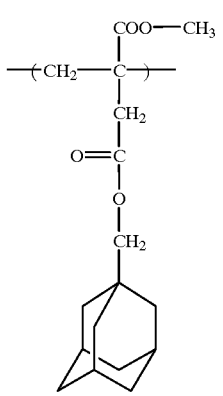
(a38) 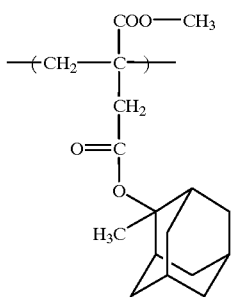

(a39)
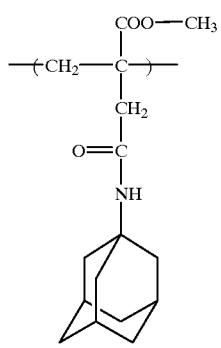
(a40)
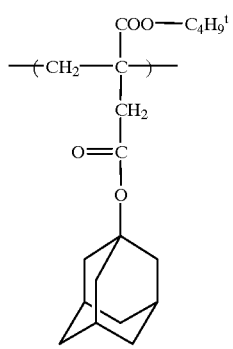
(a41)
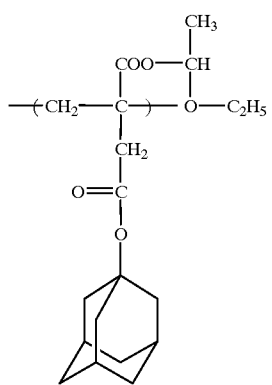
(a42)
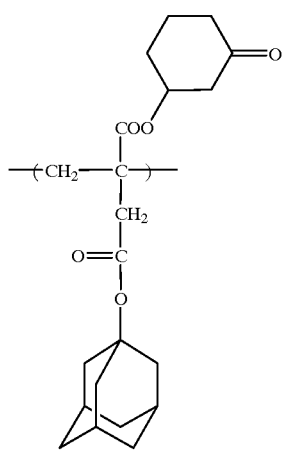
(a43)
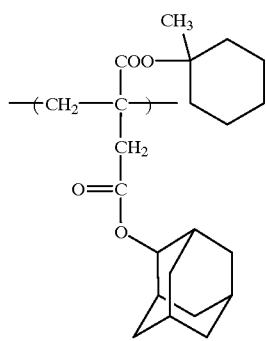
(a44)
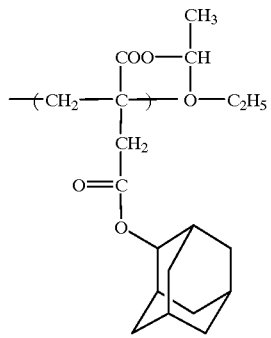
(a45)
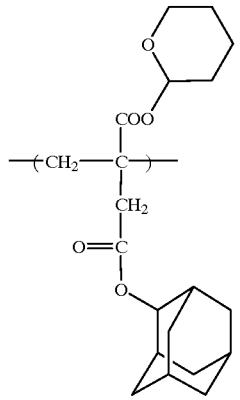
(a46)
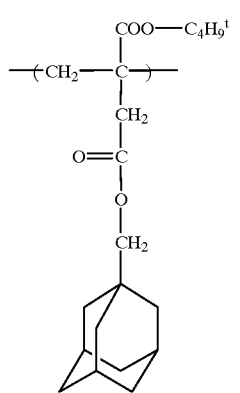

(a47) 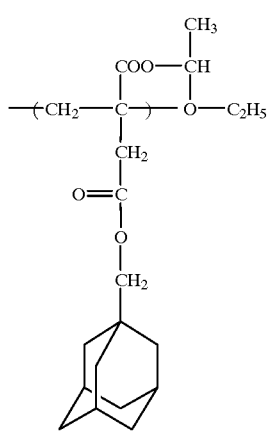
(a48) 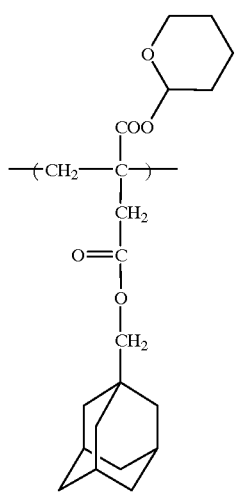
(a49) 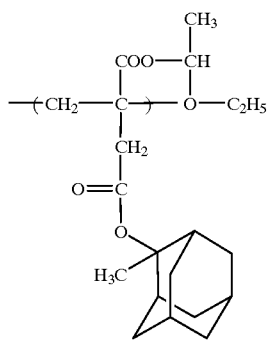
(a50) 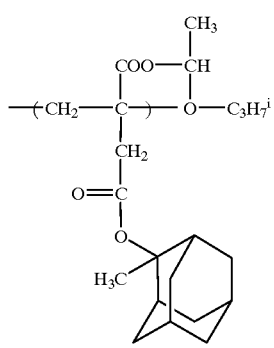
(a51) 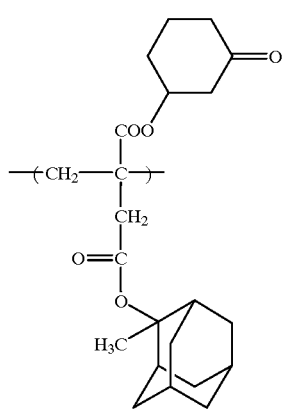
(a52) 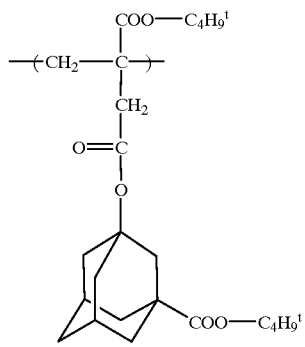
(a53) 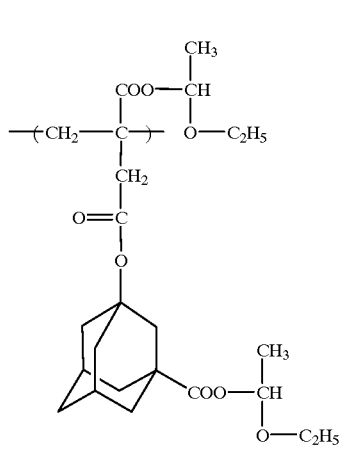

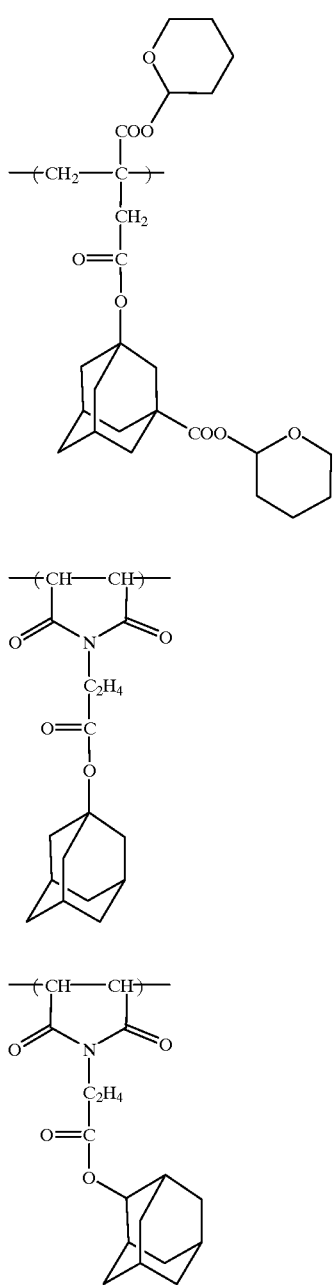
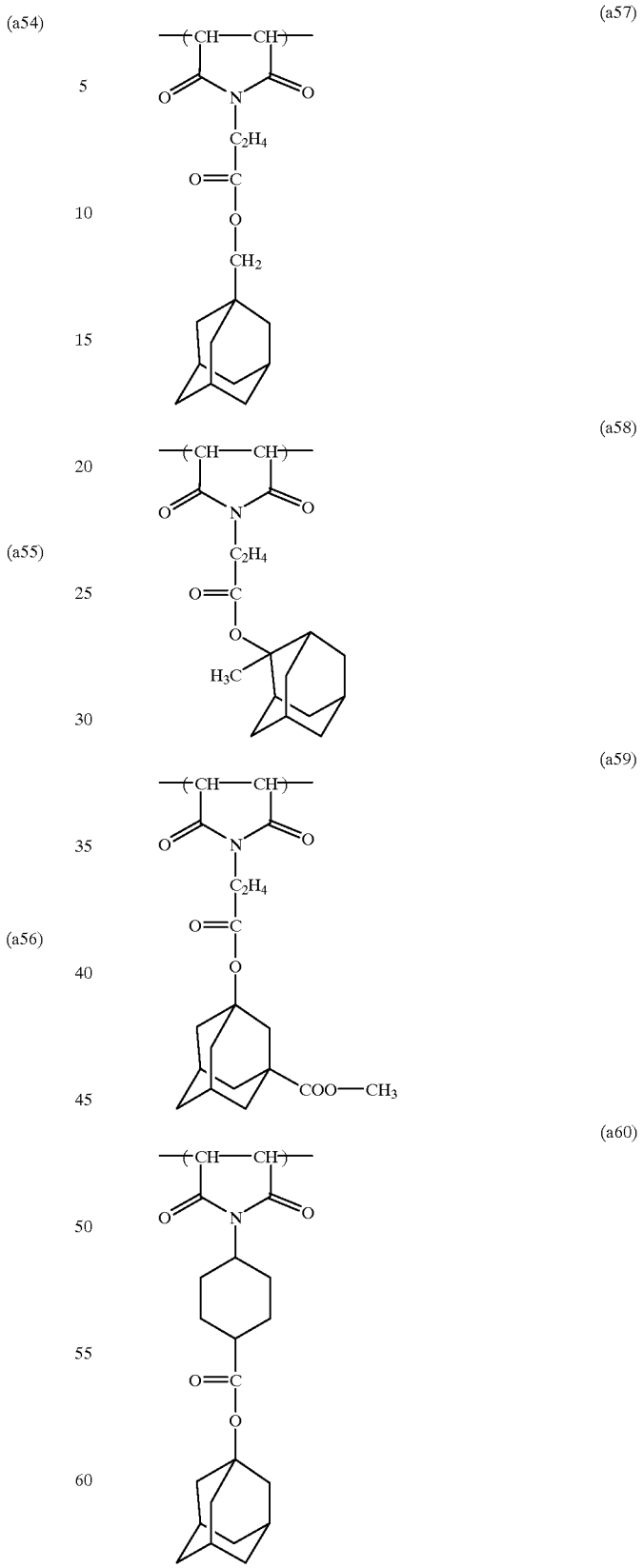

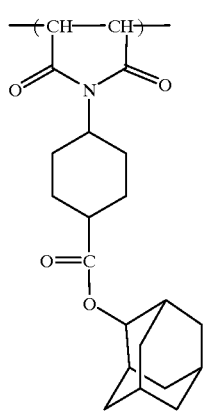 (a61)
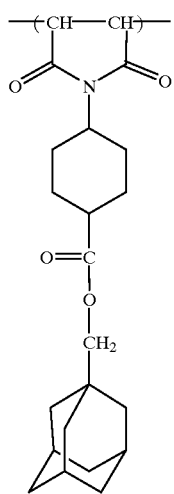 (a62)
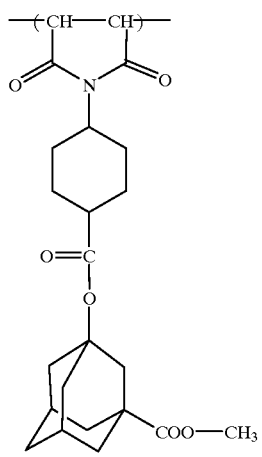 (a63)
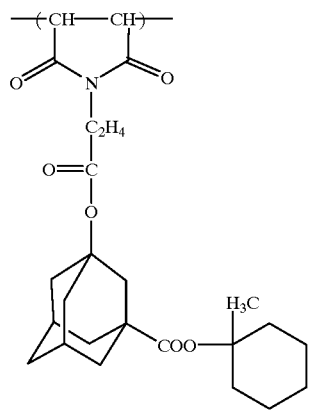 (a64)
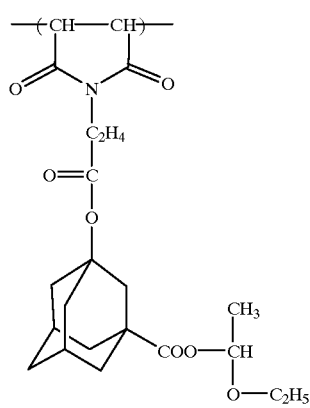 (a65)
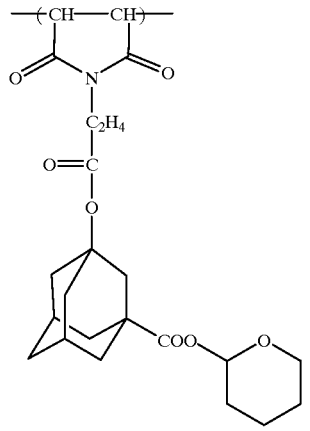 (a66)

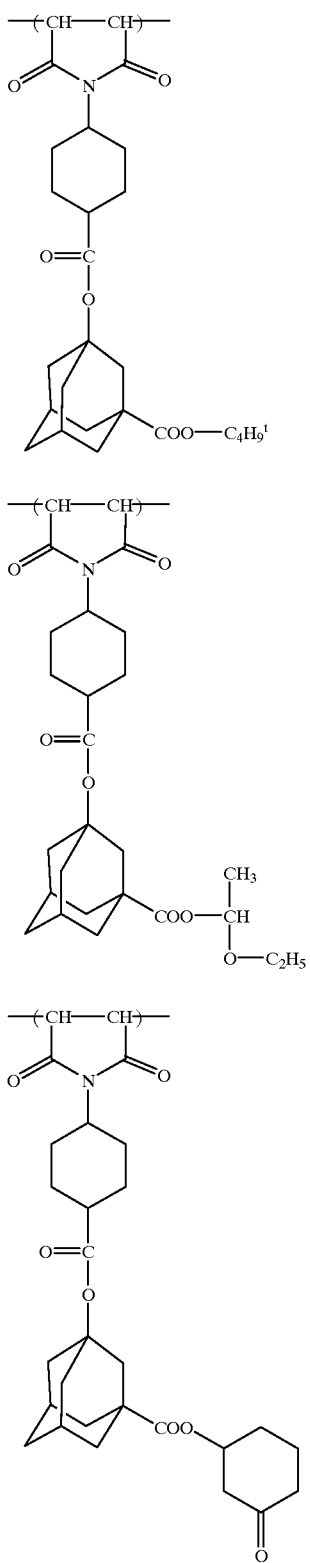

The proportion of alicyclic group-containing constitutional repeating units represented by the foregoing formula (Ia), (IIa) or (IIIa) in the resin according to the present invention, although controlled so as to balance dry etching resistance with alkali developability and so on, is preferably at least 20% by mole, more preferably from 30 to 100% by mole, more preferably from 40 to 90% by mole, most preferably from 45 to 75% by mole, to the total repeating units.

[2] Constitutional repeating units having acid-decomposable groups

As for the resins relating to the present invention, the acid-decomposable groups may be present in constitutional repeating units of formula (Ia), (IIa) or (IIIa) (as $R_3$, $R_6$ or $R_{11}$), or/and other constitutional repeating units.

Preferably, the constitutional repeating units having acid-decomposable groups are units of formula (IVa), (Va) or (VIa).

Examples of an alkyl group for $R_{14}$, $R_{15}$, $R_{17}$, $R_{18}$ or $R_{19}$ in the foregoing formulae (IVa) to (VIa) include an $C_{1-4}$ alkyl group which may have substituent(s), such as methyl, ethyl, propyl, n-butyl and sec-butyl. Examples of the haloalkyl group include an $C_{1-4}$ alkyl group substituted by a fluorine atom, a chlorine atom or a bromine atom, such as fluoromethyl, chloromethyl, bromomethyl, fluoroethyl, chloroethyl and bromoethyl.

Examples of the alkyl group for $R_{20}$, $R_{21}$, $R_{22}$ or $R_{25}$ include an $C_{1-8}$ alkyl group which may have substituent(s), such as methyl, ethyl, propyl, n-butyl, sec-butyl, hexyl, 2-ethylhexyl and octyl. Examples of the cycloalkyl group include a $C_{3-8}$ cycloalkyl group which may have substituent(s), such as cyclopropyl, cyclopentyl and cyclohexyl. Examples of the alkenyl group include a $C_{2-6}$ alkenyl group which may have substituent(s), such as vinyl, propenyl, allyl, butenyl, pentenyl, hexenyl and cyclohexenyl groups. Examples of the nitrogen-containing ring completed by combining $R_{21}$ and $R_{22}$ include 5- to 8-membered rings, such as pyrrolidine, piperidine and piperazine rings.

Examples of the alkylene group for $X_6$ to $X_8$, $R_{23}$, $R_{24}$ or $R_{26}$ include an $C_{1-8}$ alkylene group which may have substituent(s), such as methylene, ethylene, propylene, butylene, hexylene and octylene. Examples of the alkenylene group include a $C_{2-6}$ alkenylene group which may have substituent(s), such as ethenylene, propenylene and butenylene. Examples of the cycloalkylene group include a $C_{5-8}$ cycloalkylene group which may have substituent(s), such as cyclopentylene and cyclohexylene. $R_{23}$, $R_{24}$ or $R_{26}$ may be a divalent group formed by combining an alkylene, alkenylene or cycloalkylene group as recited above with at least one of ether, ester, amido, urethane and ureido groups.

Examples of the substituent which the aforementioned groups may have include a hydroxyl group, a halogen atom (fluorine, chlorine, bromine or iodine), a nitro group, a cyano group, an amido group, a sulfonamido group, an alkyl group as represented by $R_{20}$, $R_{21}$, $R_{22}$ or $R_{25}$, an $C_{1-8}$ alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, and a carboxyl group.

B and $R_{20}$ each represent a group capable of decomposing due to the action of acids to increase the solubility of the resulting resin in an alkali developer. Examples of such an acid-decomposable group include a group of the type which is hydrolyzed by the action of acids to produce an acid, and a group of the type which releases a carbon cation due to the action of acids to form an acid. As groups of those types, the groups of formula (X) or (XI) illustrated with respect to $R_3$, $R_6$ and $R_{11}$ are preferred.

Examples of constitutional repeating units represented by formula (IVa), (Va) and (VIa) respectively are illustrated below, but these examples should not be construed as limiting the scope of the invention.

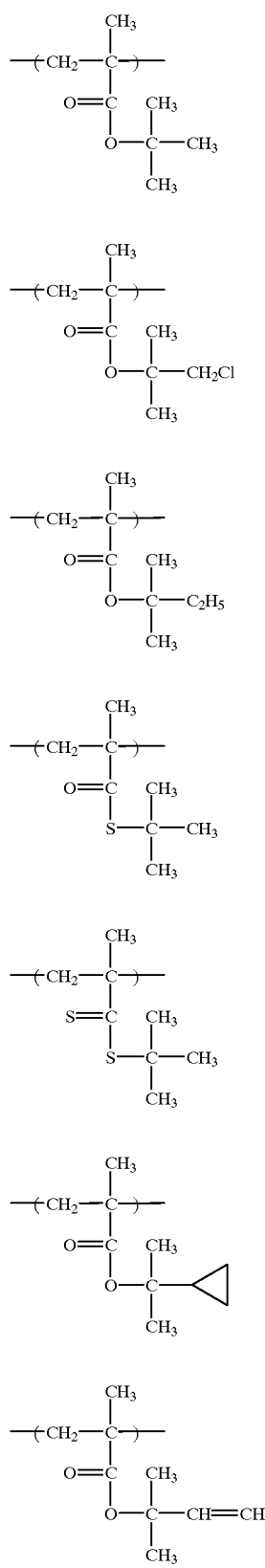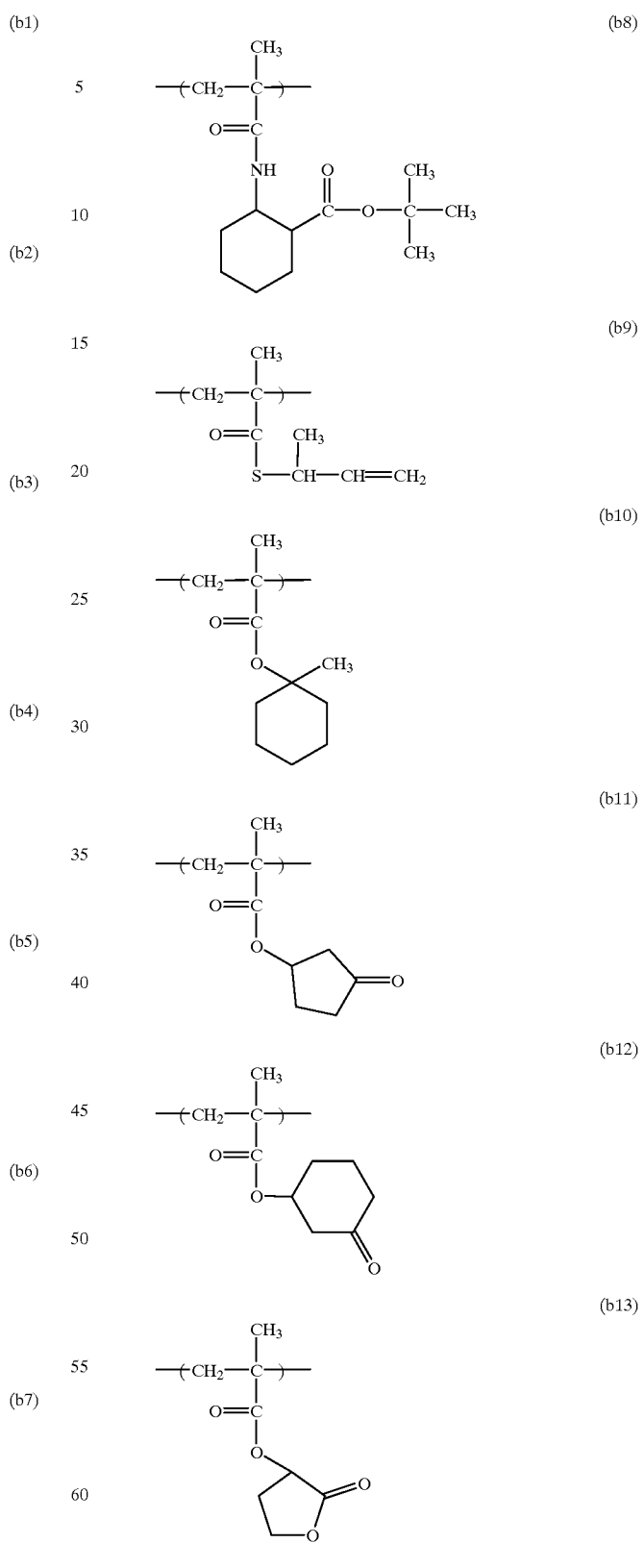

(b14)
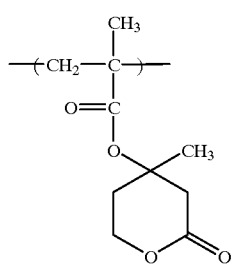
(b15)
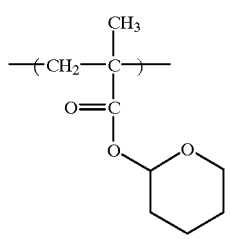
(b16)
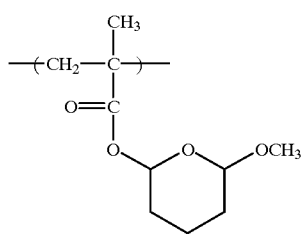
(b17)
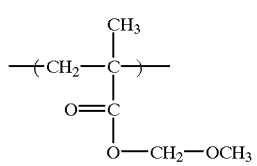
(b18)
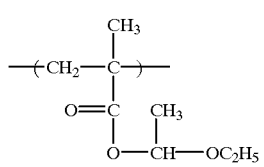
(b19)
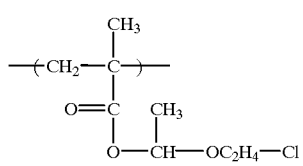
(b20)
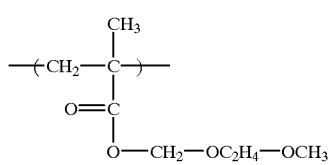
(b21)
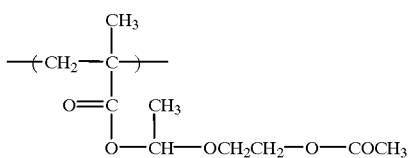
(b22)
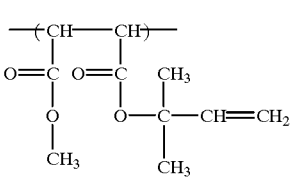
(b23)
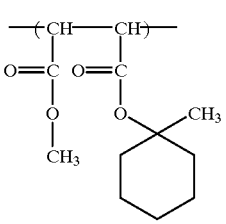
(b24)
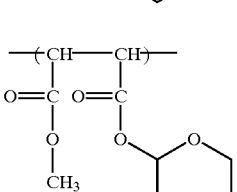
(b25)
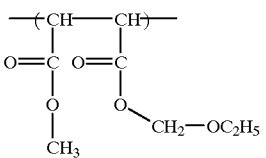
(b26)
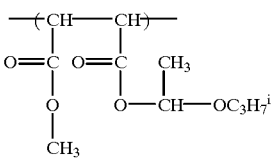
(b27)
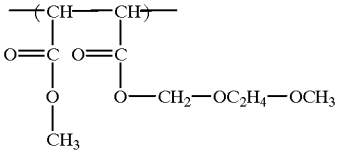
(b28)
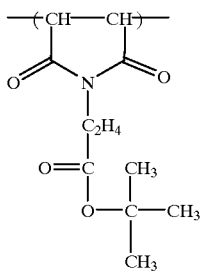

(b29)

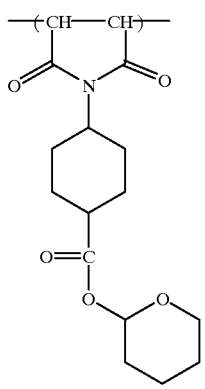

(b30)

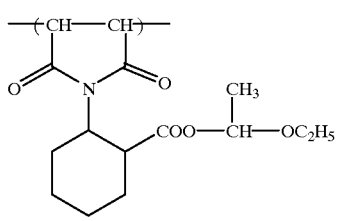

The proportion of the acid decomposable group-containing constitutional repeating units (preferably, those represented by the foregoing formula (IVa), (Va) or (VIa)) in the resin according to the present invention is preferably from 0 to 50% by mole, more preferably from 5 to 40% by mole, most preferably from 10 to 30% by mole, to the total repeating units, although controlled depending on the properties to be achieved including alkali developability, adhesion to a substrate and dry etching resistance. This proportion is the total proportion of all the acid decomposable group-containing constitutional repeating units in the resin including the proportion of constitutional repeating units which are represented by formula (Ia), (IIa) or (IIIa) and have acid-decomposable groups.

Other resins usable as the Component (B) of the present invention, wherein polycyclic alicyclic groups of formula (Ib), (IIb) or (IIIb) and acid-decomposable groups are present, are illustrated below in detail.

The polycyclic alicyclic groups of formula (Ib), (IIb) or (IIIb) and acid-decomposable groups can be attached to any sites in the mother resin. Namely, the polycyclic alicyclic group of formula (Ib), (IIb) or (IIIb) and an acid-decomposable group may be attached to different repeating units of the resin, or those groups may be attached to the same repeating unit. Further, the resin may be composed of the mixture of these types.

The repeating units having groups represented by formula (Ib), (IIb) or (IIIb) which are incorporated into the resin are preferably constitutional repeating units represented by formula (IVb), (Vb) or (VIb).

Examples of an alkyl group for $R_1$ to $R_5$, $R_7$, $R_9$, $R_{11}$, $R_{12}$, $R_{14}$, $R_{27}$ to $R_{29}$, or $R_{32}$ in the foregoing formula (IVb), (Vb) or (VIb) include an $C_{1-8}$ alkyl group which may have substituent(s), such as methyl, ethyl, propyl, n-butyl, sec-butyl, hexyl, 2-ethylhexyl and octyl. Examples of the cycloalkyl group include a $C_{3-8}$ cycloalkyl group which may have substituent(s), such as cyclopropyl, cyclopentyl and cyclohexyl, and examples of the alkenyl group include a $C_{2-6}$ alkenyl group which may have substituent(s), such as vinyl, propenyl, allyl, butenyl, pentenyl, hexenyl and cyclo- hexenyl. Examples of the alkynyl group for $R_1$ to $R_5$ include a $C_{2-4}$ alkynyl group such as acetyl and propargyl.

Therein, when l, m, n, p or q is 2 or more, the two or more of each of $R_1$, $R_2$, $R_3$, $R_4$ and $R_5$ may be the same or different, and when the two groups are attached to the same carbon atom, they may represent a carbonyl group (=O) or a thiocarbonyl group (=S) together. (Namely, a carbonyl group or a thiocarbonyl group may be bonded to the carbon atom on each ring, and such a case can be regarded as the case where two of each of $R_1$ to $R_5$ are bonded to the same carbon atom.)

When two of the $R_1$ groups (i=1 to 5) are attached to adjacent carbon atoms, on the other hand, they may combine with each other to complete a C—C double bond. However, it is undesirable that the thus formed C—C double bonds make a conjugate C—C double bond system.

Further, when l, m, n, p and q each are two or more, two groups among the groups represented by $R_1$ to $R_5$ may combine to form a ring when they are adjacent to each other. Examples of such a ring include 3- to 8-membered rings which may contain a hetero atom, such as cyclopropane, cycldpentane, cyclohexane, cycloheptane, tetrahyrofuran and tetrahydropyran. These rings may further have substituent(s).

The bonding hand of the monovalent polycyclic alicyclic group represented by formula (Ib), (IIb) or (IIIb) may be situated at any site of each polycyclic hydrocarbon structure.

Examples of the alkyl group for $R_{15}$, $R_{16}$, $R_{18}$ to $R_{22}$, and $R_{24}$ to $R_{26}$ include an $C_{1-4}$ alkyl group which may have substituent(s), such as methyl, ethyl, propyl, n-butyl and sec-butyl. Examples of the haloalkyl group include an $C_{1-4}$ alkyl group substituted by a fluorine atom, a chlorine atom or a bromine atom, such as fluoromethyl, chloromethyl, bromomethyl, fluoroethyl, chloroethyl and bromoethyl.

Examples of the alkylene group for $R_6$, $R_8$, $R_{10}$, $R_{13}$ and $X_1$ to $X_6$ include an $C_{1-8}$ alkylene group, such as methylene, ethylene, propylene, butylene, hexylene and octylene, which may have substituent(s). Examples of the alkenylene group include a $C_{2-6}$ alkenylene group which may have substituent (s), such as ethenylene, propenylene and butenylene. Examples of the cycloalkylene group include a $C_{5-8}$ cycloalkylene group which may have substituent(s), such as cyclopentylene and cyclohexylene.

Examples of the alkylene group, alkenylene and cycloalkylene group for $R_{30}$, $R_{31}$ and $R_{33}$ include the same groups as recited above. $R_{30}$, $R_{31}$ and $R_{33}$ can include divalent groups formed by combining these divalent groups with at least one of an ether, ester, amido, urethane and ureido group.

Examples of the nitrogen-containing ring formed by combining $R_{11}$ with $R_{12}$, or by combining $R_{28}$ with $R_{29}$ include 5- to 8-membered rings, such as pyrrolidine, piperidine and piperazine.

$R_7$, $R_9$, $R_{27}$ and B each represent a group which can decompose due to the action of acids to increase the solubility of the resulting resin in an alkali developer (an acid-decomposable group).

As for the resins relating to the present invention, the acid-decomposable groups may be present as $R_7$ or $R_9$ in the structures of groups represented by formula (Ib), (IIb) or (IIIb), or as $R_{27}$ in constitutional repeating units having groups represented by formula (Ib), (IIb) or (IIIb), or in other constitutional repeating units. Further, they may be situated at two or more of those different types of positions.

Examples of an acid-decomposable group include a group of the type which is hydrolyzed by acids to produce an acid, or a group of the type which releases a carbon cation due to the action of acids to form an acid. Preferred examples thereof include those represented by the following formula (XIII) or (XIV). By virtue of these groups, the aging stability is enhanced.

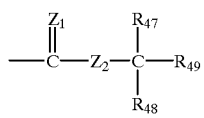
(XIII)

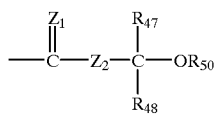
(XIV)

wherein $R_{47}$, $R_{48}$ and $R_{49}$, which may be the same or different, each represents a hydrogen atom, or an alkyl, cycloalkyl or alkenyl group which may have substituent(s), provided that at least one of $R_{47}$ to $R_{49}$ is not a hydrogen atom; $R_{50}$ represents an alkyl group, a cycloalkyl group or an alkenyl group, which may have substituent(s); or two of $R_{47}$ to $R_{49}$ in formula (XIII) or two of $R_{47}$, $R_{48}$ and $R_{50}$ in formula (XIV) may combine with each other to form a cyclic structure constituted of 3 to 8 carbon atoms, which may further contain a hetero atom. Examples of such a cyclic structure includes a cyclopropyl group, a cyclopentyl group, a cyclohexyl group, a cycloheptyl group, a 1-cyclohexenyl group, a 2-tetrahydrofuranyl group and a 2-tetrahydropyranyl group. $Z_1$ and $Z_2$, which may be the same or different, each represent an oxygen atom or a sulfur atom.

The alkyl, cycloalkyl and alkenyl groups for $R_{47}$ to $R_{50}$ include the same groups as recited above with respect to $R_1$ to $R_5$.

l, m, n, p and q each represent 0 or an integer of 1 to 5, preferably 0, 1 or 2.

Examples of the substituent which the foregoing groups may have include a hydroxyl group, a halogen atom (fluorine, chlorine, bromine or iodine), a nitro group, a cyano group, an amido group, a sulfonamido group, an alkyl group as represented by $R_1$ to $R_5$, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, and a carboxyl group.

The proportion of constitutional repeating units having alicyclic groups represented by the foregoing formula (Ib), (IIb) or (IIIb) (preferably, constitutional repeating units of formula (IVb) to (VIb)) in the resin according to the present invention is preferably at least 20% by mole, more preferably from 30 to 80% by mole, most preferably from 40 to 65% by mole, to the total repeating units, although controlled so as to balance dry etching resistance with alkali developability and so on.

The proportion of constitutional repeating units having the aforementioned acid-decomposable groups (preferably, those represented by the foregoing formula (IVa), (Va) or (VIa)) in the resin according to the present invention is preferably from 5 to 80% by mole, more preferably from 10 to 70% by mole, most preferably from 20 to 60% by mole, to the total repeating units, although controlled depending on the properties to be achieved including alkali developability, adhesion to a substrate and so on. This proportion is the total proportion of all the acid decomposable group-containing constitutional repeating units in the resin including those contained in the constitutional repeating units having groups represented by formula (Ib), (IIb) or (IIIb).

Examples of constitutional repeating units represented by the foregoing formulae (IVb), (Vb) and (VIb) respectively, from (a'1) to (a'33), are illustrated below, but these examples should not be construed as limiting the scope of the present invention in any way.

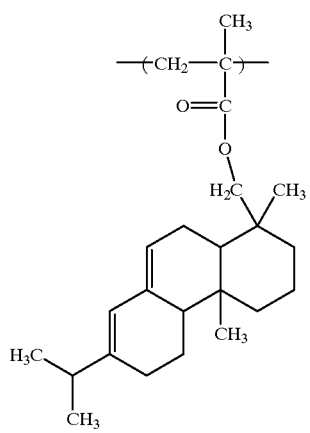
(a'1)

-continued
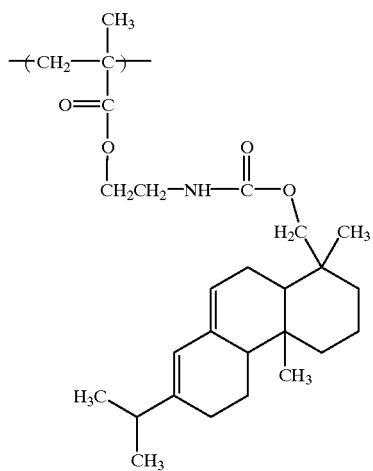
(a'2)
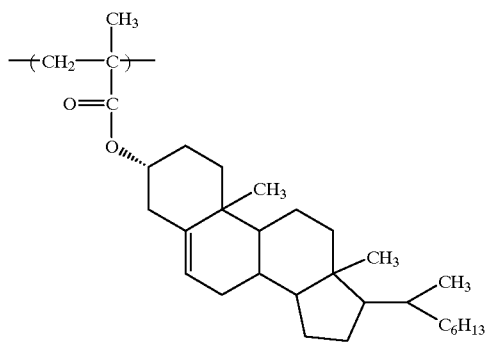
(a'3)
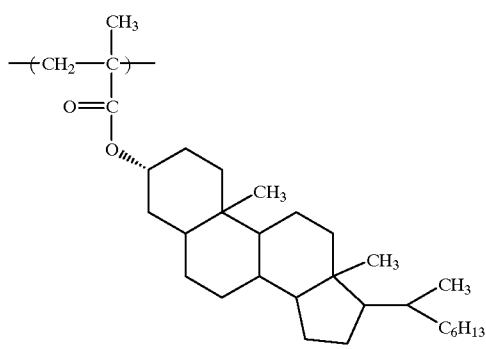
(a'4)
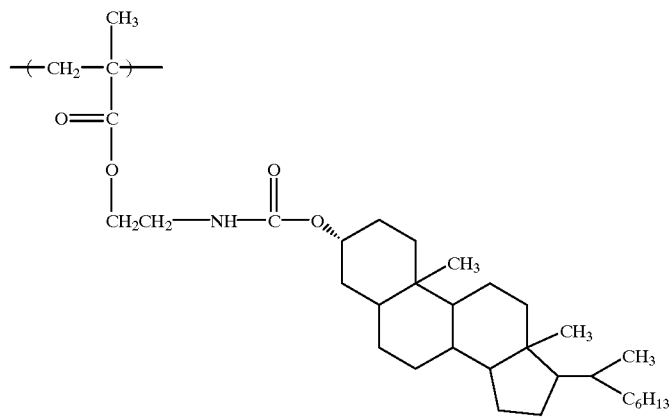
(a'5)

(a'6)
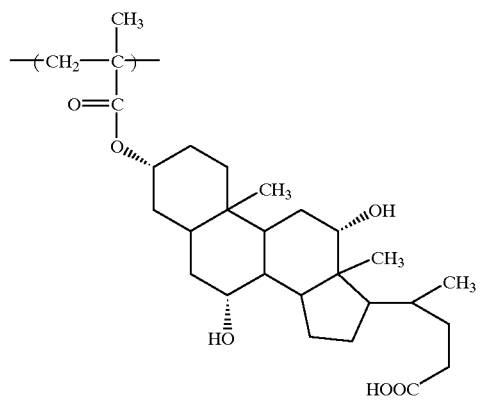
(a'7)
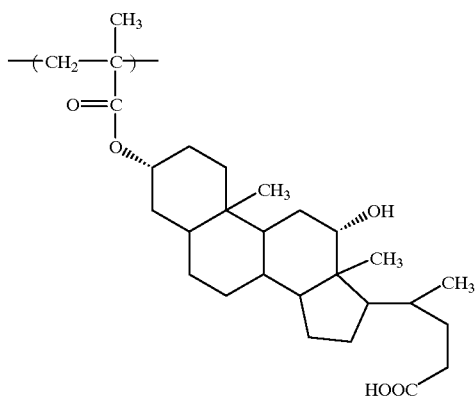
(a'8)
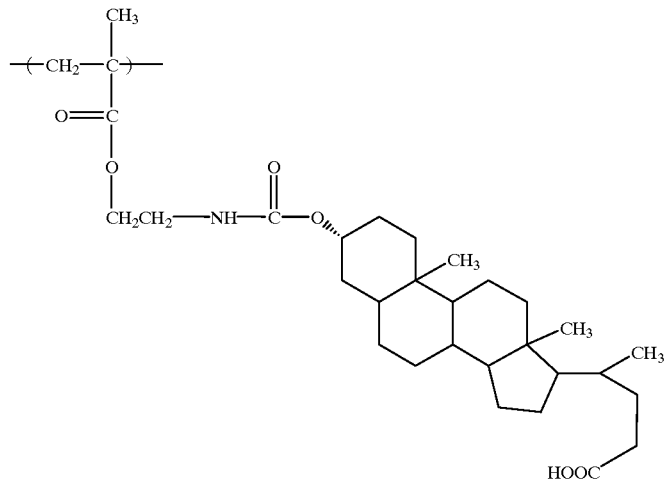

(a'9)
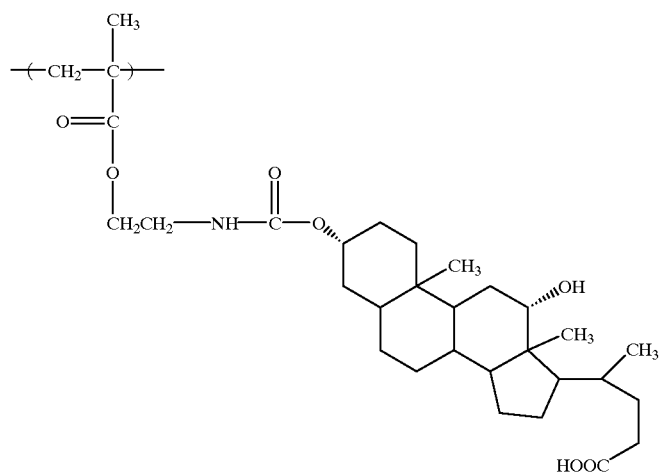
(a'10)
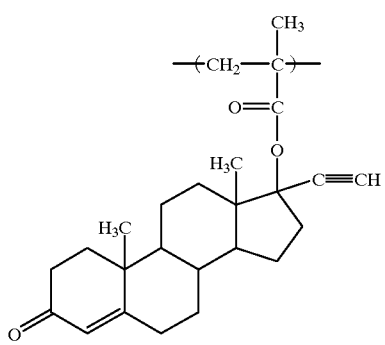
(a'11)
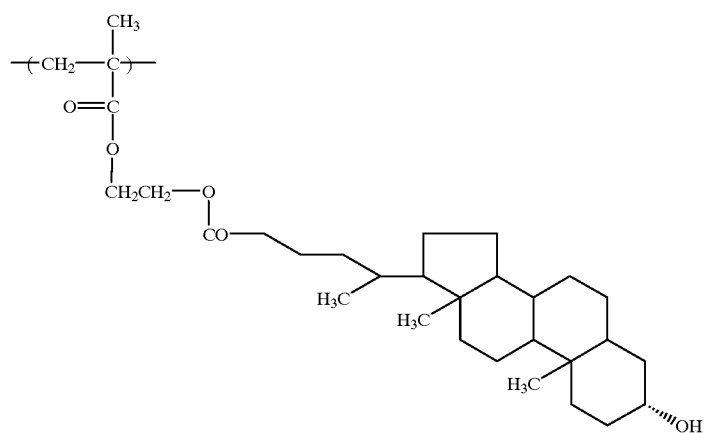

-continued
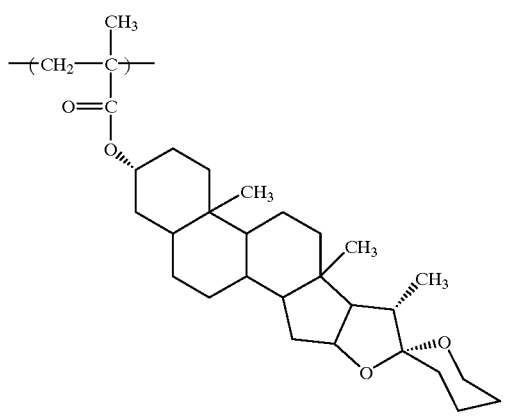
(a'12)
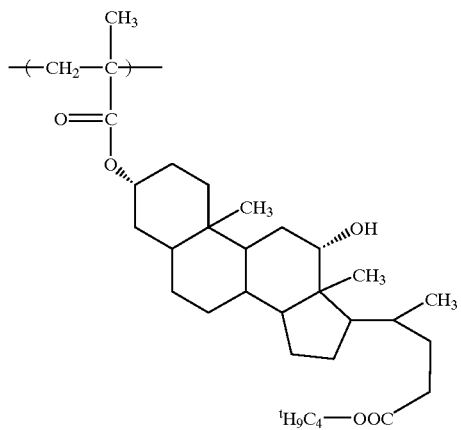
(a'13)
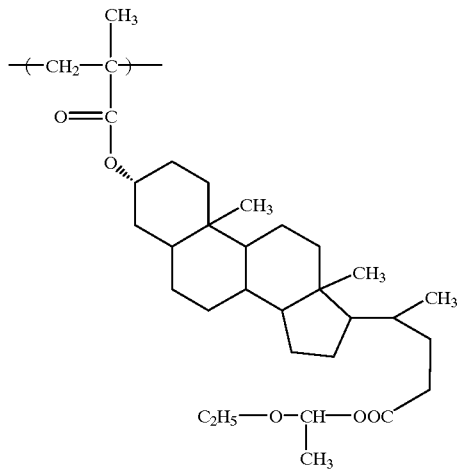
(a'14)

-continued
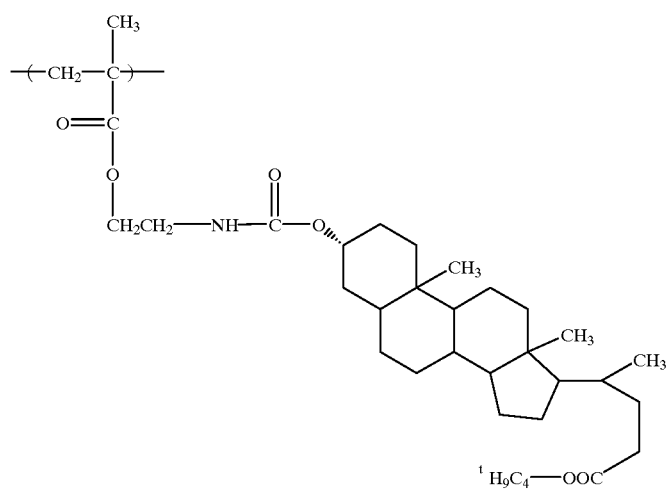
(a'15)
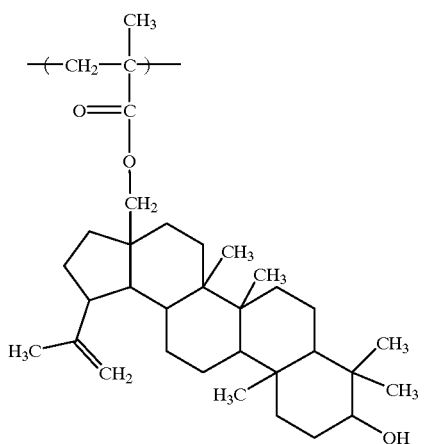
(a'16)
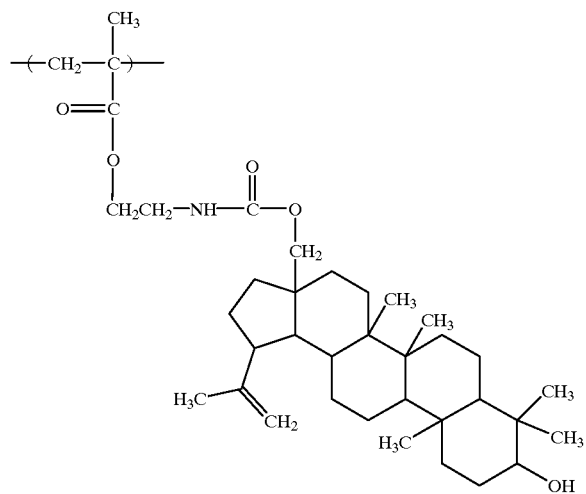
(a'17)

-continued
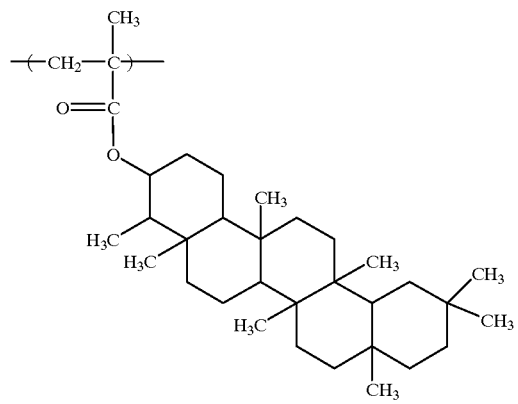
(a'18)
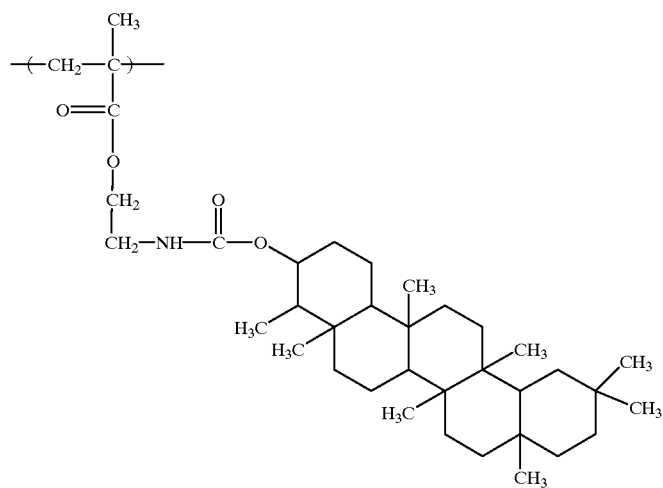
(a'19)
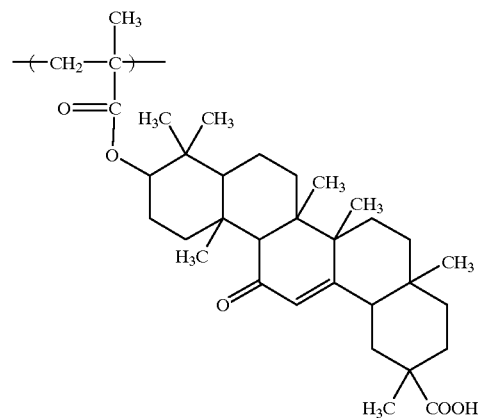
(a'20)

(a'21)
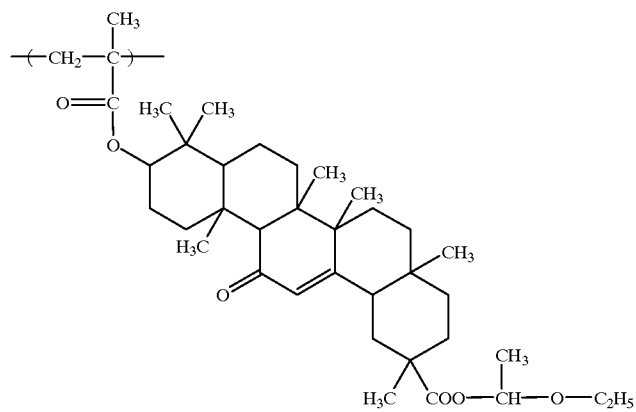
(a'22)
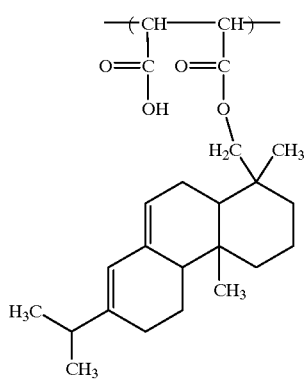
(a'23)
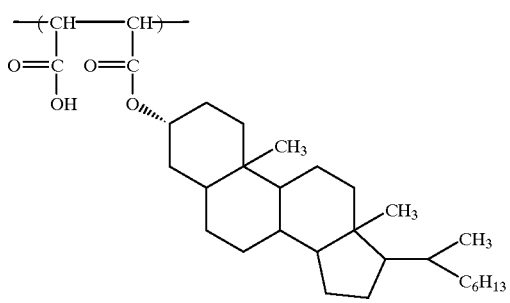
(a'24)
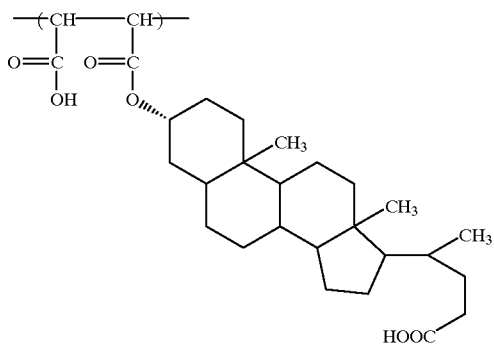

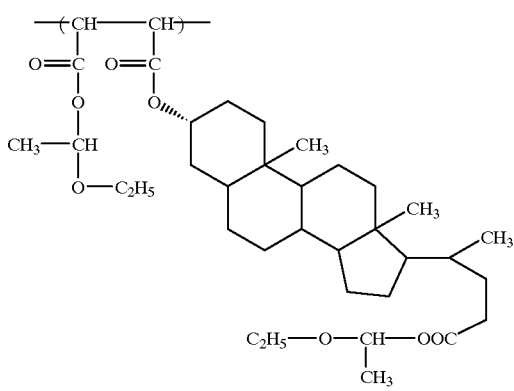
(a'25)
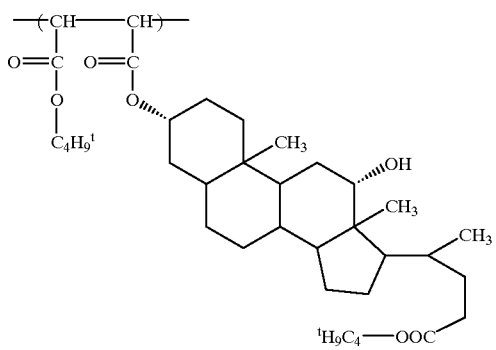
(a'26)
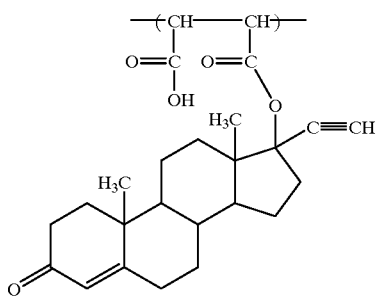
(a'27)
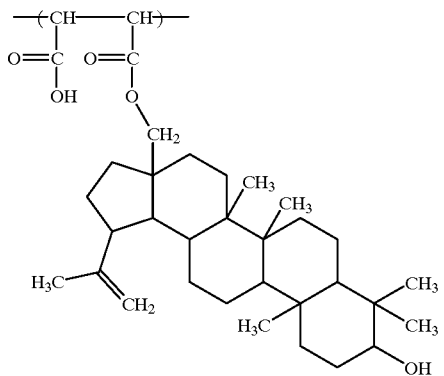
(a'28)

-continued
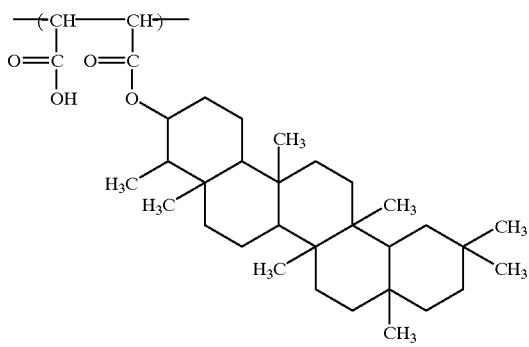
(a'29)
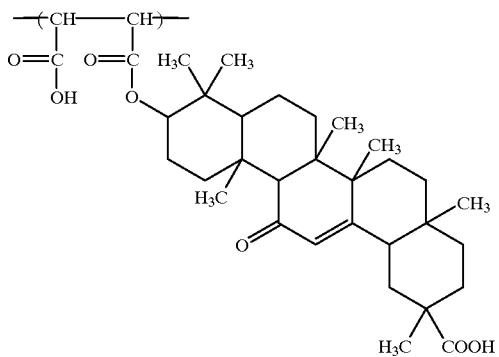
(a'30)
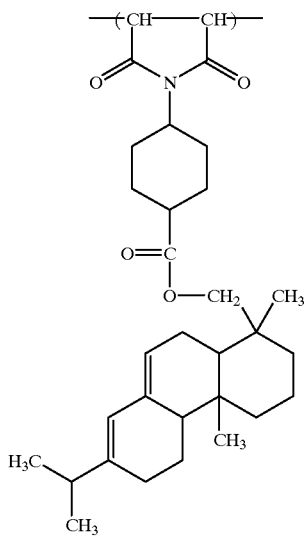
(a'31)

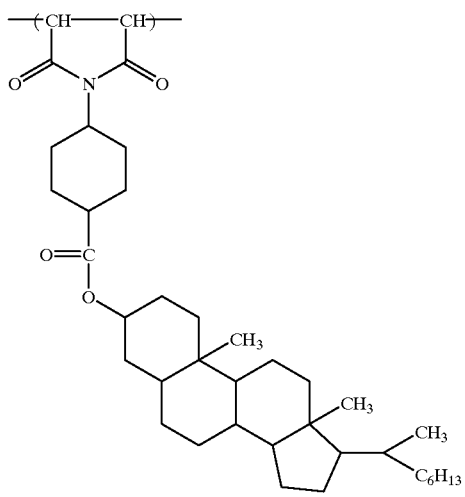

(a'32)

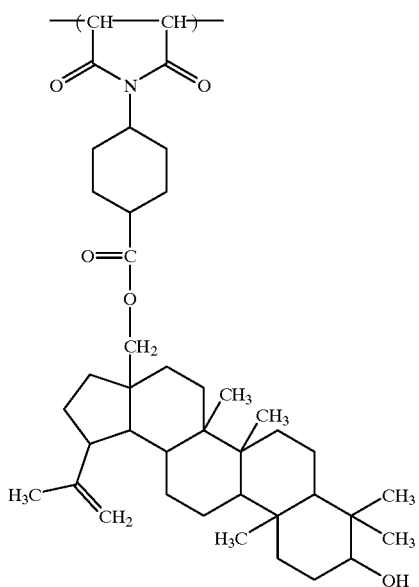

(a'33)

[3] Constitutional repeating units having carboxyl groups

In the resin to be used in the present invention, the carboxyl group may be present in constitutional repeating units of the foregoing formula (Ia), (IIa) or (IIIa), constitutional repeating units having groups of the foregoing formula (Ib), (IIb) or (IIIb), constitutional repeating units having acid-decomposable groups, or other constitutional repeating units. Further, the carboxyl groups may be situated at two or more of the different types of positions recited above.

Preferably, the constitutional repeating units having carboxyl groups are repeating units of the foregoing formula (VII), (VIII) or (IX).

Examples of an alkyl group for $R_{27}$, $R_{28}$, $R_{30}$ to $R_{32}$ in formula (VII) to (IX) include an $C_{1-4}$ alkyl group which may have substituent(s), such as methyl, ethyl, propyl, n-butyl and sec-butyl. Examples of the haloalkyl group for $R_{27}$, $R_{28}$, $R_{30}$ to $R_{32}$ include an $C_{1-4}$ alkyl group substituted with a fluorine, chlorine or bromine atom, such as fluoromethyl, chloromethyl, bromomethyl, fluoroethyl, chloroethyl and bromoethyl.

Examples of an alkyl group for $R_{34}$, $R_{35}$ or $R_{38}$ include an $C_{1-8}$ alkyl group which may have substituent(s), such as methyl, ethyl, propyl, n-butyl, sec-butyl, hexyl, 2-ethylhexyl and octyl. Examples of the cycloalkyl group include a $C_{3-8}$ cycloalkyl group, such as cyclopropyl, cyclopentyl and cyclohexyl, which may have substituent(s). Examples of the alkenyl group include a $C_{2-6}$ alkenyl group which may have substituent(s), such as vinyl, propenyl, allyl, butenyl, pentenyl, hexenyl and cyclohexenyl. Examples of the nitrogen-containing ring formed by combining $R_{34}$ and $R_{35}$ include 5- to 8-membered rings, such as pyrrolidine, piperidine and piperazine.

Examples of the alkylene group for $X_9$ to $X_{11}$, $R_{36}$, $R_{37}$ or $R_{39}$ include an $C_{1-8}$ alkylene group which may have substituent(s), such as methylene, ethylene, propylene, butylene, hexylene and octylene. Examples of the alkenylene group include a $C_{2-6}$ alkenylene group which may have substituent(s), such as ethenylene, propenylene and butenylene. Examples of the cycloalkylene group include a $C_{5-8}$ cycloalkylene group which may have substituent(s), such as cyclopentylene and cyclohexylene. $R_{36}$, $R_{37}$ or $R_{39}$ may be a divalent group formed by combining an alkylene, alkenylene or cycloalkylene group as recited above with at least one selected from ether, ester, amido, urethane and ureido groups.

Examples of the substituent which the aforementioned groups may have include a hydroxyl group, a halogen atom (fluorine, chlorine, bromine or iodine), a nitro group, a cyano group, an amido group, a sulfonamido group, an alkyl group as represented by $R_{34}$, $R_{35}$ or $R_{38}$, a $C_{1-8}$ alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, and a carboxyl group.

Examples of constitutional repeating units represented by formulae (VII), (VIII) and (IX) are illustrated below, but these examples should not be construed as limiting the scope of the invention in any way.

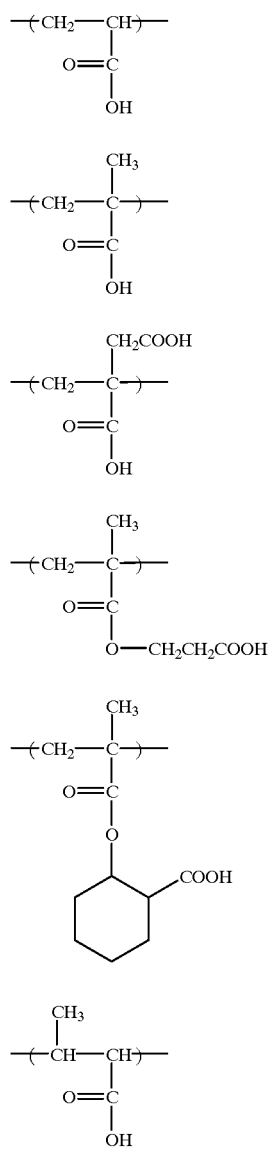

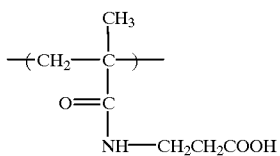

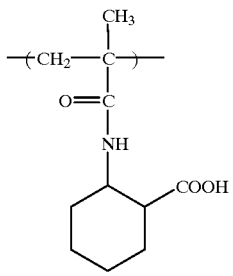

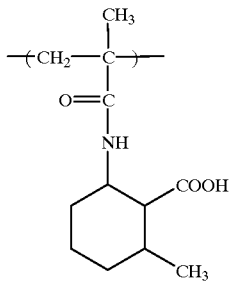

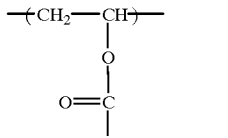

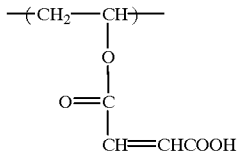

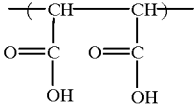

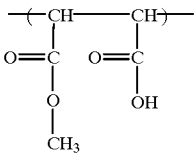

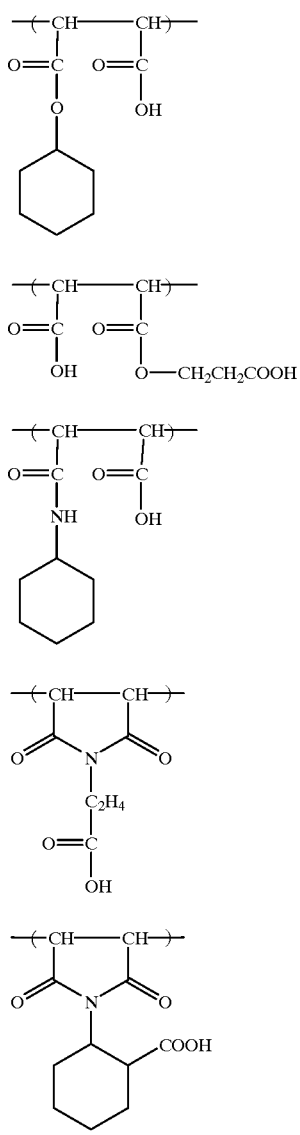

The proportion of the carboxyl group-containing constitutional repeating units (preferably, those represented by the foregoing formula (VII), (VIII) or (IX)) in the resin according to the present invention is preferably from 0 to 60% by mole, more preferably from 0 to 40% by mole, most preferably from 0 to 20% by mole, to the total constitutional repeating units, although controlled depending on the properties to be achieved, including alkali developability, adhesion to a substrate and sensitivity. This proportion is the total proportion of all the carboxyl group-containing constitutional repeating units in the resin, including the proportion of constitutional repeating units represented by formula (Ia), (IIa) or (IIIa) and constitutional repeating units which have not only carboxyl groups but also acid-decomposable groups.

[4] Resins as component (B) which have the above-described constitutional repeating units For the purpose of enhancing the properties of the resin as Component (B) of the present invention, other polymerizable monomers may be copolymerized so far as they do not significantly impair the transmittance of the resulting resin at wavelengths of 220 nm or shorter and the dry etching resistance. The copolymerizable monomers which can be used for the aforesaid purpose are as in the following. Examples of the copolymerizable monomers include compounds having one addition polymerizable unsaturated bond per molecule, which are selected from acrylic acid esters, acrylic amides, methacrylic acid esters, methacrylic amides, allyl compounds, vinyl ethers, vinyl esters, styrenes, or crotonic acid esters.

More specifically, those compounds include acrylic acid esters, such as alkyl acrylates wherein the alkyl group preferably has 1 to 10 carbon atoms (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate) and aryl acrylates (e.g., phenyl acrylate, hydroxyphenyl acrylate); methacrylic acid esters, such as alkyl methacrylates wherein the alkyl group preferably has 1 to 10 carbon atoms (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylates (e.g., phenyl methacrylate, hydroxyphenyl methacrylate, cresyl methacrylate, naphthyl methacrylate); acrylic amides, such as acrylic amide, N-alkylacrylic amides (the alkyl moiety preferably having 1 to 10 carbon atoms, such as methyl, ethyl, propyl, butyl, t-butyl, heptyl, octyl, cyclohexyl, benzyl, hydroxyethyl and benzyl), N-arylacrylic amides (the aryl moiety being preferably phenyl, tolyl, nitrophenyl, naphthyl, cyanophenyl, hydroxyphenyl and carboxyphenyl), N,N-dialkylacrylic amides (the alkyl moiety preferably having 1 to 10 carbon atoms, such as methyl, ethyl, butyl, isobutyl, ethylhexyl and cyclohexyl), N,N-arylacrylic amides (the aryl moiety being preferably a phenyl group), N-methyl-N-phenylacrylic amide, N-hydroxyethyl-N-methylacrylic amide and N-2-acetamidoethyl-N-acetylacrylic amide; methacrylic amides, such as methacrylic amide, N-alkylmethacrylic amides (the alkyl moiety preferably having 1 to 10 carbon atoms, such as methyl, ethyl, t-butyl, ethylhexyl, hydroxyethyl and cyclohexyl), N-arylmethacrylic amides (the aryl moiety being preferably phenyl, hydroxyphenyl and carboxyphenyl), N,N-dialkylmethacrylic amides (the alkyl moiety being preferably ethyl, propyl and butyl), N,N-diarylmethacrylic amides (the aryl moiety being preferably a phenyl group), N-hydroxyethyl-N-methylmethacrylic amide, N-methyl-N-phenylmethacrylic amide and N-ethyl-N-phenylmethacrylic amide; allyl compounds, such as allyl esters (e.g., allyl acetate, allyl caproate, allyl caprylate, allyl laurate, allyl palmitate, allyl stearate, allyl benzoate, allyl acetoacetate, allyl lactate) and allyl oxyethanol; vinyl ethers, such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, butylaminoethyl vinyl ether, benzyl vinyl ether, tetrahydrofurfuryl vinyl ether) and vinyl aryl ethers (e.g., vinyl phenyl ether, vinyl tolyl ether, vinyl chlorophenyl ether, vinyl-2,4-dichlorophenyl ether, vinyl naphthyl ether, vinyl anthranyl ether); vinyl esters, such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenyl butyrate, vinyl cyclohexylcarboxylate, vinyl benzoate, vinyl salicylate, vinyl chlorobenzoate, vinyl tetrachlorobenzoate and vinyl naphthoate; styrenes, such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene), alkoxystyrenes (e.g., methoxystyrene, 4-methoxy-3-methylstyrene, dimethoxystyrene), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), hydroxystyrenes (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, 4-hydroxy-3-(2-hydroxybenzyl)styrene) and carboxystyrene; crotonic acid esters, such as alkyl crotonates (e.g., butyl crotonate, hexyl crotonate, glycerine monocrotonate); dialkyl itaconates (e.g., dimethyl itaconate, diethyl itaconate, dibutyl itaconate); dialkyl esters of maleic acid or fumaric acid (e.g., dimethyl maleate, dibutyl fumarate); maleic anhydride; maleimide; acrylonitrile; methacrylonitrile; and maleylonitrile. In addition, other addition polymerizable unsaturated compounds, which are generally copolymerizable, may be included.

Of those compounds, the monomers which can increase the solubility in an alkali are preferable, and examples thereof include a carboxyl group-containing monomer such as carboxystyrene, N-(carboxyphenyl)acrylic amide and N-(carboxyphenyl)methacrylic amide, a phenolic hydroxyl group-containing monomer such as hydroxystyrene, N-(hydroxyphenyl)acrylic amide, N-(hydroxyphenyl) methacrylic amide, hydroxyphenyl acrylate and hydroxyphenyl methacrylate, and maleimide.

The proportion of those copolymerizable monomers in the resin of the present invention is preferably 50% by mole or below, more preferably 30% by mole or below, to the total constitutional repeating units.

The resin as Component (B) of the present invention wherein the constitutional repeating units of formula (Ia), (IIa) or (IIIa) are present (and the constitutional repeating units of formula (IVa), (Va) or (VIa) and the constitutional repeating units of formula (VII), (VIII) or (IX) may further be present), or the resin as Component (B) of the present invention wherein are present the constitutional repeating units having the groups of formula (Ib), (IIb) or (IIIb) (preferably, the constitutional repeating units of formula (IVb), (Vb) or (VIb)), acid decomposable group-containing constitutional repeating units (preferably, the constitutional repeating units of formula (IVa), (Va) or (VIa)) and, if desired, carboxyl group-containing constitutional repeating units (preferably, the constitutional repeating units of formula (VII), (VIII) or (IX)) and other polymerizable monomers can be synthesized by radical, cationic or anionic polymerization of unsaturated monomers having the structures corresponding to the aforesaid constitutional repeating units.

In more detail, the constituent monomers are mixed on the basis of the preferable composition as mentioned above and dissolved in an appropriate solvent so as to have a monomer concentration of about 10–40% by weight, and the polymerization thereof is carried out by adding thereto a polymerization catalyst and, if necessary, with heating.

The weight average molecular weight (Mw) of the resin as Component (B) of the present invention is at least 2,000, preferably from 3,000 to 1,000,000, more preferably from 5,000 to 200,000, most preferably from 20,000 to 100,000, on a polystyrene basis. The higher the molecular weight of the resin is, the better the heat resistance becomes but the lower the developability becomes. Therefore, the resin is controlled so as to have a molecular weight in a desirable range for keeping an adequate balance between those properties. The dispersion degree (Mw/Mn) is preferably from 1.0 to 5.0, and more preferably from 1.0 to 3.0. The smaller the dispersion degree, the better the heat resistance and the image quality (including a pattern profile and a defocus latitude).

The proportion of the foregoing resin in the photosensitive composition according to the present invention is generally from 50 to 99.7% by weight, preferably from 70 to 99% by weight, to the total solids.

[5] Photo-acid generators as component (A)

The photo-acid generator which can be used in the present invention is a compound capable of generating an acid upon irradiation with actinic rays or radiations.

The compounds which can decompose to generate acids when irradiated with actinic rays or radiations can be selected properly from photoinitiators for photo cationic polymerization, photoinitiators for photo radical polymerization, photodecolorizers for dyes, photo discoloring agents,, compounds known to generate acids upon irradiation with light (ultraviolet rays having wavelengths of 400 to 200 nm, and far ultraviolet rays, particularly preferably g-line, h-line, i-line and KrF excimer laser beam), ArF excimer laser beam, electron beam, X-ray, molecular beam or ion beam, which are used for microresist, or mixtures of two or more of those agents.

More specifically, the photo-acid generators usable in the present invention include the diazonium salts described, e.g., in S. I. Schlesinger, *Photogr. Sci. Eng.*, 18, 387 (1974), and T. S. Bal et al., *Polymer,* 21, 423 (1980); onium salts, such as the ammonium salts described, e.g., in U.S. Pat. Nos. 4,069,055, 4,069,056 and U.S. Pat. No. Re. 27,992, and Japanese Patent Application No. 03-140140, the phosphonium salts described, e.g., in D. C. Necker et al., *Macromolecules,* 17, 2468 (1984), C. S. Wen et al., *Teh. Proc. Conf. Rad. Curing ASIA,* p. 478, Tokyo (October 1988), and U.S. Pat. Nos. 4,069,055 and 4,069,056, the iodonium salts described, e.g., in J. V. Crivello et al., *Macromolecules,* 10(6), 1307 (1977), *Chem. & Eng. News,* November 28, p. 31 (1988), European Patent 0,104,143, U.S. Pat. Nos. 339,049 and 410,210, JP-A-2-150848 and JP-A-2-296514, the sulfonium salts described, e.g., in J. V. Crivello et al., *Polymer J.,* 17, 73 (1985), J. V. Crivello et al., *J. Org. Chem.,* 43, 3055 (1978), W. R. Watt et al., *J. Polymer Sci.,* Polymer Chem. Ed., 22, 1789 (1984), J. V. Crivello et al., *Polymer Bull.,* 14, 279 (1985), J. V. Crivello et al., *Macromolecules,* 14(5), 1141 (1981), J. V. Crivello et al., *J. Polymer Sci.,* Polymer Chem. Ed., 17, 2877 (1979), European Patents Nos. 0,370,693, 3,902,114, 0,233,567, 0,297, 443 and 0,297,422, U.S. Pat. Nos. 4,933,377, 161,811, 410,201, 339,049, 4,760,013, 4,734,444 and 2,833,827, and German Patents 2,904,626, 3,604,580 and 3,604,581, JP-A-7-28237 and JP-A-8-27102, the selenonium salts described, e.g., in J. V. Crivello et al., *Macromolecules*, 10(6), 1307 (1977), and J. V. Crivello et al., *J. Polymer Sci.*, Polymer Chem. Ed., 17, 1047 (1979), and the arsonium salts described, e.g., in C. S. Wen et al., *Teh. Proc. Conf. Rad. Curing ASIA*, p. 478, Tokyo (October 1988); the organic halogeno-compounds described, e.g., in U.S. Pat. No. 3,905, 815, JP-B-46-4605 (The term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; the organometallic compounds/organic halides described, e.g., in K. Meier et al., *J. Rad. Curing*, 13(4), 26 (1986), T. P. Gill et al., *Inorg. Chem.*, 19, 3007 (1980), D. Astruc, *Acc. Chem. Res.*, 19(12), 377 (1896), and JP-A-2-161445; the photo-acid generators having o-nitrobenzyl type protective groups described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patents 0,290,750, 0,046,083, 0,156, 535, 0,271,851 and 0,388,343, U.S. Pat. Nos. 3,901,710 and 4,181,531, JP-A-60-198538 and JP-A-53-133022; the compounds generating sulfonic acids by photolysis, the representatives of which are iminosulfonates and so on, as described, e.g., in M. Tunooka et al., *Polymer Preprints Japan*, 35(8), G. Berner et al., *J. Rad. Curing*, 13(4), W. J. Mijs et al., *Coating Technol.*, 55(697), 45(1983), Akzo, H. Adachi et al., *Polymer Preprints Japan*, 37(3), European Patents 0,199,672, 0,084,515, 0,044,115 and 0,101,122, U.S. Pat. Nos. 618,564, 4,371,605 and 4,431,774, JP-A-64-18143, JP-A-2-245756 and Japanese Patent Application No. 3-140109: the disulfone compounds described, e.g., in JP-A-61-166544 and JP-A-2-71270; and the diazoketosulfone and diazodisulfone compounds described, e.g., in JP-A-3-103854, JP-A-3-103856 and JP-A-4-210960.

In addition, the polymers having the main chain or side chains into which those photo-acid-generating groups or compounds are introduced, such as the compounds described, e.g., in M. E. Woodhouse et al., *J. Am. Chem. Soc.*, 104, 5586 (1982), S. P. Pappas et al., *J. Imaging Sci.*, 30(5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, can be employed.

Further, the compounds capable of generating acids under light described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 0,126,712, can also be employed.

Of the above-recited compounds which can decompose upon irradiation with actinic rays or radiation to generate acids, the compounds described below in detail are used to particular advantage.

(1) A trihalomethyl-substituted oxazole compound of the following formula (PAG1), or a trihalomethyl-substituted s-triazine compound of the following formula (PAG2):

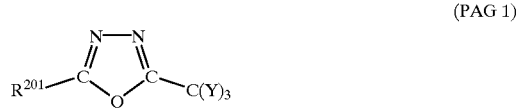

(PAG 1)

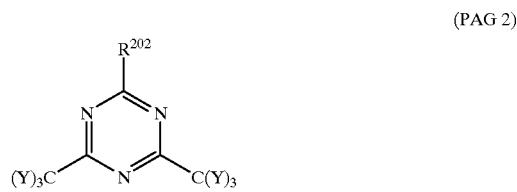

(PAG 2)

wherein $R^{201}$ is a substituted or unsubstituted aryl or alkenyl group; $R^{202}$ is a substituted or unsubstituted aryl, alkenyl or alkyl group, or $-C(Y)_3$; and Y is a chlorine or bromine atom.

Examples of such compounds are illustrated below, but these examples should not be construed as limiting the scope of the present invention.

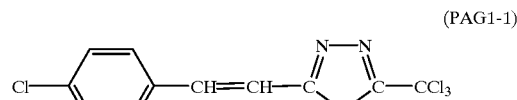

(PAG1-1)

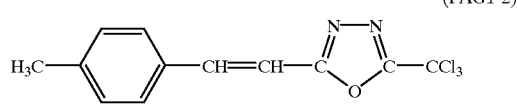

(PAG1-2)

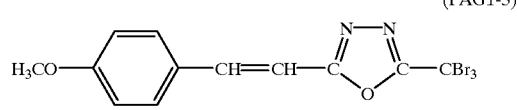

(PAG1-3)

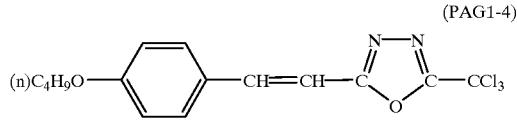

(PAG1-4)

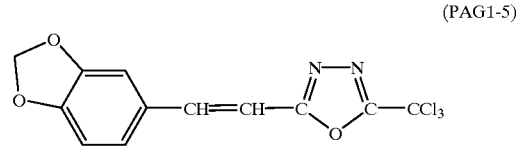

(PAG1-5)

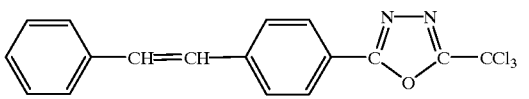

(PAG1-6)

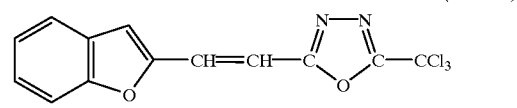

(PAG1-7)

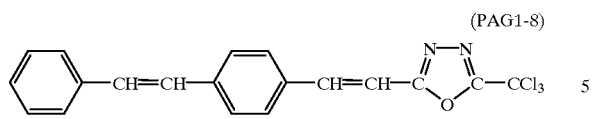
(PAG1-8)
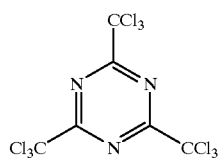
(PAG2-1)
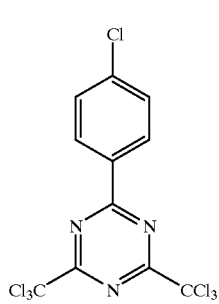
(PAG2-2)
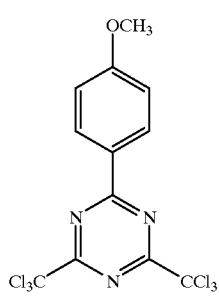
(PAG2-3)
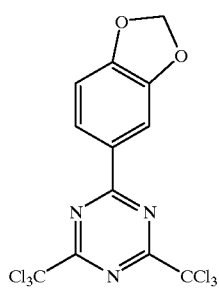
(PAG2-4)
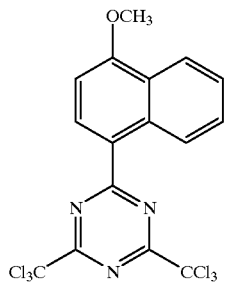
(PAG2-5)
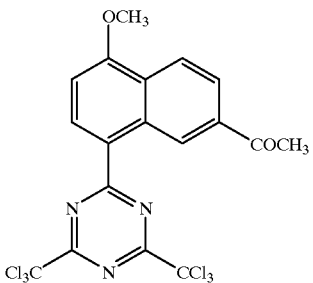
(PAG2-6)
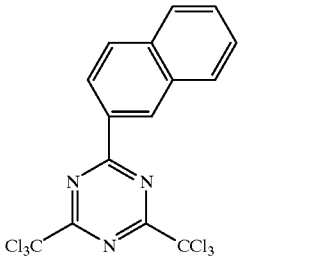
(PAG2-7)
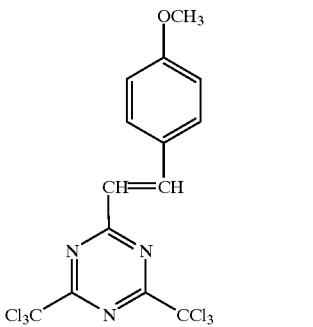
(PAG2-8)
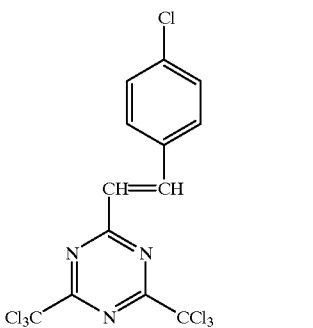
(PAG2-9)

-continued

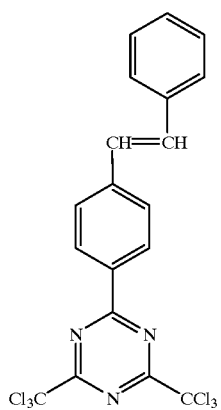
(PAG2-10)

(2) An iodonium salt of the following formula (PAG3), or a sulfonium salt of the following formula (PAG4):

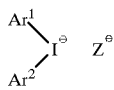
(PAG 3)

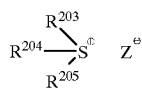
(PAG 4)

In the above formulae, $Ar^1$ and $Ar^2$ each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative thereof. Preferred substituents for the aryl group include alkoxy groups having 1 to 8 carbon atoms, alkyl groups having 1 to 8 carbon atoms, cycloalkyl groups, nitro, carboxyl, mercapto, hydroxy, and halogen atoms. Preferred substituents for the alkyl group include alkoxy groups having 1 to 8 carbon atoms, carboxyl, and alkoxycarbonyl groups.

$Z^-$ represents a counter anion. Examples thereof include perfluoroalkanesulfonate anions, e.g., $BF_4^-$, $AsF_6^-$, $PF_6^-$, $SbF_6^-$, $SiF_6^{2-}$, $ClO_4^-$, and $CF_3SO_3^-$, a pentafluorobenzenesulfonate anion, fused-ring aromatic sulfonate anions, e.g., a naphthalene-1-sulfonate anion, an anthraquinonesulfonate anion, and dyes containing a sulfonate group. However, the counter anion should not be construed as being limited to these examples.

Two of $R^{203}$, $R^{204}$, and $R^{205}$ may be bonded to each other through a single bond or substituent thereof. $Ar^1$ and $Ar^2$ may be bonded to each other likewise.

Specific examples thereof are given below, but the compounds represented by general formula (PAG3) or (PAG4) should not be construed as being limited thereto.

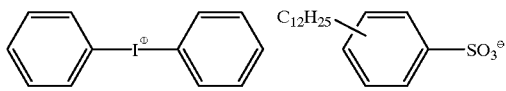
(PAG3-1)

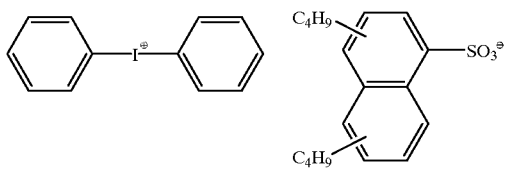
(PAG3-2)

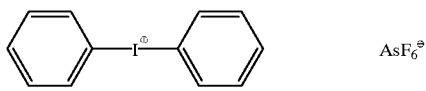
(PAG3-3)

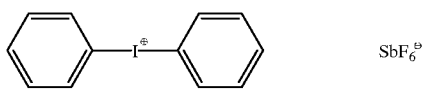
(PAG3-4)

(PAG3-5)

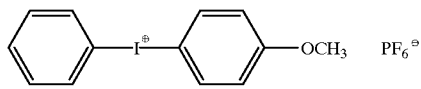 (PAG3-6)
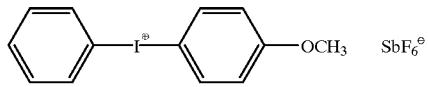 (PAG3-7)
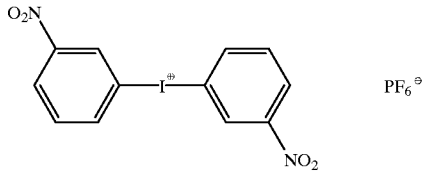 (PAG3-8)
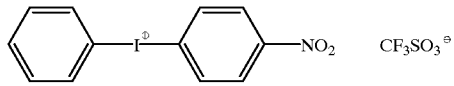 (PAG3-9)
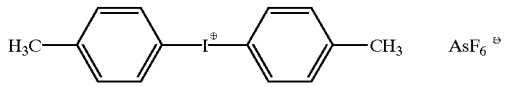 (PAG3-10)
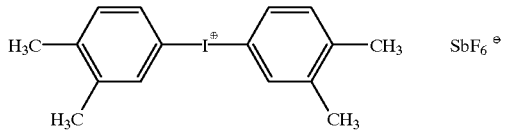 (PAG3-11)
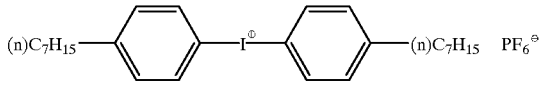 (PAG3-12)
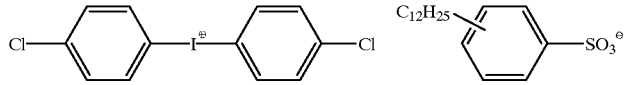 (PAG3-13)
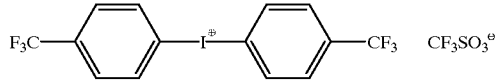 (PAG3-14)
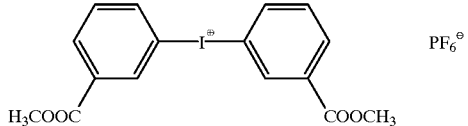 (PAG3-15)
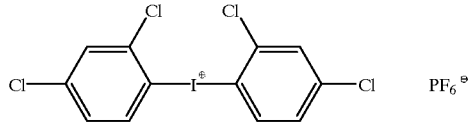 (PAG3-16)

-continued
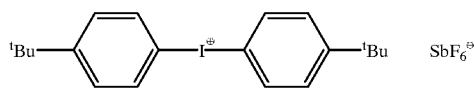 (PAG3-17)
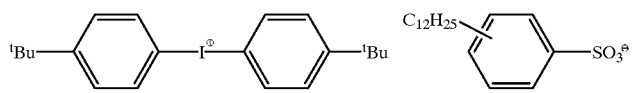 (PAG3-18)
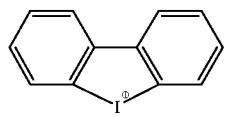 (PAG3-19)
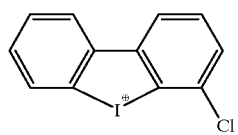 (PAG3-20)
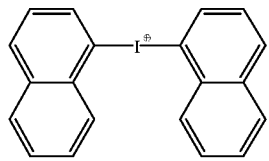 (PAG3-21)
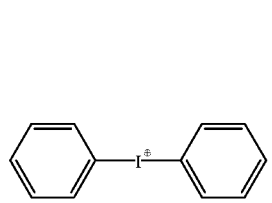 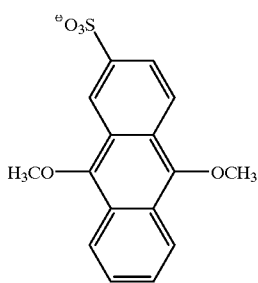 (PAG3-22)
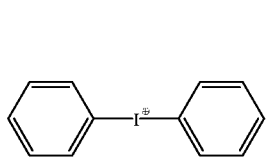 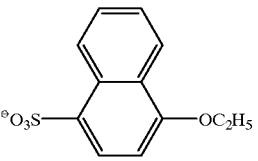 (PAG3-23)
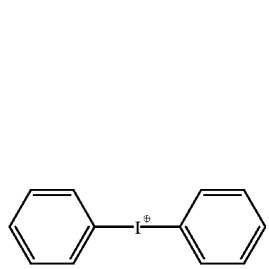 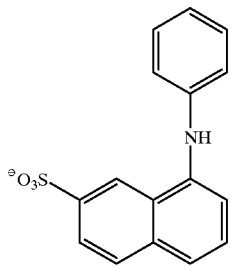 (PAG3-24)

-continued
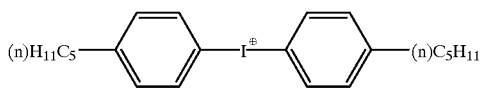
(PAG3-25)
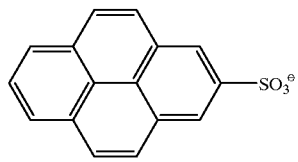
(PAG3-26)
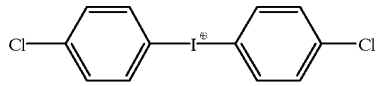
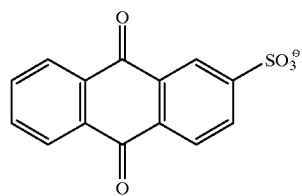
(PAG3-27)
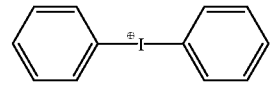
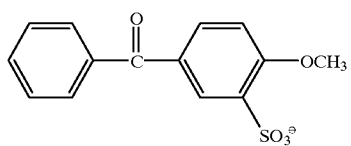
(PAG4-1)
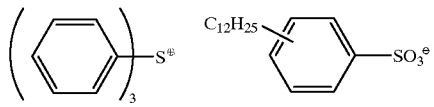
(PAG4-2)
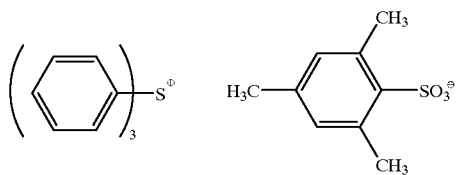
(PAG4-3)
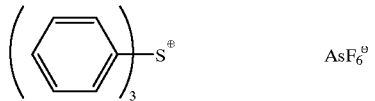
(PAG4-4)
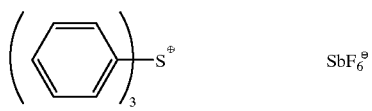
(PAG4-5)
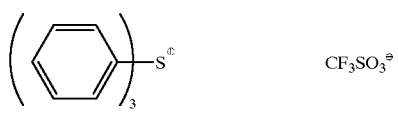

-continued
(PAG4-6)
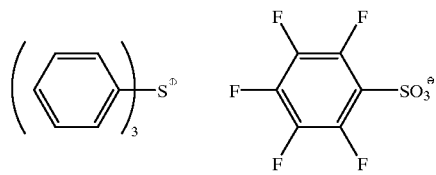
(PAG4-7)
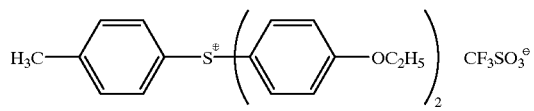
(PAG4-8)
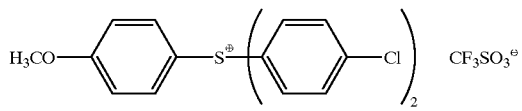
(PAG4-9)
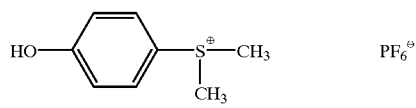
(PAG4-10)
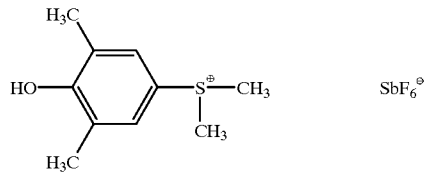
(PAG4-11)
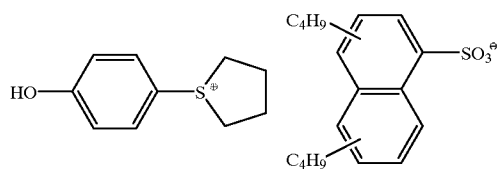
(PAG4-12)
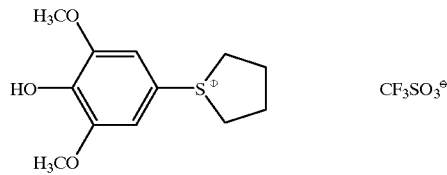
(PAG4-13)
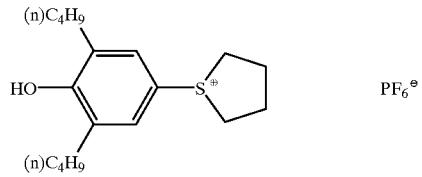
(PAG4-14)

-continued
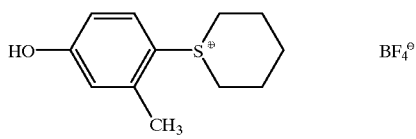 (PAG4-15)
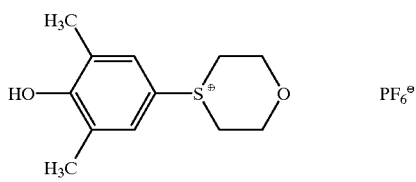 (PAG4-16)
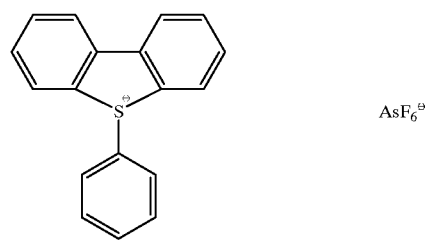 (PAG4-17)
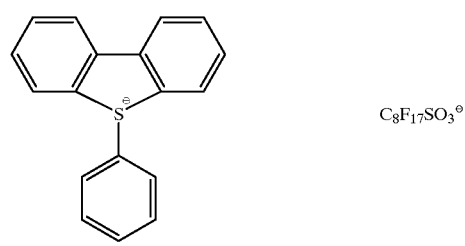 (PAG4-18)
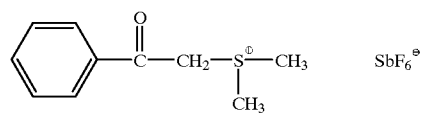 (PAG4-19)
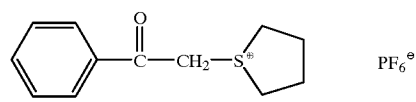 (PAG4-20)
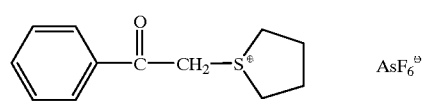 (PAG4-21)
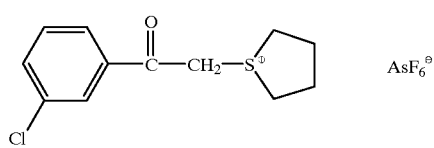 (PAG4-22)
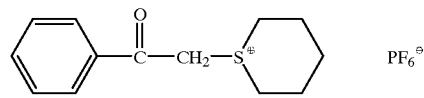 (PAG4-23)

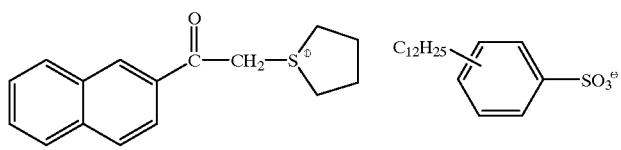
(PAG4-24)
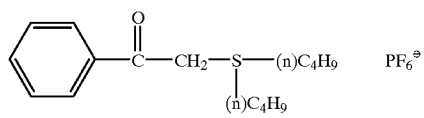
(PAG4-25)
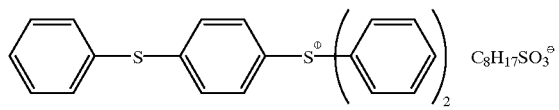
(PAG4-26)
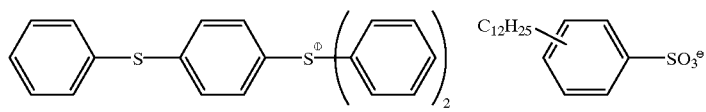
(PAG4-27)
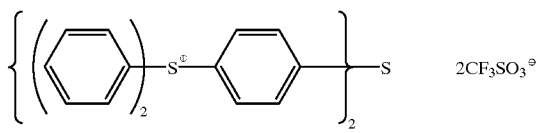
(PAG4-28)
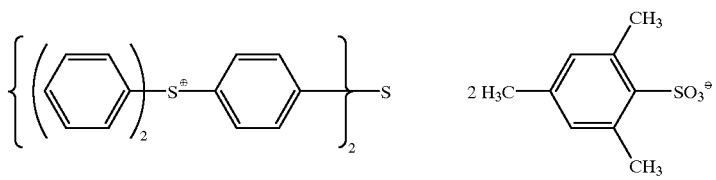
(PAG4-29)
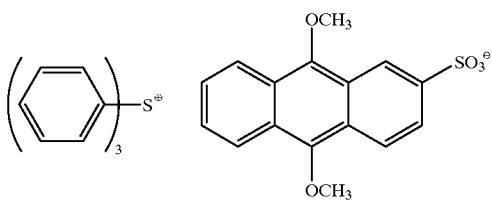
(PAG4-30)
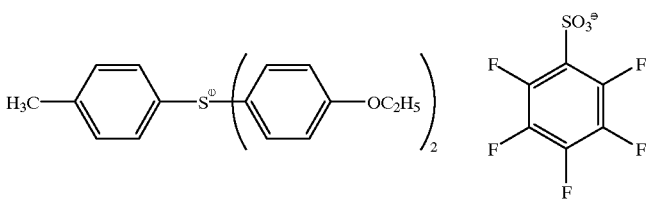
(PAG4-31)

-continued

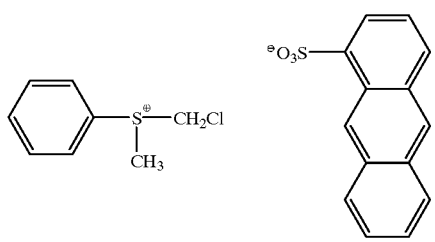

(PAG4-32)

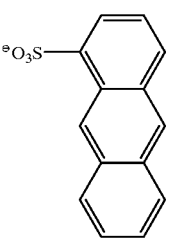

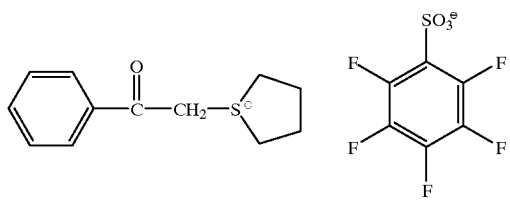

(PAG4-33)

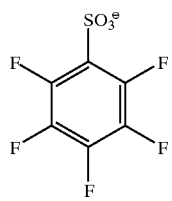

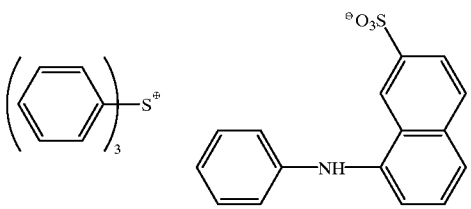

(PAG4-34)

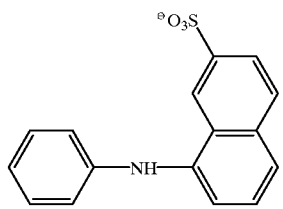

The above-illustrated onium salts of formulae (PAG3) and (PAG4) are known compounds, and can be prepared using the methods described, e.g., in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) A disulfone compound of the following formula (PAG5) or an iminosulfonate compound of the following formula (PAG6):

(PAG 5)

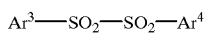
$Ar^3-SO_2-SO_2-Ar^4$ (PAG 6)

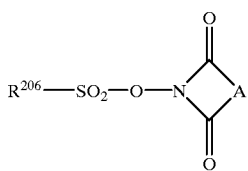

In the above formulae, $Ar^3$ and $Ar^4$ are each a substituted or unsubstituted aryl group; $R^{206}$ is a substituted or unsubstituted alkyl or aryl group; and A is a substituted or unsubstituted alkylene, alkenylene or arylene group.

Examples of such compounds are illustrated below, but these examples should not be construed as limiting the scope of the present invention.

(PAG5-1)

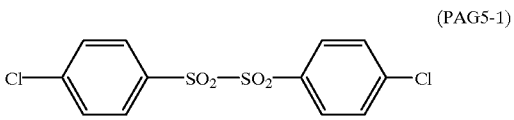

(PAG5-2)

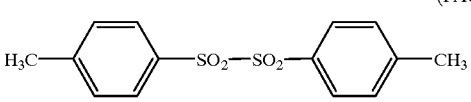

(PAG5-3)

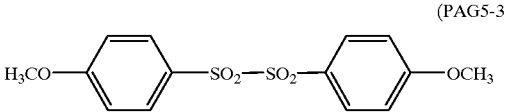

(PAG5-4)

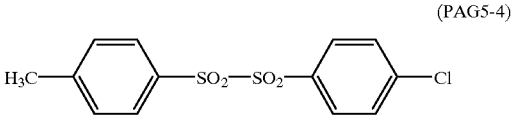

(PAG5-5)

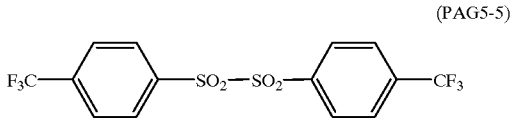

(PAG5-6)

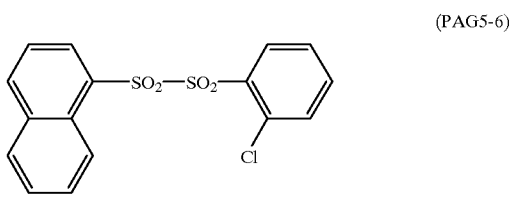

(PAG5-7)
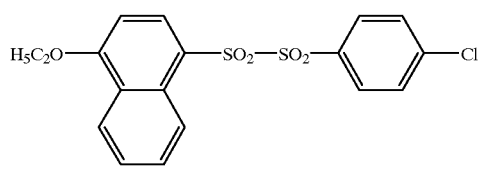
(PAG5-8)
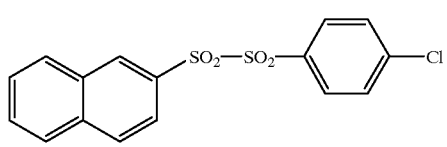
(PAG5-9)
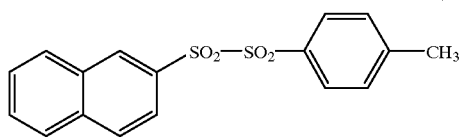
(PAG5-10)
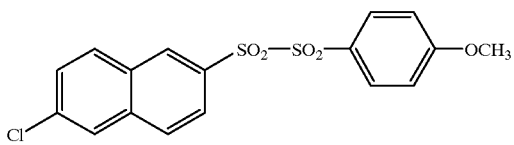
(PAG5-11)
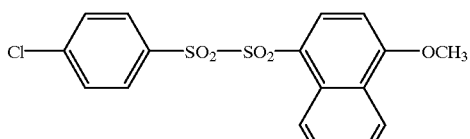
(PAG5-12)
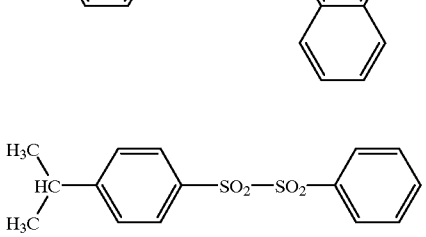
(PAG5-13)
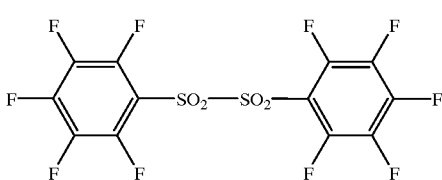
(PAG5-14)
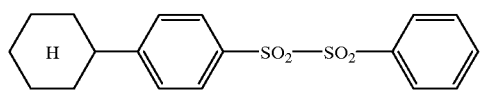
(PAG5-15)
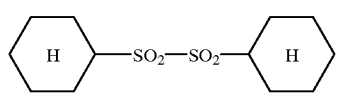
(PAG6-1)
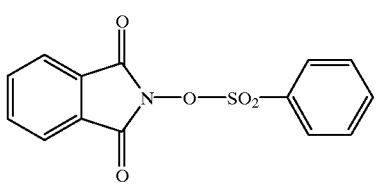
(PAG6-2)
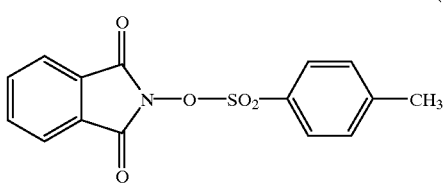
(PAG6-3)
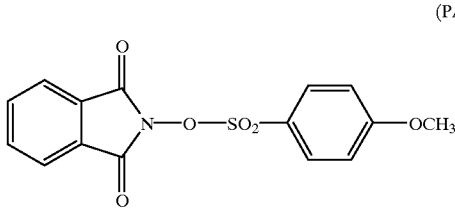
(PAG6-4)
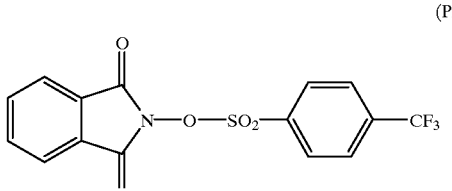
(PAG6-5)
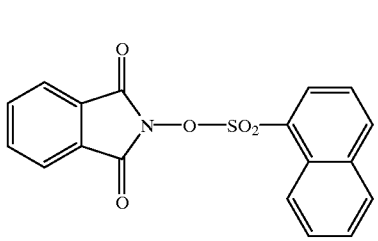
(PAG6-6)
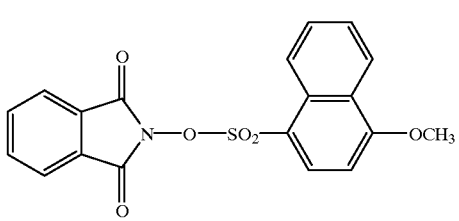
(PAG6-7)
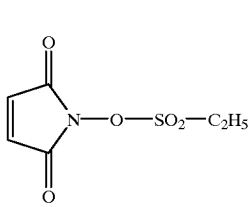

(PAG6-8) 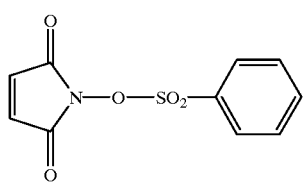

(PAG6-9) 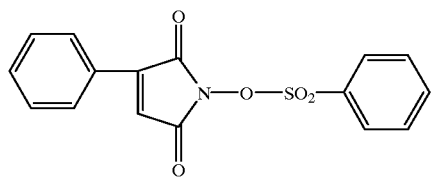

(PAG6-10) 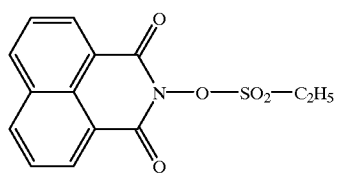

(PAG6-11) 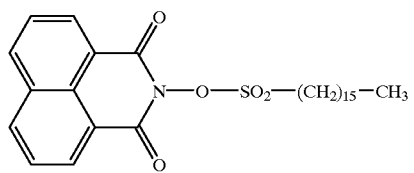

(PAG6-12) 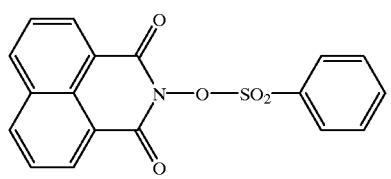

(PAG6-13) 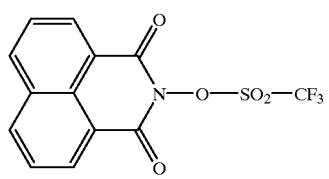

(PAG6-14) 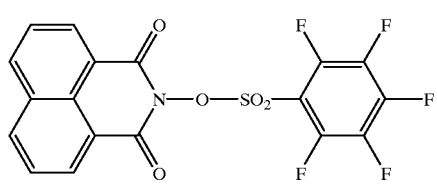

(PAG6-15) 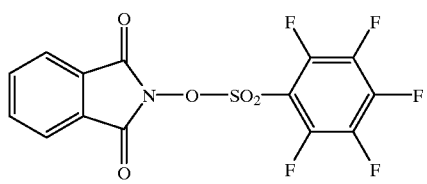

(PAG6-16) 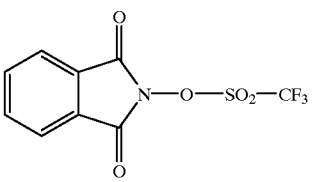

(PAG6-17) 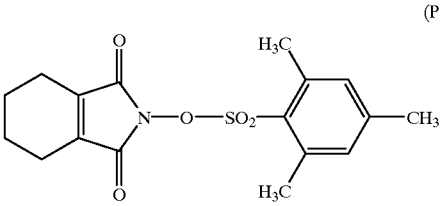

(PAG6-18) 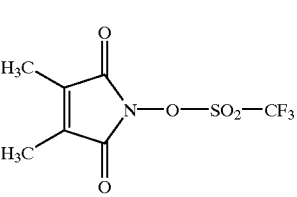

(PAG6-19) 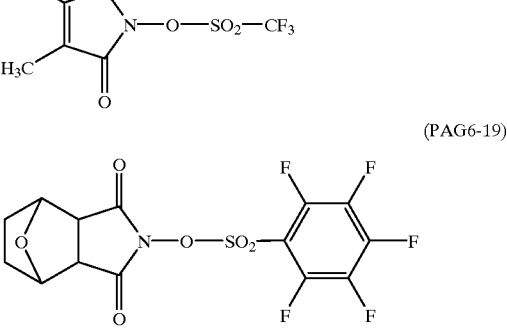

Those compounds which can decompose upon irradiation with actinic rays or radiation to generate acids (photo-acid generators) are used in a proportion of generally from 0.001 to 40% by weight, preferably from 0.01 to 20% by weight, more preferably from 0.1 to 5% by weight, to the total weight of the photosensitive composition (excluding the weight of a coating solvent). When the compounds capable of decomposing upon irradiation with actinic rays or radiation to generate acids are used in a proportion less than 0.001% by weight, the sensitivity becomes low; while, when the proportion thereof is higher than 40% by weight, the absorption of light by the resulting resist is too great, thereby causing undesirable phenomena, such as deterioration of pattern profile and narrowing of process (particularly bake) margin.

[6] Other Components

The present positive working photosensitive composition can further contain acid-decomposable dissolution inhibiting compounds, dyes, plasticizers, surfactants, spectral sensitizers, organic basic compounds, compounds which can promote the dissolution in a developer, and so on, if needed.

For the present positive working photosensitive composition, it is favorable to contain acid-decomposable dissolution inhibiting compounds. This is because such compounds can increase alkali-solubility discrimination between exposed and unexposed areas to heighten the resolution.

Examples of the acid-decomposable dissolution inhibiting compound include a low molecular weight compound having a molecular weight of 3,000 or below and at least one acid-decomposable group represented by the foregoing formula (X) or (XI) per molecule. In order not to lower the transmittance at wavelengths of 220 nm or below, alicyclic compounds such as the cholic acid derivatives described in *Proceeding of SPIE*, 2724, 355 (1996), or aliphatic compounds are preferred. When such an acid-decomposable dissolution inhibiting compound is used in the present invention, the proportion thereof is from 3 to 50% by weight, preferably from 5 to 40% by weight, more preferably from 10 to 35% by weight, to the total weight of the photosensitive composition (excluding the weight of a coating solvent).

The compounds capable of promoting the dissolution in a developer are low molecular weight compounds having a molecular weight of 1,000 or below and at least two phenolic OH groups or at least one carboxyl group per molecule. As for the carboxyl group-containing compounds, alicyclic or aliphatic compounds are desirable for the same reason as mentioned above.

It is desirable that such dissolution promoting compounds be added in a proportion of from 2 to 50% by weight, preferably from 5 to 30% by weight, to the resin according to the present invention. If these compounds are added in a proportion greater than 50% by weight, new defects such as deterioration in the development residue and the pattern deformation upon development are caused.

The phenolic compounds having molecular weight of not higher than 1,000 can be prepared with ease with reference to the methods described in, e.g., JP-A-4-122938, JP-A-2-28531, U.S. Pat. No. 4,916,210 and European Patent 0,219, 294. Examples of such a phenolic compound as mentioned above include the compounds recited below, but these examples are not to be considered as limiting on the scope of compounds usable in the present invention.

Specifically, the phenolic compounds usable in the present invention include resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensed resins, phloroglucide, 2,4,2',4'-biphenyltetrol, 4,4'-thiobis(1, 3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris (hydroxyphenyl)propane, 1,1,2-tris(3,5-dimethyl-4-hydroxyphenyl)propane, 2,2,5,5-tetrakis(4-hydroxyphenyl) hexane, 1,2-tetrakis(4-hydroxyphenyl)ethane, 1,1,3-tris (hydroxyphenyl)butane, para[α,α,α',α'-tetrakis(4-hydroxyphenyl)]xylene and the like.

The organic basic compounds which can be favorably used in the present invention are compounds having stronger basicity than phenol. Of these compounds, nitrogen-containing basic compounds are preferred.

Preferred examples of the chemical environment thereof include the following structures (A) to (E).

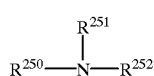

(A)

In formula (A), $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

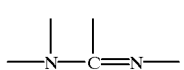

(B)

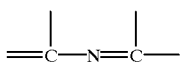

(C)

(D)

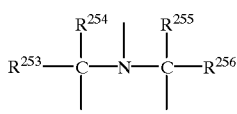

(E)

(In formula (E), $R^{253}$, $R^{254}$, $R^{255}$, and $R^{256}$ may be the same or different and each represents an alkyl group having 1 to 6 carbon atoms.)

Preferred organic basic compounds are nitrogen-containing basic compounds having, per molecule, two or more nitrogen atoms having different chemical environments. Especially preferred are compounds containing both at least one substituted or unsubstituted amino group and at least one nitrogen-containing ring structure and compounds having at least one alkylamino group. Examples of such preferred compounds include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of especially preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the basic compounds usable in the present invention should not be construed as being limited to the compounds recited above.

Those nitrogen-containing basic compounds can be used alone or as a mixture of two or more thereof. The amount of nitrogen-containing basic compound(s) used is generally from 0.001 to 10 parts by weight, preferably from 0.01 to 5 parts by weight, per 100 parts by weight of the photosensitive composition (excluding a solvent). If the added amount is less than 0.001 parts by weight, any effects to be provided by the addition cannot be exhibited, and if it exceeds 10 parts by weight, there is a tendency of causing the lowering of the sensitivity and deterioration of the developability in unexposed areas.

The suitable dyes are oil dyes and basic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd., Japan), crystal violet (CI 42555), methyl violet (CI 42535), rhodamine B (CI 45170B), malachite green (CI 42000), and methylene blue (CI 52015).

Further, the spectral sensitizers as recited below can be added for the purpose of elevating the rate of acid generation upon exposure. Examples of spectral sensitizers suitable for use in the present invention include benzophenone, p,p'-tetramethyldiaminobenzophenone, p,p'-tetraethylethylamino-benzophenone, 2-chlorothioxanthone, anthrone, 9-ethoxyanthracene, anthracene, pyrene, perylene, phenothiazine, benzil, acridine orange, benzoflavin, cetoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the spectral sensitizers usable in the present invention should not be construed as being limited to these examples.

In addition, those spectral sensitizers can be used as an absorbent for far ultraviolet rays of a light source. Such absorbents can reduce the reflected light from a substrate to lessen the influence of multiple reflection inside the resist film; as a result, an effect on standing wave improvement can be produced.

All the ingredients as mentioned above are dissolved in a solvent to prepare the present photosensitive composition, and applied to a support. Examples of the solvent used therein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethylether acetate, propylene glycol monomethyl ether, propylene glycol monomethylether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used alone or as a mixture of two or more thereof.

Also, a surfactant can be added to the solvent as recited above. Examples of such a surfactant include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene-sorbitan fatty acid esters (e.g., polyoxyethylenesorbitan monolaurate, polyoxyethylenesorbitan monopalmitate, polyoxyethylenesorbitan monostearate, polyoxyethylene-sorbitan trioleate, polyoxyethylenesorbitan tristearate); fluorine-containing surfactants, such as Eftop EF301, EF303 and EF352 (commercial names, products of Shin-Akita Kasei K.K.), Megafac F171 and F173 (commercial names, products of Dai-Nippon Ink & Chemicals, Inc.), Florade FC430 and FC431 (commercial names, products of Sumitomo 3M Co., Ltd.), Asahi Guard AG710, Surflon S-382, SC101, SC102, SC103, SC104, SC105 and SC106 (commercial names, products of Asahi Glass Company, Ltd.); organosiloxane polymers, such as KP341 (produced by Shin-Etsu Chemical Co., Ltd.); and acrylic or methacrylic acid (co)polymers, such as Polyflow No. 75 and No. 95 (commercial names, products of Kyoeisha Yushi Kagaku Kogyo K.K.). The amount of those surfactants added is generally not greater than 2 parts by weight, preferably not greater than 1 parts by weight, per 100 parts by weight of the total solids in the composition.

Those surfactants may be added alone or as a mixture of two or more thereof.

The aforementioned photosensitive composition is coated on a substrate (e.g., silicon/silicon dioxide coating) as employed for the production of precise integrated circuit elements by the use of an appropriate coating means, e.g., a spinner and a coater, exposed to light via a desired mask, baked and then developed to provide a satisfactory resist pattern. Herein, it is desirable that the light used for the exposure be far ultraviolet rays having wavelengths of 250 nm or shorter, preferably 220 nm or shorter. More specifically, KrF excimer laser (248 nm), ArF excimer laser (193 nm), $F_2$ excimer laser (157 nm), X-ray and electron beams can be employed.

The developer usable for the photosensitive composition of the present invention is an alkaline aqueous solution containing an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcohol amine such as dimethylethanolamine or triethanolamine, a quaternary ammonium salt such as tetramethylammonium hydroxide or tetraethylammonium hydroxide, or a cyclic amine such as pyrrole or piperidine.

To such an alkaline aqueous solution, an alcohol and a surfactant can be added in appropriate amounts.

EXAMPLES

The present invention will be illustrated below in more detail by reference to the following examples, but the scope of the invention should not be construed as being limited by these examples.

Synthesis Example 1

(Synthesis of Monomer corresponding to Constitutional Repeating Unit (a1))

In 200 ml of DMF, 9.8 g (0.10 mole) of maleic anhydride and 15.2 g (0.10 mole) of 1-adamantanol were dissolved. To this solution, a solution of 12.3 g (0.10 mole) of N,N-dimethylaminopyridine in 50 ml of DMF was added with stirring at room temperature. Further, the stirring was continued for 5 hours at 60° C. After cooling, the reaction solution was neutralized with hydrochloric acid, and poured into 3 liter of ion exchanged water with vigorous stirring. The thus deposited viscous solid was washed with water, and purified by column chromatography (packing: silica gel; eluate: hexane/ethyl acetate=3/1) to yield 12.6 g of a white powder. By the NMR measurement, this powder was identified as the monomer corresponding to the constitutional repeating Unit (a1).

Synthesis Example 2

(Synthesis of Monomer corresponding to Constitutional Repeating Unit (a3))

A white powder in an amount of 14.2 g was obtained in the same manner as in Synthesis Example 1 except that 16.6 g (0.10 mole) of 1-adamantane methanol was used in place of 1-adamantanol. By the NMR measurement, this powder was identified as the monomer corresponding to the constitutional repeating Unit (a3).

Synthesis Example 3

(Synthesis of Monomer corresponding to Constitutional Repeating Unit (a5))

A white powder in an amount of 12.7 g was obtained in the same manner as in Synthesis Example 1, except that 16.6 g (0.10 mole) of 2-methyl-2-adamantanol was used in place of 1-adamantanol. By the NMR measurement, this powder was identified as the monomer corresponding to the constitutional repeating Unit (a5).

Synthesis Example 4

(Synthesis of Monomer corresponding to Constitutional Repeating Unit (a7))

A light brown powder in an amount of 16.4 g was obtained in the same manner as in Synthesis Example 1, except that 15.1 g (0.10 mole) of 1-aminoadamantane was used in place of 1-adamantanol. By the NMR measurement, this powder was identified as the monomer corresponding to the constitutional repeating Unit (a7).

Synthesis Example 5

(Synthesis of Monomer corresponding to Constitutional Repeating Unit (a30))

In 200 ml of DMF, 11.2 g (0.10 mole) of itaconic anhydride and 16.6 g (0.10 mole) of 1-adamantane methanol were dissolved. To this solution, a solution of 12.3 g (0.10 mole) of N,N-dimethylaminopyridine in 50 ml of DMF was added with stirring at room temperature. Further, the stirring was continued for 5 hours at 60° C. After cooling, the reaction solution was neutralized with hydrochloric acid, and poured into 3 liter of ion exchanged water with vigorous stirring. The thus deposited viscous solid was washed with water, and purified by column chromatography (packing: silica gel; eluate: hexane/ethyl acetate=3/1) to yield 15.2 g of a white powder. By the NMR measurement, this powder was identified as the monomer corresponding to the constitutional repeating Unit (a30).

Synthesis Example 6

(Synthesis of Monomer corresponding to Constitutional Repeating Unit (a15))

In 200 ml of THF, 12.5 g (0.050 mole) of the monomer obtained in Synthesis Example 1 (corresponding to the constitutional repeating Unit (a1)) and 6.3 g (0.075 mole) of dehydropyran were dissolved. To this solution, 0.05 g of 2-ethylhexyl phosphate was added as a catalyst. The resulting solution was stirred for 8 hours as the temperature was kept at 50° C. by heating. The catalyst was neutralized with triethylamine, and then the reaction product was purified by vacuum distillation. Thus, 11.7 g of a colorless liquid was obtained. By the NMR measurement, this liquid was identified as the monomer corresponding to the constitutional repeating Unit (a15).

Synthesis Example 7

(Synthesis of Monomer corresponding to Constitutional Repeating Unit (a47))

In 200 ml of THF, 13.9 g (0.050 mole) of the monomer obtained in Synthesis Example 5 (corresponding to the constitutional repeating Unit (a30)) and 5.4 g (0.075 mole) of ethyl vinyl ether were dissolved. To this solution, 0.05 g of 2-ethylhexyl phosphate was added as a catalyst. The resulting solution was stirred for 8 hours as the temperature was kept at 50° C. by heating. The catalyst was neutralized with triethylamine, and then the reaction product was purified by vacuum distillation. Thus, 12.2 g of a colorless liquid was obtained. By the NMR measurement, this liquid was identified as the monomer corresponding to the constitutional repeating Unit (a47).

Synthesis Example 8

(Synthesis of Monomer corresponding to Constitutional Repeating Unit (b7))

In 200 ml of THF, 15.4 g (0.10 mole) of methacrylic anhydride and 8.6 g (0.10 mole) of 3-hydroxy-3-methylbutenol were dissolved. To this solution, a solution of 12.3 g (0.10 mole) of N,N-dimethylaminopyridine in 50 ml of DMF was added with stirring at room temperature. Further, the resulting solution was heated with stirring under reflux for 5 hours. After cooling, the reaction solution was poured into 3 liter of ion exchanged water, and extracted with 300 ml of ethyl acetate. The ethyl acetate solution was washed with water, dried over magnesium sulfate, and then concentrated under reduced pressure. The concentrate obtained was purified by vacuum distillation to yield 11.4 g of a colorless liquid. By the NMR measurement, this liquid was identified as the monomer corresponding to the constitutional repeating Unit (b7).

Synthesis Example 9

(Synthesis of Monomer corresponding to Constitutional Repeating Unit (b15))

In 200 ml of THF, 17.2 g (0.20 mole) of methacrylic acid and 25.2 g (0.30 mole) of dehydropyran were dissolved. To this solution, 0.1 g of 2-ethylhexyl phosphate was added as a catalyst. The resulting solution was stirred for 8 hours as the temperature was kept at 50° C. by heating. The catalyst was neutralized with triethylamine, and then the reaction product was purified by vacuum distillation. Thus, 26.5 g of a colorless liquid was obtained. By the NMR measurement, this liquid was identified as the monomer corresponding to the constitutional repeating Unit (b15).

Synthesis Example 10

(Synthesis of Monomer corresponding to Constitutional Repeating Unit (b18))

A colorless liquid in an amount of 24.5 g was obtained in the same manner as in Synthesis Example 9, except that 21.6 g (0.30 mole) of ethyl vinyl ether was used in place of dehydropyran. By the NMR measurement, this liquid was identified as the monomer corresponding to the constitutional repeating Unit (b18).

Synthesis Example 11

(Synthesis of Monomer corresponding to Constitutional Repeating Unit (b20))

In 200 ml of DMAc, 17.2 g (0.20 mole) of methacrylic acid and 24.9 g (0.20 mole) of 2-methoxyethoxymethyl chloride were dissolved. To this solution, 20.3 g of triethylamine was added, and stirred for 7 hours as the temperature was kept at 90° C. by heating. After cooling, the reaction solution was poured into 3 liter of ion exchanged water with vigorous stirring, and extracted with 300 ml of ethyl acetate. The ethyl acetate solution was washed with water, dried over magnesium sulfate, and then concentrated under reduced pressure. The concentrate obtained was purified by column chromatography (packing: silica gel; eluate: hexane/ethyl acetate=3/1) to yield 13.4 g of a colorless liquid. By the NMR measurement, this liquid was identified as the monomer corresponding to the constitutional repeating Unit (b20).

Synthesis Example 12

(Synthesis of Resin constituted of Units (a1), Units (b1) and Acrylonitrile Units)

To 12.5 g (0.050 mole) of the monomer prepared in Synthesis Example 1 (corresponding to the constitutional repeating unit (a1)), 2.84 g (0.020 mole) of t-butyl methacrylate and 1.59 g (0.030 mole) of acrylonitrile were added, and dissolved in 60 ml of 1-methoxy-2-propanol. To this solution, 100 mg of a polymerization initiator, 2,2'-azobis (2,4-dimethylvaleronitrile) (V-65, commercial name, a product of Wako Pure Chemical Industries, Ltd.), was added at 70° C. with stirring in a stream of nitrogen. Further, two 100 mg portions of the same initiator were added thereto after a 2-hour lapse and a 4-hour lapse from the beginning of reaction. The reaction was continued for additional 3 hours. Then, the resulting solution was heated up to 90° C., and stirred for 1 hour. After it was cooled, the reaction solution was poured into 1 liter of a 1:1 mixture of ion exchanged water and methanol with vigorous stirring to deposit a polymer. The polymer deposited was dried at 40° C. under reduced pressure. Thus, 14.6 g of Resin (p-1) according to the present invention was obtained. The weight average molecular weight (Mw) of Resin (p-1) was $19.5 \times 10^3$ (reduced to a polystyrene basis) and the dispersion degree (Mw/Mn) thereof was 2.5, determined by GPC.

Synthesis Example 13

(Synthesis of Resin constituted of Units (a15) and Acrylonitrile Units)

The monomer prepared in Synthesis Example 6 (corresponding to the constitutional repeating unit (a15)) in an amount of 8.36 g (0.025 mole) was admixed with 1.32 g (0.025 mole) of acrylonitrile, and dissolved in 30 ml of 1-methoxy-2-propanol. To this solution was added 50 mg of a polymerization initiator, 2,2'-azobis(2,4-dimethylvaleronitrile) (V-65, commercial name, a product of Wako Pure Chemical Industries, Ltd.) at 70° C. with stirring in a stream of nitrogen. Further, two 50 mg portions of the same initiator were added thereto after a 2-hour lapse and a 4-hour lapse from the beginning of reaction. The reaction was continued for additional 3 hours. Then, the resulting solution was heated up to 90° C., and stirred for 1 hour. After it was cooled, the reaction solution was poured into 0.5 liter of a 1:1 mixture of ion exchanged water and methanol with vigorous stirring to deposit a polymer. The polymer deposited was dried at 40° C. under reduced pressure. Thus, 8.7 g of Resin (p-2) according to the present invention was obtained. The weight average molecular weight (Mw) of Resin (p-2) was $22.4 \times 10^3$ (reduced to a polystyrene basis) and the dispersion degree (Mw/Mn) thereof was 2.7, determined by GPC.

Synthesis Example 14

(Synthesis of Resin constituted of Units (a17))

The monomer corresponding to the constitutional repeating unit (a17) in an amount of 32.2 g (0.100 mole) was dissolved in 80 ml of 1-methoxy-2-propylacetate. In this solution, the reaction and the post-treatment were conducted in the same manner as in Synthesis Example 12. Thus, 22.6 g of Resin (p-3) according to the present invention was obtained. The weight average molecular weight (Mw) of Resin (p-3) was $26.4 \times 10^3$ (reduced to a polystyrene basis) and the dispersion degree (Mw/Mn) thereof was 2.5, determined by GPC.

Synthesis Example 15

(Synthesis of Resin constituted of Units (a9), Units (b7) and Units (c2))

To a mixture of 13.9 g (0.050 mole) of the monomer corresponding to the constitutional repeating unit (a9) with 5.40 g (0.035 mole) of the monomer corresponding to the constitutional repeating unit (b7) was added 1.29 g (0.015 mole) of methacrylic acid. This admixture was dissolved in 60 ml of 1-methoxy-2-propanol. In this solution, the reaction and the post-treatment were conducted in the same manner as in Synthesis Example 12. Thus, 17.8 g of Resin (p-4) according to the present invention was obtained. The weight average molecular weight (Mw) of Resin (p-4) was $21.3 \times 10^3$ (reduced to a polystyrene basis) and the dispersion degree (Mw/Mn) thereof was 2.9, determined by GPC.

Synthesis Example 16

(Synthesis of Resin constituted of Units (a2) and Units (a17))

Twenty-five grams (0.100 mole) of the monomer corresponding to the constitutional repeating unit (a2) was dissolved in 60 ml of 1-methoxy-2-propanol. In this solution, the reaction and the post-treatment were conducted in the same manner as in Synthesis Example 12. Thus, 21.8 g of a resin constituted of the repeating units (a2) was obtained. To 12.5 g of this resin, 3.24 g (0.045 mole) of ethyl vinyl ether was added, and dissolved in 200 ml of THF. To this solution, 0.05 g of 2-ethylhexyl phosphate was added as a catalyst, and stirred for 8 hours as the temperature was kept at 50° C. by heating. After the catalyst was neutralized with triethylamine, the reaction mixture was poured into 1 liter of an ion exchanged water/methanol (1/1) mixture with vigorous stirring to deposit a polymer. The polymer deposited was dried at 40° C. under reduced pressure to yield 14.4 of Resin (p-5) according to the present invention. By the NMR measurement, it was confirmed that the proportion of the ethylvinyl ether adduct (corresponding to the repeating Units (a17)) in Resin (p-5) was 82% by mole. With respect to the molecular weight determined by GPC, the weight average molecular weight (Mw) of Resin (p-5) was 27.4× $10^3$ (reduced to a polystyrene basis) and the dispersion degree (Mw/Mn) thereof was 2.6.

Synthesis Examples 17 to 33

(Syntheses of Resins having Constitutional Repeating Units as illustrated hereinbefore)

Resins (p-6) to (p-22) each were synthesized in the same manner as in Synthesis Example 12, 13, 14 or 15, except that two or three different monomers corresponding to the constitutional repeating units shown in Table 1 were used in combination as starting materials. In Table 1, the constitutional repeating units used in combination, the ratio between the amounts (by mole) of monomers charged as starting materials and the weight average molecular weight of the resin produced are also set forth for each Synthesis Example.

TABLE 1

Syntheses of Resins

| Synthesis Example | Resin | Constitutional Repeating Units used (ratio by mole %) | Mw (Mw/Mn) |
|---|---|---|---|
| 17 | (p-6) | (a3)/(a19)/acrylonitrile (10/60/30) | 24.6 × $10^3$ (2.6) |
| 18 | (p-7) | (a5)/(a24) (25/75) | 28.4 × $10^3$ (2.5) |
| 19 | (p-8) | (a9)(b10)/(c14) (60/25/15) | 19.8 × $10^3$ (2.6) |
| 20 | (p-9) | (a11)/(b2)/(c2) (60/25/15) | 24.2 × $10^3$ (2.6) |
| 21 | (p-10) | (a14)/(b18)/acrylonitrile (55/15/30) | 25.7 × $10^3$ (2.7) |
| 22 | (p-11) | (a16)/(c14) (75/25) | 27.5 × $10^3$ (2.5) |
| 23 | (p-12) | (a17)/acrylonitrile (70/30) | 26.3 × $10^3$ (2.7) |
| 24 | (p-13) | (a18)/(c12)/acrylonitrile (60/7/33) | 29.6 × $10^3$ (2.9) |
| 25 | (p-14) | (a28)/(a42) (25/75) | 31.9 × $10^3$ (2.6) |
| 26 | (p-15) | (a30)/(a46)/acrylonitrile (20/50/30) | 25.4 × $10^3$ (2.7) |
| 27 | (p-16) | (a32)/(a49) (30/70) | 32.5 × $10^3$ (2.6) |
| 28 | (p-17) | (a35)/(b6)/(c3) (63/30/7) | 27.8 × $10^3$ (2.7) |
| 29 | (p-18) | (a37)/(b14)/(c2) (60/25/15) | 23.7 × $10^3$ (2.6) |
| 30 | (p-19) | (a39)/(b10)/(c3) (63/30/7) | 27.1 × $10^3$ (2.6) |
| 31 | (p-20) | (a43)/(c3)/acrylonitrile (60/7/33) | 26.5 × $10^3$ (2.7) |
| 32 | (p-21) | (a55)/(b28)/(c18) (60/25/15) | 29.8 × $10^3$ (2.8) |
| 33 | (p-22) | (a57)/(b30)/acrylonatrile (50/25/25) | 24.9 × $10^3$ (2.7) |

In the above table, Mw stands for weight average molecular weight, and Mw/Mn stands for dispersion degree.

Example 1

Measurement of Solubility in Solvent

Each of Resins (p-1) to (p-22) obtained in the foregoing Synthesis Examples or the comparative polymer (A) described below was added in an amount of 1.0 g to each 4.0 g of two different solvents, propylene glycol monomethyletheracetate and an ethyl lactate/ethyl ethoxypropionate (6/4 by weight) mixture, and thoroughly stirred. Each of the admixtures obtained was allowed to stand for 3 days at 5° C., and then it was examined with a turbidimeter as to whether any deposit was present therein. By this measurement, the solubility of the resins and the comparative polymer (A) in the two solvents were checked. As a result, no deposits were detected in all the solutions of the inventive resins, and thereby it was confirmed that all the inventive resins had sufficient solubilities in both solvents. In the case of the comparative polymer (A), the deposit of the resin was detected after standing at 5° C.

Comparative polymer (A): Copolymer of 1-adamanthylmethacrylate, t-butyl methacrylate and methacrylic acid (60/20/20 by mole, weight average molecular weight 31.5×$10^3$, dispersion degree 2.9).

Example 2

Measurement of Optical Density

Each 1.0 g of the inventive resins obtained in the foregoing Synthesis Examples and 0.03 g of triphenylsulfonium triflate were dissolved in 4.5 g of propylene glycol monomethyletheracetate, and filtered through a 0.2 $\mu$m Teflon filter. The resulting solution was coated uniformly on a quartz glass substrate by means of a spin coater, and dried by heating on a 100° C. hot plate for 90 seconds to form a 1 $\mu$m-thick resist film. The optical absorption of each of the thus formed films was measured with an ultraviolet spectrophotometer. The optical density measured at 193 nm are shown in Table 2.

TABLE 2

| Resin | Optical Density at 193 nm (per $\mu$m) |
|---|---|
| (p-1) | 0.33 |
| (p-2) | 0.34 |
| (p-4) | 0.35 |
| (p-8) | 0.33 |
| (p-9) | 0.34 |
| (p-10) | 0.36 |
| (p-13) | 0.34 |
| (p-15) | 0.34 |
| (p-16) | 0.37 |
| (p-18) | 0.36 |
| (p-20) | 0.35 |
| (p-22) | 0.37 |
| Poly(hydroxystyrene) (Comparative Example) | 1.5 or above |

As can be seen from the above data, the inventive resins all had lower optical density than poly(hydroxystyrene) as a comparative resin, and they had sufficient transmittance at 193 nm.

Example 3

Measurement of Dry Etching Resistance

Each 1.0 g of the inventive resins obtained in the foregoing Synthesis Examples or 1.0 g of the foregoing comparative polymer (A) was dissolved in 4.5 g of propylene glycol monomethyletheracetate, and filtered through a 0.2 $\mu$m Teflon filter. The resulting solution was coated uniformly on a silicon substrate by means of a spin coater, and dried by heating on a 100° C. hot plate for 90 seconds to form a 0.7 $\mu$m-thick resist film. The etching rate of the thus formed films with a $CF_4/O_2$ (8/2) gas was measured by means of an active ion etching apparatus, CSE-1110, made by ULVAC JAPAN, LTD. The measurement results are shown in Table 2. The etching conditions adopted therein were as follows: Power=500 W, Pressure=4.6 Pa, Gas flow rate=10 sccm.

TABLE 3

| Resin | Etching Rate (Å/min) |
|---|---|
| (p-3) | 640 |
| (p-5) | 630 |
| (p-6) | 670 |
| (p-7) | 620 |
| (p-8) | 690 |
| (p-9) | 700 |
| (p-11) | 670 |
| (p-12) | 680 |
| (p-14) | 630 |
| (p-16) | 640 |
| (p-17) | 700 |
| (p-19) | 710 |
| (p-20) | 690 |
| Comparative Polymer (A) | 780 |
| Poly(methylmethacrylate) (Comparative Example) | 1250 |

It can be seen from the above results that the etching rates of the inventive resins are lower than those of poly(methylmethacrylate) as a comparative example and the comparative polymer (A), so they have sufficient dry etching resistance.

Example 4

Image Evaluation (1)

One gram of each of the inventive resins obtained in the foregoing Synthesis Examples and 0.03 g of triphenylsulfonium triflate were dissolved in 4.5 g of propylene glycol monomethyletheracetate, and filtered through a 0.2 μm Teflon filter. The resulting solution was coated uniformly on a hexamethyldisilazane-treated silicon substrate by means of a spin coater, and dried by heating on a 100° C. hot plate for 90 seconds to form a 0.4 μm-thick resist film. Each of the thus formed films was subjected to pattern exposure using a KrF excimer laser stepper (NA=0.42; 248 nm). Immediately after the exposure, each film was heated on a 110° C. hot plate for 60 seconds, and then developed for 60 seconds at 23° C. by being dipped in a 2.38% aqueous solution of tetramethylammonium hydroxide. Further, the developed films were each rinsed for 30 seconds with purified water, and dried. As a result of this processing, only the exposed area of each resist film was dissolved and removed, exhibiting the sensitivity and the resolution shown in Table 4, thereby providing a positive pattern of good quality.

Herein, the pattern shape was observed under a scanning electron microscope, and thereby the rectangular resist profile was evaluated as a good shape.

The sensitivity was defined as the exposure amount required for the reproduction of a 0.35 μm mask pattern.

The resolution was represented by the threshold resolution under the exposure amount required for the reproduction of a 0.35 μm mask pattern.

TABLE 4

| Resin Used | Sensitivity (mJ/cm$^2$) | Resolution (μm) | Pattern Shape |
|---|---|---|---|
| (p-2) | 28 | 0.30 | good |
| (p-5) | 26 | 0.28 | good |

TABLE 4-continued

| Resin Used | Sensitivity (mJ/cm$^2$) | Resolution (μm) | Pattern Shape |
|---|---|---|---|
| (p-7) | 32 | 0.28 | good |
| (p-10) | 25 | 0.30 | good |
| (p-11) | 33 | 0.30 | good |
| (p-12) | 28 | 0.28 | good |
| (p-14) | 32 | 0.28 | good |
| (p-16) | 27 | 0.28 | good |
| (p-18) | 31 | 0.28 | good |
| (p-21) | 34 | 0.30 | good |

As can be seen from the results shown in Table 4, the resist films using the inventive resins had high sensitivity, high resolution and good pattern shapes.

Example 5

Image Evaluation (2)

A mask having on a quartz plate patterns drawn with chromium was brought into contact with each of the 0.4 μm-thick resist films prepared in Example 4, and irradiated with an ArF excimer laser beam (193 nm). Immediately after irradiation, each film was heated on a 110° C. hot plate for 60 seconds, and then developed for 60 seconds at 23° C. by being dipped in a 2.38% aqueous solution of tetramethylammonium hydroxide. Further, the developed films were rinsed for 30 seconds with purified water, and dried. As a result of this processing, only the exposed area of each resist film was dissolved and removed, exhibiting the sensitivity and the resolution shown in Table 5, to thereby form positive patterns of good quality. Herein, the sensitivity, the resolution and the pattern shape were evaluated in the same manner as mentioned above.

TABLE 5

| Resin Used | Sensitivity (mJ/cm$^2$) | Resolution (μm) | Pattern Shape |
|---|---|---|---|
| (p-2) | 32 | 0.25 | good |
| (p-5) | 31 | 0.25 | good |
| (p-7) | 36 | 0.25 | good |
| (p-10) | 29 | 0.25 | good |
| (p-11) | 37 | 0.25 | good |
| (p-12) | 33 | 0.25 | good |
| (p-14) | 37 | 0.25 | good |
| (p-16) | 32 | 0.25 | good |
| (p-18) | 35 | 0.25 | good |
| (p-21) | 39 | 0.25 | good |

As can be seen from the results shown in Table 5, the resist films using the inventive resins showed satisfactory sensitivity to the ArF excimer laser beam as well, and formed positive patterns having high resolution.

The examination results described above demonstrate that the inventive resins had high solubility in conventionally used resist solvents, and the resist films using the inventive resins had high transmittance in the far ultraviolet wavelength region of 250 nm or shorter, particularly 220 nm or shorter, and exhibited satisfactory dry etching resistance. Moreover, when far ultraviolet rays having wavelengths of 250 nm or shorter, particularly 220 nm or shorter (especially, an ArF excimer laser beam), are used as an exposure light source, the inventive resins can ensure high sensitivity, high resolution and good pattern profile, and can be effectively used for formation of fine patterns necessary for production of semiconductor devices.

Next, the syntheses of resins according to another embodiment of the present invention and the resist films using those resins are illustrated below.

Synthesis Example 34

(Synthesis of Monomer corresponding to Constitutional Repeating Unit (a'1))

In 200 ml of tetrahydrofuran (THF), 15.4 g (0.10 mole) of methacrylic anhydride and 28.5 g (0.10 mole) of Compound (1) illustrated below were dissolved. To this solution, 50 ml of a DMF solution containing 12.3 g (0.10 mole) of N,N-dimethylaminopyridine was added with stirring at room temperature. Further, the mixture was heated with stirring under reflux for 5 hours. After cooling, the reaction solution was poured into 3 liter of ion exchanged water with vigorous stirring, and extracted with 300 ml of ethyl acetate. The ethyl acetate solution was washed with water, dried over magnesium sulfate, and then concentrated under reduced pressure. The concentrate obtained was purified by column chromatography (packing: silica gel; eluate: hexane/ethyl acetate= 4/1) to yield 21.7 g of a colorless liquid. By the NMR measurement, this liquid was identified as the monomer corresponding to the constitutional repeating Unit (a'1).

Compound (1)

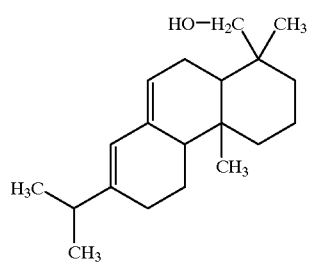

Synthesis Example 35

(Synthesis of Monomer corresponding to Constitutional Repeating Unit (a'4))

27.2 g of a colorless liquid was obtained in the same manner as in Synthesis Example 34, except that 38.8 g (0.10 mole) of Compound (2) illustrated below (3β-cholestanol) was used in place of Compound (1) used in Synthesis Example 34. By the NMR measurement, this liquid was identified as the monomer corresponding to the constitutional repeating Unit (a'4).

Compound (2)

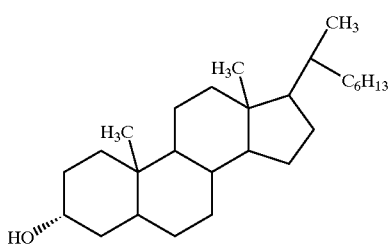

Synthesis Example 36

(Synthesis of Monomer corresponding to Constitutional Repeating Unit (a'7))

25.4 g of a white powder was obtained in the same manner as in Synthesis Example 34, except that 37.7 g (0.10 mole) of Compound (3) illustrated below (deoxycholic acid) was used in place of Compound (1) used in Synthesis Example 34. By the NMR measurement, this powder was identified as the monomer corresponding to the constitutional repeating Unit (a'7).

Compound (3)

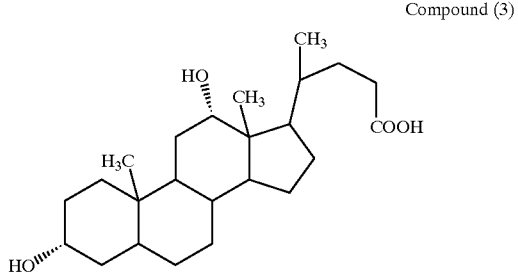

Synthesis Example 37

(Synthesis of Monomer corresponding to Constitutional Repeating Unit (a'10))

20.5 g of a white powder was obtained in the same manner as in Synthesis Example 34, except that 30.0 g (0.10 mole) of Compound (4) illustrated below (17α-ethynyltestosteron) was used in place of Compound (1) used in Synthesis Example 34. By the NMR measurement, this powder was identified as the monomer corresponding to the constitutional repeating Unit (a'10).

Compound (4)

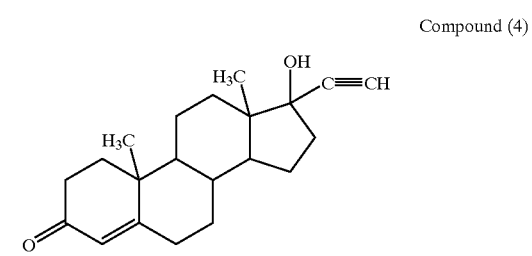

Synthesis Example 38

(Synthesis of Monomer corresponding to Constitutional Repeating Unit (a'8))

In 200 ml of dioxane, 18.8 g (0.050 mole) of Compound (5) illustrated below (lithocholic acid) and 7.8 g (0.050 mole) of 2-isocyanatoethyl methacrylate were dissolved, and thereto 0.1 g of dibutyltin dilaurate was added as a catalyst. Thereafter, this solution was stirred for 5 hours as the temperature thereof was kept at 90° C. by heating. After cooling, the reaction solution was poured into 3 liter of ion exchanged water with vigorous stirring to deposit a viscous solid. The viscous solid deposited was isolated by decantation, washed with water, and then purified by column chromatography (packing: silica gel, eluate: ethyl acetate). Thus, 19.7 g of a white powder was obtained. By the NMR measurement, this powder was identified as the monomer corresponding to the constitutional repeating Unit (a'8).

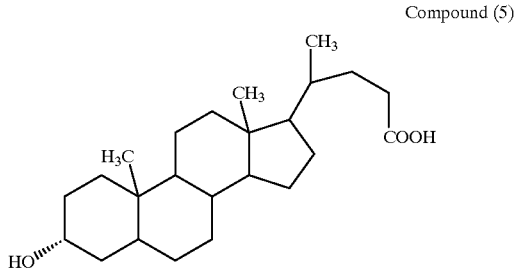

Compound (5)

Synthesis Example 39

(Synthesis of Monomer corresponding to Constitutional Repeating Unit (a'22))

In 200 ml of THF was added 9.8 g (0.01 mole) of maleic anhydride, and thereto 23.8 g of pyridine was added, and then 28.5 g (0.10 mole) of Compound (1) illustrated above was further added. The resulting mixture was heated under reflux for 5 hours. After cooling, the reaction solution was poured into 3 liter of ion exchanged water with vigorous stirring to deposit a viscous solid. The viscous solid deposited was isolated by decantation, washed with water, and then purified by column chromatography (packing: silica gel, eluate: hexane/ethyl acetate=1/1). Thus, 23.8 g of a white powder was obtained. By the NMR measurement, this powder was identified as the monomer corresponding to the constitutional repeating Unit (a'22).

Synthesis Example 40

(Synthesis of Resin constituted of Units (a'7), Units (b7) and acrylonitrile units)

In 60 ml of 1-methoxy-2-propanol were dissolved 20.0 g (0.045 mole) of the monomer corresponding to the constitutional repeating unit (a'7) and 4.31 g (0.025 mole) of the monomer corresponding to the constitutional repeating unit (b7), which were prepared in the foregoing Synthesis Examples, and further 1.59 g (0.030 mole) of acrylonitrile. To this solution was added 100 mg of a polymerization initiator, 2,2'-azobis(2,4-dimethylvaleronitrile) (V-65, commercial name, a product of Wako Pure Chemical Industries, Ltd.) at 70° C. with stirring under a stream of nitrogen. Further, two 100 mg portions of the same initiator were added thereto after a 2-hour lapse and a 4-hour lapse respectively from the beginning of reaction. The reaction was continued for additional 3 hours. Then, the resulting solution was heated up to 90° C., and stirred for 1 hour. After it was cooled, the reaction solution was poured into 1 liter of ion exchanged water with vigorous stirring to deposit a polymer. The polymer deposited was dried at 40° C. under reduced pressure. Thus, 21.9 g of Resin (p'-1) according to the present invention was obtained. The weight average molecular weight (Mw) of Resin (p'-1) was $28.7 \times 10^3$ (reduced to a polystyrene basis) and the dispersion degree (Mw/Mn) thereof was 2.6, determined by GPC.

Synthesis Example 41

(Synthesis of Resin constituted of Units (a'1), Units (b15) and Units (c2))

In 60 ml of 1-methoxy-2-propanol were dissolved 17.7 g (0.050 mole) of the monomer corresponding to the constitutional repeating unit (a'1) and 5.96 g (0.035 mole) of the monomer corresponding to the constitutional repeating unit (b15), which were prepared in the foregoing Synthesis Examples, and further 1.29 g (0.015 mole) of methacrylic acid. In this solution, the reaction and the post-treatment were conducted in the same manner as in Synthesis Example 40. Thus, 22.6 g of Resin (p'-2) according to the present invention was obtained. The weight average molecular weight (Mw) of Resin (p'-2) was $32.5 \times 10^3$ (reduced to a polystyrene basis) and the dispersion degree (Mw/Mn) thereof was 2.8, determined by GPC.

Synthesis Examples 42 to 59

(Syntheses of Resins (p'-3) to (p'-20))

Resins (p'-3) to (p'-20) each were synthesized in the same manner as in Synthesis Example 40 or 41, except that two or three different monomers corresponding to the constitutional repeating units shown in Table 6 were used in combination as starting materials. In Table 6, the constitutional repeating units used in combination, the ratio between the amounts (by mole) of monomers used as starting materials and the weight average molecular weight of the resin produced are also set forth for each Synthesis Example.

TABLE 6

Syntheses of Resins

| Synthesis Example | Resin | Constitutional Repeating Units used (ratio by mole %) | Mw (Mw/Mn) |
|---|---|---|---|
| 42 | (p'-3) | (a'1)/(b6)/(c2) (50/30/20) | $33.5 \times 10^3$ (2.7) |
| 43 | (p'-4) | (a'4)/(b15)/acrylonitrile (50/25/25) | $32.7 \times 10^3$ (2.8) |
| 44 | (p'-5) | (a'7)/(b2)/acrylonitrile (50/25/25) | $35.9 \times 10^3$ (2.9) |
| 45 | (p'-6) | (a'8)/(b10) (50/50) | $29.6 \times 10^3$ (2.7) |
| 46 | (p'-7) | (a'10)/(b12)/(c8) (55/30/15) | $38.8 \times 10^3$ (3.0) |
| 47 | (p'-8) | (a'12)/(b15)/(c14) (55/30/15) | $31.9 \times 10^3$ (2.7) |
| 48 | (p'-9) | (a'13)/(b18)/acrylonitrile (50/20/30) | $36.2 \times 10^3$ (2.8) |
| 49 | (p'-10) | (a'13)/(b19)/(c18) (50/30/20) | $38.6 \times 10^3$ (2.9) |
| 50 | (p'-11) | (a'14)/(b7)/acrylonitrile (50/20/30) | $34.9 \times 10^3$ (2.9) |
| 51 | (p'-12) | (a'16)/(b13)/(c14) (55/30/15) | $39.4 \times 10^3$ (3.0) |
| 52 | (p'-13) | (a'19)/(b20)/(c2) (55/30/15) | $28.5 \times 10^3$ (2.6) |
| 53 | (p'-14) | (a'20)/(b1)/acrylonitrile (45/30/25) | $26.5 \times 10^3$ (2.7) |
| 54 | (p'-15) | (a'22)/(b10)/(c2) (50/30/20) | $32.7 \times 10^3$ (2.8) |
| 55 | (p'-16) | (a'25)/(c8)/acrylonitrile (50/10/40) | $27.6 \times 10^3$ (2.6) |
| 56 | (p'-17) | (a'25)/(b6)/acrylonitrile (50/15/35) | $30.4 \times 10^3$ (2.7) |
| 57 | (p'-18) | (a'27)/(b2) (50/50) | $26.8 \times 10^3$ (2.6) |
| 58 | (p'-19) | (a'29)/(b12)/(c14) (50/40/10) | $29.4 \times 10^3$ (2.7) |
| 59 | (p'-20) | (a'31)/(b18)/(c18) (50/35/15) | $21.7 \times 10^3$ (2.5) |

In the above table, Mw stands for weight average molecular weight, and Mw/Mn stands for dispersion degree.

Example 6

Measurement of Optical Density

The resist films each were formed and examined for their optical densities in the same manner as in Example 2. The results obtained are shown in Table 7.

TABLE 7

| Resin | Optical Density at 193 nm (per μm) |
|---|---|
| (p'-1) | 0.36 |
| (p'-4) | 0.35 |
| (p'-5) | 0.37 |
| (p'-6) | 0.38 |
| (p'-8) | 0.35 |
| (p'-10) | 0.39 |
| (p'-12) | 0.37 |
| (p'-14) | 0.36 |
| (p'-15) | 0.41 |
| (p'-16) | 0.38 |
| (p'-18) | 0.43 |
| (p'-20) | 0.40 |
| Poly(hydroxystyrene) (Comparative Example) | 1.5 or above |

As can be seen from the above data, the inventive resins all had lower optical densities than poly(hydroxystyrene) as a comparative resin, and they had sufficient transmittance at 193 nm.

Example 7

The resist films using the inventive resins each were examined for dry etching resistance in the same manner as in Example 3.

TABLE 8

| Resin | Etching Rate (Å/min) |
|---|---|
| (p'-1) | 850 |
| (p'-3) | 800 |
| (p'-4) | 810 |
| (p'-5) | 770 |
| (p'-7) | 720 |
| (p'-8) | 690 |
| (p'-10) | 780 |
| (p'-12) | 670 |
| (p'-13) | 700 |
| (p'-16) | 740 |
| (p'-18) | 750 |
| (p'-19) | 710 |
| (p'-20) | 730 |
| Polymer (1)*⁾ (Comparative Example) | 940 |
| Poly(methylmethacrylate) (Comparative Example) | 1250 |

*) Polymer (1): Copolymer of tricyclodecanyl methacrylate, tetrahydromethacrylate and methacrylic acid (50:30;:20 by mole) having a weight average molecular weight of $32.5 \times 10^3$ and a dispersion degree of 2.7.

It can be seen from the results shown in Table 8 that the etching rates of the inventive resins are significantly lower than those of poly(methylmethacrylate) and Polymer (1) as comparative examples, so they have sufficient dry etching resistance.

Example 8

Image Evaluation

The images formed in the resist films using the inventive resins were evaluated in the same manner as in Example 4. The results obtained are shown in Table 9.

TABLE 9

| Resin used | Sensitivity (mJ/cm$^2$) | Resolution (μm) | Pattern Shape |
|---|---|---|---|
| (p'-1) | 32 | 0.28 | good |
| (p'-3) | 30 | 0.30 | good |
| (p'-7) | 28 | 0.28 | good |
| (p'-8) | 24 | 0.28 | good |
| (p'-9) | 26 | 0.28 | good |
| (p'-11) | 23 | 0.28 | good |
| (p'-14) | 33 | 0.30 | good |
| (p'-15) | 31 | 0.30 | good |
| (p'-17) | 27 | 0.28 | good |
| (p'-19) | 30 | 0.30 | good |

As can be seen from the results shown in Table 9, the resist films using the inventive resins had high sensitivity, high resolution and good pattern shapes.

Example 9

Image Evaluation

The image evaluation was effected in the same manner as in Example 5 using the same 0.4 μm-thick resist films as prepared in Example 8. The results obtained are shown in Table 10.

TABLE 10

| Resin used | Sensitivity (mJ/cm$^2$) | Resolution (μm) | Pattern Shape |
|---|---|---|---|
| (p'-1) | 37 | 0.25 | good |
| (p'-3) | 34 | 0.25 | good |
| (p'-7) | 31 | 0.25 | good |
| (p'-8) | 28 | 0.25 | good |
| (p'-9) | 30 | 0.25 | good |
| (p'-11) | 27 | 0.25 | good |
| (p'-14) | 36 | 0.25 | good |
| (p'-15) | 34 | 0.25 | good |
| (p'-17) | 30 | 0.25 | good |
| (p'-19) | 33 | 0.25 | good |

As can be seen from the results shown in Table 10, the resist films using the inventive resins showed satisfactory sensitivity to the ArF excimer laser beam and formed positive patterns having high resolution and good quality.

The examination results described above demonstrate that the positive working photosensitive compositions comprising the resins of the present invention had high transmittance in the far ultraviolet wavelength region of 250 nm or shorter, particularly 220 nm or shorter, and satisfactory dry etching resistance. Moreover, when far ultraviolet rays having wavelengths of 250 nm or shorter, particularly 220 nm or shorter (specifically an ArF excimer laser beam), are used as an exposure light source, the inventive photosensitive compositions can ensure high sensitivity, high resolution and can provide good pattern profile in the resist films formed therefrom. Accordingly, the photosensitive compositions of the present invention can be effectively used for formation of fine patterns necessary for production of semiconductor devices.

What is claimed is:

1. A positive working photosensitive composition comprising:

(A) a compound capable of generating an acid upon irradiation with an actinic ray or radiation, and (B) a resin which has at least one of monovalent polycyclic alicyclic groups represented by the following formula (Ib), (IIb) or (IIIb), and a group capable of decomposing due to the action of acid to increase the solubility of the resin in an alkali developer:

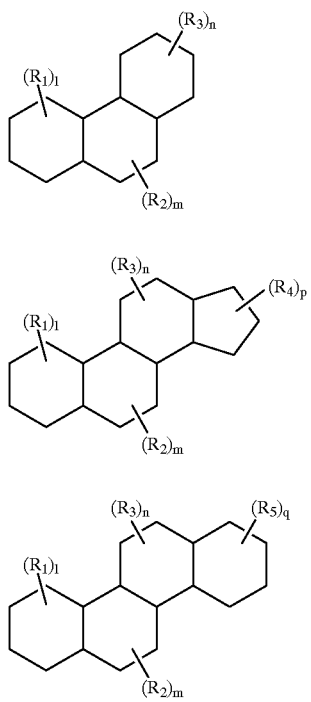

wherein $R_1$ to $R_5$, which may be the same or different, each represents an alkyl group which may have substituent(s), a cycloalkyl group which may have substituent(s), an alkenyl group which may have substituent(s), an alkynyl group which may have substituent(s), a halogen atom, a cyano group, a group of formula —$R_6$—O—$R_7$, a group of formula —$R_8$—CO—O—$R_9$, a group of formula —$R_{10}$—CO—N$R_{11}R_{12}$, or a group of formula —$R_{13}$—O—CO—$R_{14}$; $R_7$ and $R_9$, which may be the same or different, each represents a hydrogen atom, an alkyl group which may have substituent(s), a cycloalkyl group which may have substituent(s), an alkenyl group which may have substituent(s), or a group which can decompose due to the action of an acid to increase the solubility of the resin in an alkali developer; $R_{11}$, $R_{12}$ and $R_{14}$, which may be the same or different, each represents a hydrogen atom, an alkyl group which may have substituent(s), a cycloalkyl group which may have substituent(s), an alkenyl group which may have substituent(s), or $R_{11}$ and $R_{12}$ may combine with each other to from a ring; $R_6$, $R_8$, $R_{10}$ and $R_{13}$, which may be the same or different, each represents a single bond, or an alkylene, alkenylene or cycloalkylene group which may have substituent(s); l, m, n, p and q, which may be the same or different, each represents 0 or an integer of 1 to 5; wherein when l, m, n, p or q is 2 or more, the plural groups represented by each of $R_1$, $R_2$, $R_3$, $R_4$ and $R_5$ may be the same or different, and the combination of two of the groups may represent a carbonyl (=O) or thiocarbonyl (=S) group on one carbon atom, or may complete a double bond between adjacent ring carbon atoms or a ring; and wherein the bonding hand may be situated at any site of each polycyclic hydrocarbon structure.

2. The positive working photosensitive composition of claim 1, wherein the resin as Component (B) contains at least one of constitutional repeating units represented by the following formula (IVb), (Vb) or (VIb), and has groups capable of decomposing due to the action of an acid to increase the solubility of the resin in an alkali developer:

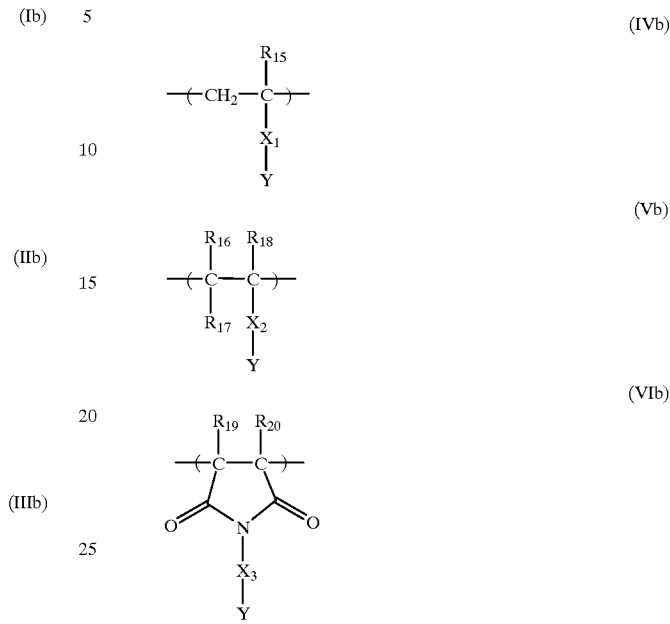

wherein $R_{15}$, $R_{16}$, $R_{18}$, $R_{19}$ and $R_{20}$, which may be the same or different, each represents a hydrogen atom, a halogen atom, a cyano group, an alkyl group or a haloalkyl group; $R_{17}$ represents a cyano group, —CO—O$R_{27}$ or —CO—N($R_{28}$)($R_{29}$); $X_1$, $X_2$ and $X_3$, which may be the same or different, each represents a single bond, a divalent alkylene which may have substituent(s), a divalent alkenylene group which may have substituent(s), a divalent cycloalkylene group which may have substituent(s), —O—, —SO$_2$—, —O—CO—$R_{30}$—, —CO—O—$R_{31}$—, or —CO—N($R_{32}$)—$R_{33}$—; $R_{27}$ represents a hydrogen atom, an alkyl group which may have substituent(s), a cycloalkyl which may have substituent(s), an alkenyl group which may have substituent(s), or a group which can decompose due to the action of an acid to increase the solubility of the resin in an alkali developer; $R_{28}$, $R_{29}$ and $R_{32}$, which may be the same or different, each represents a hydrogen atom, or an alkyl group which may have substituent(s), a cycloalkyl group which may have substituent(s) or an alkenyl group which may have substituent(s), or $R_{28}$ and $R_{29}$ may combine with each other to form a ring; $R_{30}$, $R_{31}$ and $R_{33}$, which may be the same or different, each represents a single bond, or a divalent alkylene, alkenylene or cycloalkylene group which may form a divalent group in combination with an ether group, an ester group, an amido group, an urethane group or an ureido group; and Y represents a polycyclic alicyclic group represented by formula (Ib), (IIb) or (IIIb).

3. The positive working photosensitive composition of claim 2, wherein the resin as Component (B) is a resin comprising at least one of constitutional repeating units of formulae (IVb), (Vb) or (VIb) and at least one of constitutional repeating units represented by the following formula (IVa), (Va) or (VIa), and being capable of decomposing due to the action of an acid to increase the solubility in an alkali developer:

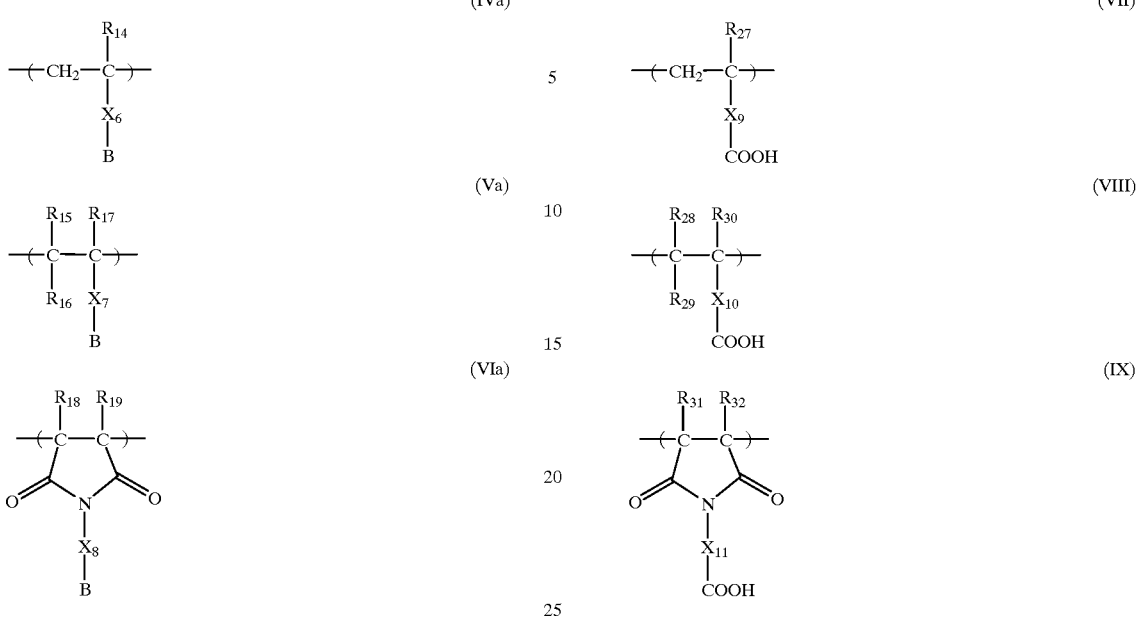

wherein $R_{14}$, $R_{15}$, $R_{17}$, $R_{18}$ and $R_{19}$, which may be the same or different, each represents a hydrogen atom, a halogen atom, a cyano group, an alkyl group or a haloalkyl group; $R_{16}$ represents a cyano group, —CO—O$R_{20}$ or —CO—N($R_{21}$)($R_{22}$); $X_6$, $X_7$ and $X_8$, which may be the same or different, each represents a single bond, —O—, —SO$_2$—, —O—CO—$R_{23}$—, —CO—O—$R_{24}$—, —CO—N($R_{25}$)—$R_{26}$—, or a divalent alkylene, alkenylene or cycloalkylene group which may have substituent(s); $R_{20}$ represents a hydrogen atom, or an alkyl, cycloalkyl or alkenyl group which may have substituent(s), or a group which can decompose due to the action of an acid to increase the solubility of the resin in an alkali developer; $R_{21}$, $R_{22}$ and $R_{25}$, which may be the same or different, each represents a hydrogen atom, or an alkyl group which may have substituent(s), a cycloalkyl group which may have substituent(s) or an alkenyl group which may have substituent(s), or $R_{21}$ and $R_{22}$ may combine with each other to form a ring; $R_{23}$, $R_{24}$ and $R_{26}$, which may be the same or different, each represents a single bond, or a divalent alkylene, alkenylene or cycloalkylene group which may contain an ether group, an ester group, an amido group, an urethane group or an ureido group; and B represents a group which can decompose due to the action of an acid to increase the solubility of the resin in an alkali developer.

4. The positive working photosensitive composition of claim 1, wherein the resin as Component (B) further has carboxyl groups.

5. The positive working photosensitive composition of claim 4, wherein the resin as Component (B) having said carboxyl groups comprises at least one of the constitutional repeating units selected from carboxyl group-containing units of the following formula (VII), (VIII) and (IX):

wherein $R_{27}$, $R_{28}$, $R_{30}$, $R_{31}$ and $R_{32}$, which may be the same or different, each represents a hydrogen atom, a halogen atom, a cyano group, an alkyl group or a haloalkyl group; $R_{29}$ represents a cyano group, —CO—O$R_{33}$ or —CO—N($R_{34}$)($R_{35}$); $X_9$, $X_{10}$ and $X_{11}$, which may be the same or different, each represents a single bond, —O—, —SO$_2$—, —O—CO—$R_{36}$—, —CO—O—$R_{37}$—, —CO—N ($R_{38}$)—$R_{39}$—, or a divalent alkylene, alkenylene or cycloalkylene group which may have substituent(s); $R_{33}$ represents a hydrogen atom, or an alkyl group which may have substituent(s), a cycloalkyl group which may have substituent(s) or an alkenyl group which may have substituent(s); $R_{34}$, $R_{35}$ and $R_{38}$, which may be the same or different, each represents a hydrogen atom, or an alkyl group which may have substituent(s), a cycloalkyl group which may have substituent(s) or an alkenyl group which may have substituent(s), or $R_{34}$ and $R_{35}$ may combine with each other to form a ring; $R_{36}$, $R_{37}$ and $R_{39}$, which may be the same or different, each represents a single bond, or a divalent alkylene, alkenylene or cycloalkylene group which may contain an ether group, an ester group, an amido group, an urethane group or an ureido group.

6. The positive working photosensitive composition of claim 1, further comprising a low molecular acid-decomposable dissolution inhibiting compound which has a molecular weight of not higher than 3,000, contains a group capable of decomposing due to the action of acids and increases the solubility in an alkali developer when an acid acts thereon.

7. The positive working photosensitive composition of claim 1, wherein the actinic rays or radiation is far ultraviolet light of wavelengths of 250 nm or shorter.

8. The positive working photosensitive composition of claim 7, wherein the far ultraviolet light has wavelengths of 220 nm or shorter.

* * * * *